(12) United States Patent
Tsai

(10) Patent No.: US 10,833,197 B2
(45) Date of Patent: Nov. 10, 2020

(54) TFT SUBSTRATE HAVING COMPENSATION CAPACITANCE UNIT FOR CHANGE IN CAPACITANCE FORMED BETWEEN GATE ELECTRODE AND DRAIN ELECTRODE

(71) Applicant: Sharp Kabushiki Kaisha, Sakai (JP)

(72) Inventor: Yi-Cheng Tsai, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/342,996

(22) PCT Filed: Oct. 13, 2017

(86) PCT No.: PCT/JP2017/037206
§ 371 (c)(1),
(2) Date: Apr. 18, 2019

(87) PCT Pub. No.: WO2018/074361
PCT Pub. Date: Apr. 26, 2018

(65) Prior Publication Data
US 2019/0245095 A1    Aug. 8, 2019

(30) Foreign Application Priority Data

Oct. 19, 2016   (JP) .................................. 2016-205328

(51) Int. Cl.
*H01L 29/786*   (2006.01)
*G02F 1/1368*   (2006.01)
(Continued)

(52) U.S. Cl.
CPC ...... *H01L 29/78603* (2013.01); *G02F 1/1368* (2013.01); *G02F 1/134309* (2013.01);
(Continued)

(58) Field of Classification Search
CPC ............. H01L 29/78603; H01L 29/786; H01L 29/78618
See application file for complete search history.

(56) References Cited

U.S. PATENT DOCUMENTS

2003/0112213 A1   6/2003   Noguchi et al.
2009/0303214 A1*  12/2009  Kaigawa ............. H01L 27/1288
                                                          345/206
(Continued)

FOREIGN PATENT DOCUMENTS

JP          6-160908 A     6/1994
JP          10-260429 A    9/1998
(Continued)

*Primary Examiner* — Matthew E. Gordon
(74) *Attorney, Agent, or Firm* — Keating & Bennett, LLP

(57) ABSTRACT

The TFT substrate has a plurality of pixels and a plurality of TFTs (10). The TFT substrate includes a first conductive layer (12) including a gate electrode (12g) of the TFT, a gate insulating layer (13), a semiconductor layer (14), a protective insulating layer (15) including a portion covering a channel region (14c) and having a first opening portion (15a) reaching the drain electrode (14s) and a second opening portion (15b) reaching the drain region (14d), and a second conductive layer (16) including a source electrode (16s) and a drain electrode (16d). Each of the plurality of pixels has a compensation capacitance unit (30), the first conductive layer further includes a first electrode unit (12a) electrically connected to the gate electrode and forming a compensation capacitance unit, and the second conductive layer further includes a second electrode unit (16a) electrically connected to the drain electrode, overlapping the first electrode unit, and forming a compensation capacitance unit. The protective insulating layer further includes a third opening portion (15c) which does not overlap the semiconductor layer and which includes a first portion (15c1) overlapping the first electrode unit and the second electrode
(Continued)

unit, and a second portion (15c2) which is adjacent to the first portion in a direction (Da) from the second opening portion to the first opening portion and which does not overlap the first electrode unit and/or the second electrode unit.

17 Claims, 30 Drawing Sheets

(51) Int. Cl.
    *G02F 1/1343* (2006.01)
    *G09F 9/30* (2006.01)
    *H01L 27/12* (2006.01)

(52) U.S. Cl.
    CPC ............ *G09F 9/30* (2013.01); *H01L 27/1225* (2013.01); *H01L 27/1251* (2013.01); *H01L 27/1255* (2013.01); *H01L 29/786* (2013.01); *H01L 29/78618* (2013.01); *H01L 29/78651* (2013.01)

(56) References Cited

U.S. PATENT DOCUMENTS

| | | |
|---|---|---|
| 2012/0138922 A1 | 6/2012 | Yamazaki et al. |
| 2013/0320334 A1 | 12/2013 | Yamazaki et al. |
| 2014/0286076 A1 | 9/2014 | Aoki et al. |

FOREIGN PATENT DOCUMENTS

| | | |
|---|---|---|
| JP | 2003-315766 A | 11/2003 |
| JP | 2012-134475 A | 7/2012 |
| JP | 2014-7399 A | 1/2014 |
| JP | 2014-209727 A | 11/2014 |

* cited by examiner

TFT SUBSTRATE HAVING COMPENSATION CAPACITANCE UNIT FOR CHANGE IN CAPACITANCE FORMED BETWEEN GATE ELECTRODE AND DRAIN ELECTRODE

TECHNICAL FIELD

The present invention relates to a TFT substrate.

BACKGROUND ART

An active matrix substrate having a switching element for each pixel is used for various applications such as display devices. An active matrix substrate having a thin film transistor (TFT) as a switching element is called a TFT substrate.

The TFT substrate has a TFT and a pixel electrode provided for each pixel, a gate bus line which supplies a scanning signal voltage (gate signal voltage) to the TFT, a source bus line which supplies a display signal voltage (source signal voltage) to the TFT, and the like. A gate electrode, a source electrode, and a drain electrode of the TFT are electrically connected to the gate bus line, the source bus line, and the pixel electrode, respectively.

Various improvements are made to display devices provided with a TFT substrate in order to improve the display quality. For example, in a liquid crystal display device, each pixel exhibits luminance according to the magnitude of the voltage applied to the liquid crystal layer. A pixel is electrically expressed as a liquid crystal capacity formed by the pixel electrode/liquid crystal layer/counter electrode, and the magnitude of the voltage applied to the pixel (liquid crystal layer) is expressed with the potential of the counter electrode as a reference point. The liquid crystal material is a dielectric material and degrades when a DC voltage is applied thereto for a long time. In order to prevent this, the polarity (direction) of the voltage (electric field) applied to the liquid crystal layer is inverted at regular time intervals (referred to as "AC driving"). Frame inversion driving (or field inversion driving) is adopted in which the polarity of the voltage (direction of electric field) applied to each pixel is inverted every vertical scanning period. Here, the term "vertical scanning period" means a period from the time a certain gate bus line (scanning line) is selected until the next gate bus line is selected.

However, in a mass-produced liquid crystal display device, it is difficult to precisely match the absolute values of the voltages before and after inverting the polarity of the voltage, and the absolute value of the voltage changes slightly each time the polarity is inverted. As a result, when displaying a still image, the luminance changes each time the polarity is inverted, and flickering occurs in the display. In view of this, a method was adopted for decreasing flickering by utilizing the effect that the pixel luminance is spatially averaged by arranging pixels to which voltages of opposite polarities are applied so as to be adjacent to each other in the display region. A typical method is a driving method for realizing a state called "dot inversion" by inverting the polarities of the voltages applied to pixels adjacent to each other. "Dot" means a pixel.

PTL 1 discloses a liquid crystal display device exhibiting a dot inversion state and a driving method thereof. FIG. 51 shows a TFT substrate 900 having a connection relationship shown in FIG. 2 of PTL 1. FIG. 51 shows the electrical connection relationship between a TFT 10 and a pixel electrode 18 of each pixel, a source bus line S, and a gate bus line G in the TFT substrate 900 provided in the liquid crystal display device exhibiting the dot inversion state. When the direction in which the source bus line S extends is the column direction, as shown in FIG. 51, the TFTs 10 of the pixels adjacent in the column direction are connected to source bus lines S different to each other (that is, the TFTs 10 of each pixel are arranged in a zigzag manner with respect to the source bus line S). It is possible to enter a dot inversion state by applying a driving method of supplying display signal voltages having opposite polarities to adjacent source bus lines S in each vertical scanning period with respect to the liquid crystal display device provided with the TFT substrate of FIG. 51.

However, display unevenness may be generated in the liquid crystal display device having the TFT substrate 900 due to the following reasons. In the TFT substrate 900, pixels adjacent in the column direction have different pixel structures to each other. For example, in the example shown in FIG. 51, a pixel in which the TFT 10 is connected to the source bus line S on the left side of the pixel and a pixel in which the TFT 10 is connected to the source bus line S on the right side of the pixel are arranged to be adjacent in the column direction. In these pixels, the parasitic capacitance changes due to a misalignment generated in the step of manufacturing the TFT substrate may be different from each other. For example, the parasitic capacitance formed between the gate electrode and the drain electrode contributes to the pull-in phenomenon immediately after the TFT enters an off state (non-conductive state). Due to the pull-in phenomenon, the voltage of the pixel electrode changes in accordance with the magnitude of the pull-in voltage. When the electrostatic capacitance value of the parasitic capacitance between the gate and the drain varies depending on the pixel, the magnitude of the pull-in voltage varies depending on the pixel. Due to this, display unevenness (for example, flickering or lateral streaks) may be generated.

PTLs 2 and 3 disclose a TFT substrate which is able to suppress changes in the parasitic capacitance between the gate and the drain due to a misalignment between a conductive layer (source layer) including a source electrode and a drain electrode of a TFT and a conductive layer (a gate layer) including a gate electrode. When a misalignment occurs between the source layer and the gate layer, the area of the region where the gate electrode and the drain electrode overlap changes, and the electrostatic capacitance value of the parasitic capacitance between the gate and the drain changes. The TFT substrates of PTLs 2 and 3 are formed to have an extended portion of the gate electrode and an extended portion of the drain electrode, such that the capacitance formed between the extended portion of the gate electrode and the extended portion of the drain electrode is able to compensate for changes in the parasitic capacitance between the gate and the drain.

CITATION LIST

Patent Literature

PTL 1: Japanese Unexamined Patent Publication No. 2003-315766

PTL 2: Japanese Unexamined Patent Publication No. 6-160908

PTL 3: Japanese Unexamined Patent Publication No. 10-260429

SUMMARY OF INVENTION

Technical Problem

The TFT substrate may have a protective insulating layer (etch stop layer) which covers the channel region of the active layer of the TFT. Having the etch stop layer makes it possible to suppress the channel region of the semiconductor layer from being damaged when patterning the source electrode and the drain electrode.

In a TFT substrate having an etch stop layer, the parasitic capacitance between the gate and the drain may change due to a misalignment between the etch stop layer and the gate electrode as described below. The TFT substrates of PTLs 2 and 3 do not have an etch stop layer. PTLs 2 and 3 do not mention changes in the parasitic capacitance between the gate and the drain due to a misalignment between the etch stop layer and the gate electrode.

The present invention was made to solve the above problems, and the main object thereof is to provide a TFT substrate in which changes in parasitic capacitance due to a misalignment between an etch stop layer (protective insulating layer) and a gate electrode are suppressed.

Solution to Problem

A TFT substrate according to an embodiment of the present invention includes a plurality of pixels arranged in a matrix having a plurality of rows and a plurality of columns, a substrate, and a plurality of TFTs supported on the substrate and each connected to one of the plurality of pixels, in which the TFT substrate includes a first conductive layer including gate electrodes of the plurality of TFTs, a gate insulating layer formed on the first conductive layer, a semiconductor layer formed on the gate insulating layer and including a channel region, a source region, and a drain region, a protective insulating layer including a portion which covers the channel region and having a first opening portion reaching the source region and a second opening portion reaching the drain region, and a second conductive layer formed on the protective insulating layer and including a source electrode which is formed on the protective insulating layer and in the first opening portion and which is in contact with the source region in the first opening portion, and a drain electrode which is formed on the protective insulating layer and in the second opening portion and which is in contact with the drain region in the second opening portion, each of the plurality of pixels has a compensation capacitance unit, the first conductive layer further includes a first electrode unit electrically connected to the gate electrode and forming the compensation capacitance unit, the second conductive layer further includes a second electrode unit electrically connected to the drain electrode, overlapping the first electrode unit, and forming the compensation capacitance unit, and the protective insulating layer further includes a third opening portion which does not overlap the semiconductor layer, which includes a first portion overlapping the first electrode unit and the second electrode unit and a second portion adjacent to the first portion in a direction from the second opening portion to the first opening portion, and which does not overlap the first electrode unit and/or the second electrode unit.

In one embodiment, the plurality of pixels include a first pixel and a second pixel for which directions from the second opening portion to the first opening portion are substantially opposite to each other.

In one embodiment, the first pixel and the second pixel are adjacent to each other in a channel width direction of the TFT.

In one embodiment, the TFT substrate further includes a plurality of gate bus lines, each of which being connected to one of the plurality of TFTs and extending in a row direction, and a plurality of source bus lines, each of which being connected to one of the plurality of TFTs and extending in a column direction, in which the plurality of pixels include two pixels which are adjacent to each other in the column direction and connected to the source bus lines different to each other.

In one embodiment, the two pixels which are adjacent to each other in the column direction are connected to source bus lines different to each other.

In one embodiment, the gate insulating layer has a first insulating layer and a second insulating layer formed on the first insulating layer, and the second insulating layer has a fourth opening portion in which a side surface is aligned with a side surface of the third opening portion.

In one embodiment, the protective insulating layer and the second insulating layer are formed of an identical material.

In one embodiment, the semiconductor layer further includes an extended portion extending from the drain region across an edge of the gate electrode on a side of the drain electrode.

In one embodiment, an edge of the drain electrode crosses the semiconductor layer between the second opening portion and an edge of the gate electrode on a side of the drain electrode.

In one embodiment, when, in each of the plurality of pixels, a region where the gate electrode and the drain electrode overlap and which does not overlap the semiconductor layer is a first region, and a region which overlaps the first electrode unit and the second electrode unit, which does not overlap the third opening portion, and which is adjacent to the first portion in a direction from the first opening portion to the second opening portion is a second region, and when the second conductive layer shifts with respect to the first conductive layer in a channel length direction of the TFT, a change in an area of the first region per unit length of a shift amount is substantially equal to a change in an area of the second region per unit length of a shift amount.

In one embodiment, the second opening portion and the third opening portion are formed continuously.

In one embodiment, the third opening portion includes a plurality of separately formed opening portions.

In one embodiment, the semiconductor layer includes an oxide semiconductor.

In one embodiment, the semiconductor layer includes an In—Ga—Zn—O-based semiconductor.

In one embodiment, the In—Ga—Zn—O-based semiconductor includes a crystalline portion.

In one embodiment, the semiconductor layer has a laminated structure.

According to another embodiment of the present invention, there is provided a TFT substrate including a plurality of pixels arranged in a matrix having a plurality of rows and a plurality of columns, a substrate, and a plurality of TFTs supported on the substrate and each connected to one of the plurality of pixels, in which the TFT substrate includes a first conductive layer including gate electrodes of the plurality of TFTs, a gate insulating layer formed on the first conductive layer, a semiconductor layer formed on the gate insulating layer and including a channel region, a source region, and a drain region, a protective insulating layer including a portion which covers the channel region and having a first opening portion reaching the source region and a second opening portion reaching the drain region, and a second conductive layer formed on the protective insulating layer and including a source electrode which is formed on the protective insulating layer and in the first opening portion and which is in contact with the source region in the first opening portion, and a drain electrode which is formed on the protective insulating layer and in the second opening portion and which is in contact with the drain region in the second opening portion, each of the plurality of pixels has a compensation capacitance unit including a part of the first conductive layer and a part of the second conductive layer, and the compensation capacitance unit is formed to compensate for at least a part of change in capacitance formed between the gate electrode and the drain electrode when the protective insulating layer shifts in a channel length direction with respect to the first conductive layer.

Advantageous Effects of Invention

According to an embodiment of the present invention, there is provided a TFT substrate in which changes in parasitic capacitance due to a misalignment between an etch stop layer and a gate electrode are suppressed.

DESCRIPTION OF EMBODIMENTS

A description will be given below of a TFT substrate according to an embodiment of the present invention with reference to the drawings. Here, the present invention is not limited to the embodiments exemplified below. In the following drawings, constituent elements having substantially the same functions are denoted by the same reference symbols, and explanation thereof may be omitted.

Embodiment 1

Figure 1:
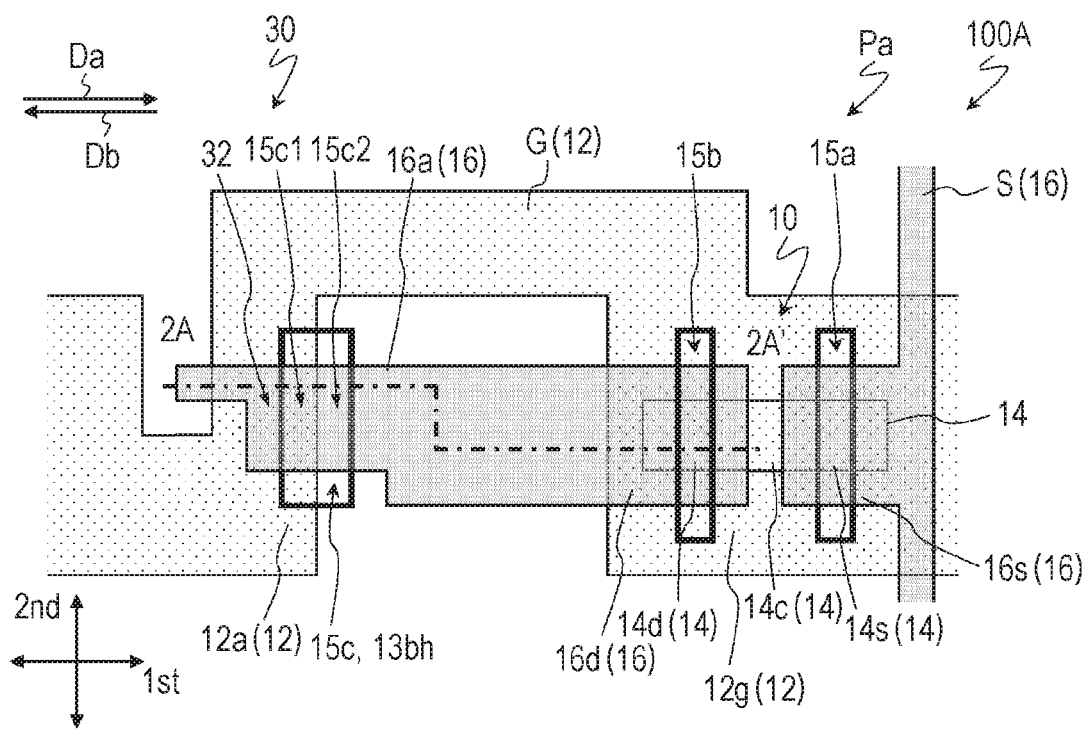
FIG. 1 is a plan view schematically showing a TFT substrate 100A according to an embodiment of the present invention.
Figure 2:
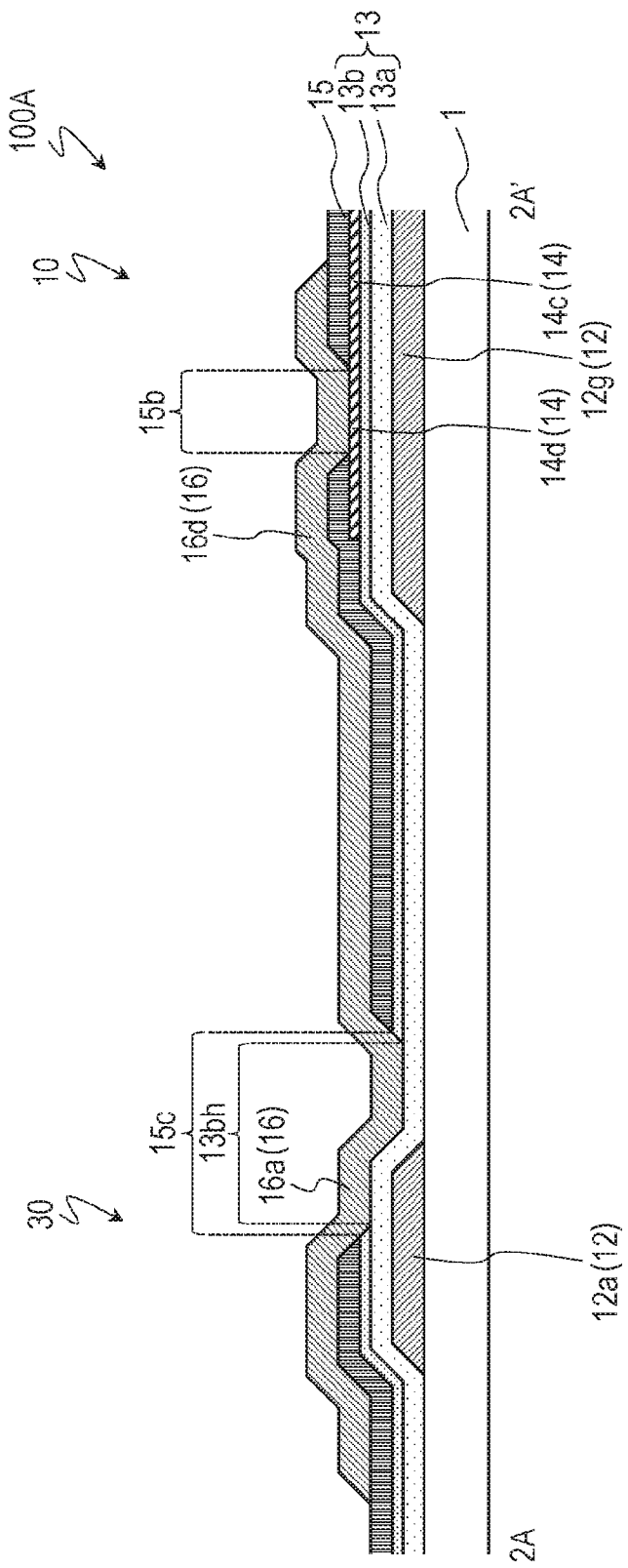
FIG. 2 is a sectional view schematically showing the TFT substrate 100A and shows a sectional structure taken along a line 2A-2A' in FIG. 1.

FIG. 1 and FIG. 2 show a TFT substrate (active matrix substrate) 100 in the present embodiment. FIG. 1 and FIG. 2 are a plan view and a sectional view schematically showing a TFT substrate 100A. FIG. 2 shows a sectional structure taken along the line 2A-2A' in FIG. 1.

The TFT substrate 100A has a plurality of pixels arranged in a matrix having a plurality of rows and a plurality of columns. FIG. 1 is a plan view schematically showing a part of a portion of the TFT substrate 100A corresponding to one pixel. The TFT substrate 100A has a substrate 1 and a plurality of the TFTs 10 supported by the substrate 1. Each of the plurality of TFTs 10 is connected to any one of a plurality of pixels of the TFT substrate 100A.

As shown in FIG. 1, each pixel has the TFT 10 and a compensation capacitance unit 30. The TFT 10 has a gate electrode 12g, a source electrode 16s, and a drain electrode 16d. The gate electrode 12g is electrically connected to a gate bus line (scanning wiring) G, and the source electrode 16s is electrically connected to a source bus line (signal wiring) S. The drain electrode 16d is electrically connected to a pixel electrode (not shown). A scan signal voltage (gate signal voltage) is supplied to the gate bus line G from a gate driver (not shown), and a display signal voltage (source signal voltage) is supplied to the source bus line S from the source driver (not shown).

As shown in FIG. 1 and FIG. 2, the TFT substrate 100A has the substrate 1, a first conductive layer 12, a gate insulating layer 13, a semiconductor layer 14, a protective insulating layer 15, and a second conductive layer 16.

The first conductive layer (gate layer) 12 is formed on the substrate 1. The first conductive layer 12 includes the gate electrode 12g of the TFT 10 and the gate bus line G. The first conductive layer 12 may have a single layer structure or a laminated structure in which a plurality of layers are laminated. The first conductive layer 12 includes at least a layer formed of a metal material. In a case where the first conductive layer 12 has a laminated structure, some of the layers may be formed of a metal nitride or a metal oxide.

The first conductive layer 12 further includes a first electrode unit 12a electrically connected to the gate electrode 12g. The first electrode unit 12a is formed integrally with the gate electrode 12g, for example. In the example shown in FIG. 1, the first electrode unit 12a is a part of the gate bus line G. The first electrode unit 12a forms the compensation capacitance unit 30.

The gate insulating layer 13 is formed on the first conductive layer 12. The gate insulating layer 13 is formed to cover the gate electrode 12g, the gate bus line G, and the first electrode unit 12a. The gate insulating layer 13 is formed of an inorganic insulating material. The gate insulating layer 13 may have a single layer structure or a laminated structure in which a plurality of layers are laminated. In the example shown in FIG. 2, the gate insulating layer 13 has a laminated structure including a first insulating layer 13a and a second insulating layer 13b formed on the first insulating layer 13a.

The semiconductor layer 14 is formed on the gate insulating layer 13. The semiconductor layer 14 includes a channel region 14c, a source region 14s, and a drain region 14d.

The protective insulating layer (etch stop layer) 15 includes a portion covering the channel region 14c of the semiconductor layer 14. The protective insulating layer 15 has a first opening portion 15a reaching the source region 14s of the semiconductor layer 14 and a second opening portion 15b reaching the drain region 14d of the semiconductor layer 14.

The second conductive layer (source layer) 16 is formed on the protective insulating layer 15. The second conductive layer 16 includes the source electrode 16s and the drain electrode 16d of the TFT 10 and a source bus line S. The source electrode 16s is formed on the protective insulating layer 15 and in the first opening portion 15a and is in contact with the source region 14s of the semiconductor layer 14 in the first opening portion 15a. The drain electrode 16d is formed on the protective insulating layer 15 and in the second opening portion 15b and is in contact with the drain region 14d of the semiconductor layer 14 in the second opening portion 15b. The second conductive layer 16 may have a single layer structure or may have a laminated structure in which a plurality of layers are laminated. The second conductive layer 16 includes a layer formed of at least a metal material. In a case where the second conductive layer 16 has a laminated structure, some of the layers may be formed of a metal nitride or a metal oxide.

In the present specification, the source region 14s refers to a portion in the semiconductor layer 14 in contact with the source electrode 16s, and the drain region 14d refers to a portion in the semiconductor layer 14 in contact with the drain electrode 16d. In relation to the protective insulating layer 15, the source region 14s refers to a portion overlapping the first opening portion 15a and the second conductive layer 16 in the semiconductor layer 14, and the drain region 14d refers to a portion overlapping the second opening portion 15b and the second conductive layer 16 in the semiconductor layer 14. The channel region 14c refers to a region positioned between the source region 14s and the drain region 14d.

The second conductive layer (source layer) 16 further includes a second electrode unit 16a electrically connected to the drain electrode 16d. The second electrode unit 16a is formed integrally with the drain electrode 16d, for example. The second electrode unit 16a overlaps the first electrode unit 12a when viewed from the normal direction of the substrate 1. The second electrode unit 16a forms the compensation capacitance unit 30.

The protective insulating layer 15 further has a third opening portion 15c which does not overlap the semiconductor layer 14. The compensation capacitance unit 30 has the third opening portion 15c. The third opening portion 15c includes a first portion 15c1 and a second portion 15c2 adjacent to the first portion 15c1 in a direction Da from the second opening portion 15b to the first opening portion 15a.

The first portion 15c1 overlaps the first electrode unit 12a and the second electrode unit 16a. The second portion 15c2 does not overlap the first electrode unit 12a.

Since the TFT substrate 100A has the compensation capacitance unit 30, it is possible to suppress changes in the parasitic capacitance formed between the gate electrode 12g and the drain electrode 16d due to a misalignment between the protective insulating layer 15 and the gate electrode 12g.

The TFT 10 is an etch stop type TFT in which the etch stop layer 15 is formed on the channel region 14c. In the TFT 10, the channel-side end portion lower surfaces of the source electrode 16s and the drain electrode 16d are positioned, for example, on the etch stop layer 15. The etch stop type TFT 10 is formed, for example, by forming the etch stop layer 15 covering the portion to be the channel region inside the semiconductor layer 14, and then forming a conductive film for source and drain electrodes on the semiconductor layer 14 and the etch stop layer 15 to perform source/drain isolation.

The semiconductor layer 14 may be, for example, an amorphous silicon layer, or a crystalline silicon layer, or an oxide semiconductor layer. The crystalline silicon layer may be, for example, a polysilicon layer.

Figure 3:
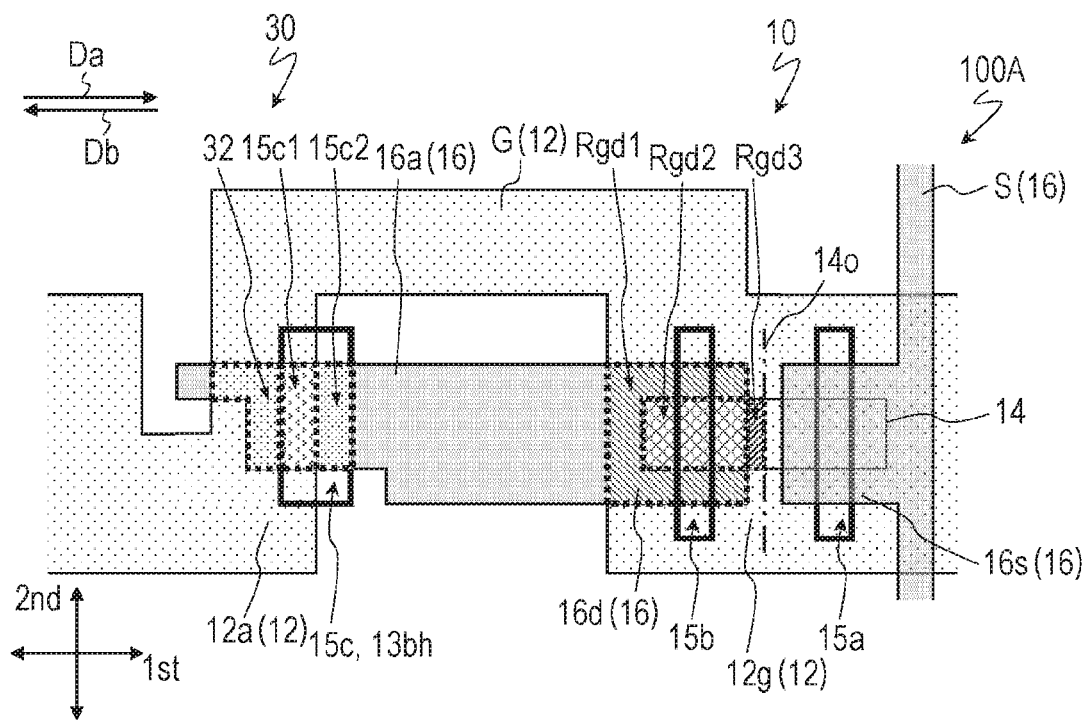
FIG. 3 is a plan view schematically showing the TFT substrate 100A, and shows the TFT substrate 100A in which no misalignment occurs between a protective insulating layer 15 and a first conductive layer 12.
Figure 4:
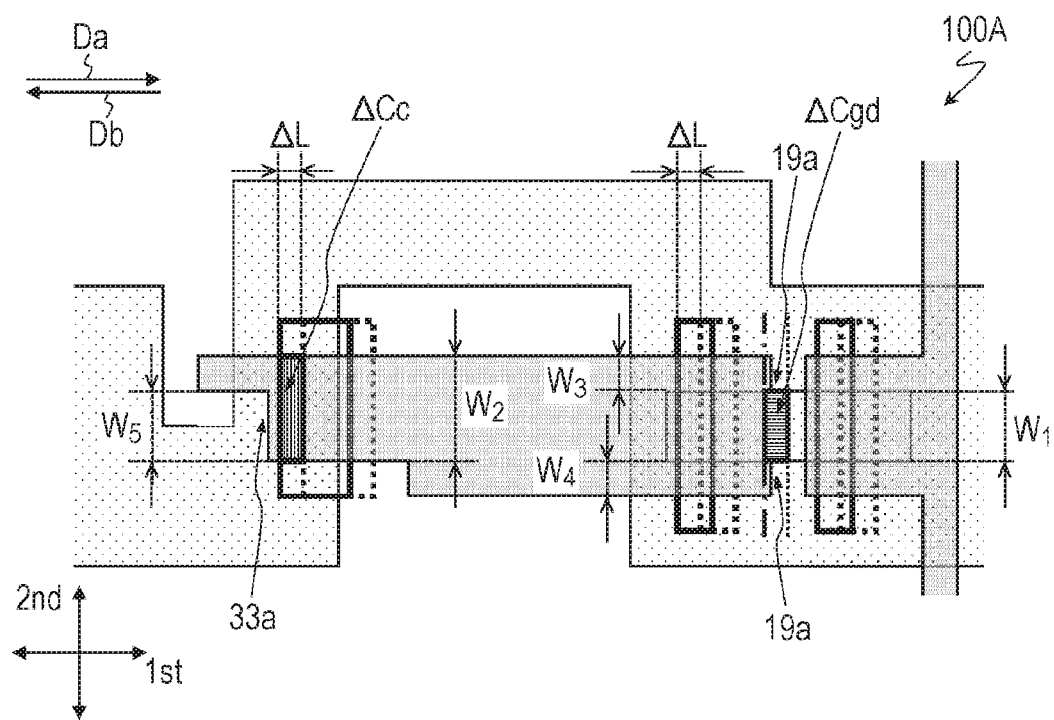
FIG. 4 is a plan view schematically showing the TFT substrate 100A, and shows a misalignment (a shift from the state of FIG. 3) between the protective insulating layer 15 and the first conductive layer 12.
Figure 5:
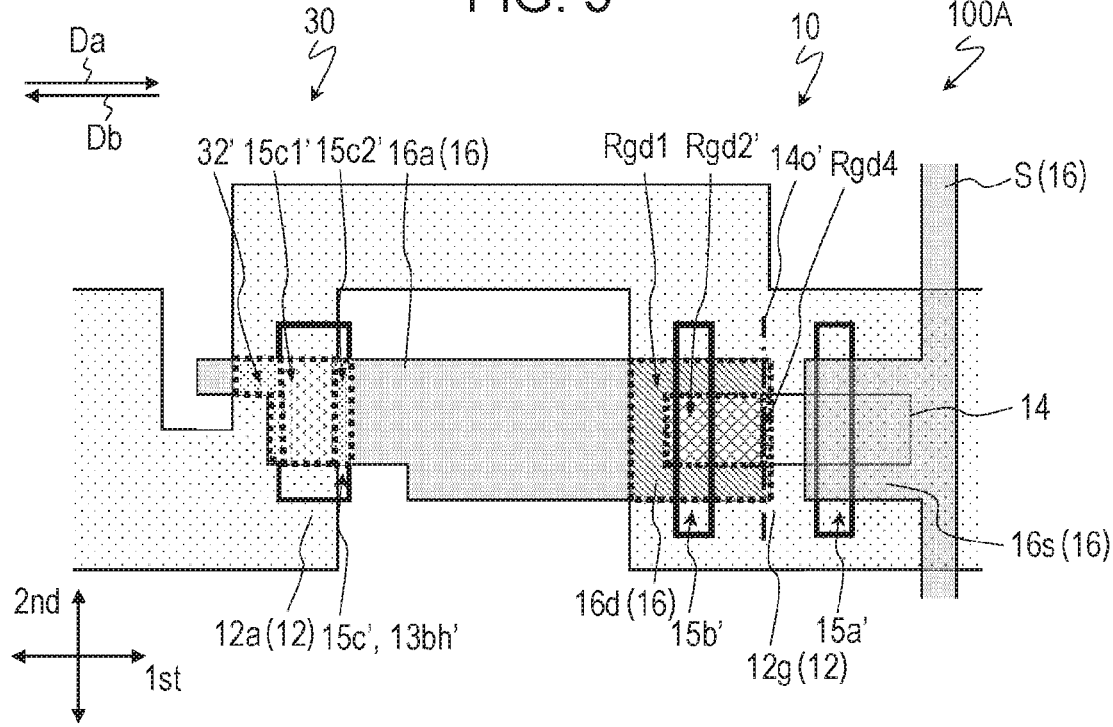
FIG. 5 is a schematic plan view of the TFT substrate 100A, and shows the TFT substrate 100A in which a misalignment occurred between the protective insulating layer 15 and the first conductive layer 12.

With reference to FIG. 3 to FIG. 5, a description will be given in which the TFT substrate 100A having the compensation capacitance unit 30 makes it possible to suppress changes in the parasitic capacitance formed between the gate electrode 12g and the drain electrode 16d due to a misalignment between the protective insulating layer 15 and the first conductive layer (gate layer) 12. FIG. 3 to FIG. 5 are schematic plan views of the TFT substrate 100A, and are schematic views for illustrating effects obtained in the TFT substrate 100A. FIG. 3 shows the TFT substrate 100A in which no misalignment occurred between the protective insulating layer 15 and the first conductive layer 12, FIG. 4 schematically shows a misalignment between the protective insulating layer 15 and the first conductive layer 12 (a shift from the state of FIG. 3), and FIG. 5 shows the TFT substrate 100A in which a misalignment occurred between the protective insulating layer 15 and the first conductive layer 12. In FIG. 1 and FIG. 3 to FIG. 5, a channel length direction is defined as a first direction, and a direction (channel width direction) orthogonal to the first direction is defined as a second direction.

First, a description will be given of a pull-in phenomenon caused by a parasitic capacitance formed between the gate electrode 12g and the drain electrode 16d of the TFT 10. Immediately after the TFT 10 enters an off state, that is, immediately after the scanning signal voltage supplied to the gate bus line connected to the gate electrode 12g of the TFT 10 changes from high (VgH) to low (VgL), the voltage of the pixel electrode changes by the pull-in voltage $\Delta Vp$. Due to the pull-in phenomenon, when the display signal voltage supplied from the source bus line S is Vs, the voltage Vl of the pixel electrode is $Vl = Vs + \Delta Vp$.

Specifically, the pull-in voltage $\Delta Vp$ is expressed by the following equations.

$\Delta Vp = \Delta Vp1 + \Delta Vp2$ $\Delta Vp1 = \Delta Cgd \times (VgH - Vs)/C\text{pix}$ $\Delta Vp2 = Cgd\_\text{off} \times \Delta Vg/C\text{pix}$ $\Delta Cgd = Cgd\_\text{off} - Cgd\_\text{on}$ $\Delta Vg = VgL - VgH$ Here, Cgd_on and Cgd_off represent the electrostatic capacitance values of the parasitic capacitance formed between the gate electrode 12g and the drain electrode 16d when the TFT is on and when the TFT is off, respectively, and VgH and VgL represent the values of the scanning signal voltage when the gate is on and when the gate of the TFT is off, respectively, and Cpix represents the electrostatic capacitance value of the pixel capacitance. In this specification, "×" represents multiplication.

For example, in a case where the TFT substrate 100A is used in a liquid crystal display device, when the electrostatic capacitance value of the liquid crystal capacity is Clc (V), the electrostatic capacitance value of the parasitic capacitance (when the TFT is off) formed between the source electrode 16s and the drain electrode 16d is Csd_off, and the electrostatic capacitance value of the auxiliary capacitance (holding capacitance) is Cst, the electrostatic capacitance value Cpix of the pixel capacitance is $$Cpix=Clc(V)+Cgd\_off+Csd\_off+Cst.$$

Here, although the pixel capacitance includes the liquid crystal capacity, the parasitic capacitance between the gate and the drain, the parasitic capacitance between the source and the drain, and the auxiliary capacitance, the pixel capacitance may further include other capacitances. The value of the electrostatic capacitance value Clc (V) of the liquid crystal capacity depends on the effective voltage (V) applied to the liquid crystal layer of each pixel. Although not shown, the auxiliary capacitance is formed so as to be electrically connected (for example, connected in parallel) to the liquid crystal capacity. An effect of maintaining the liquid crystal capacity by the auxiliary capacitance is obtained. Generally, the electrostatic capacitance value of the parasitic capacitance formed between the source electrode 16s and the drain electrode 16d is small.

Referring to FIG. 3, a specific description will be given of the parasitic capacitance between the gate and the drain when the TFT is on and when the TFT is off. FIG. 3 shows the TFT substrate 100A in which no misalignment occurred between the protective insulating layer 15 and the first conductive layer 12. As shown in FIG. 3, in the TFT 10, the regions contributing to the capacitance formed between the gate electrode 12g and the drain electrode 16d are defined by dividing them in three parts. A first region Rgd1 is a region which overlaps the gate electrode 12g and the drain electrode 16d and which does not overlap the semiconductor layer 14. A second region Rgd2 is a region where the gate electrode 12g, the drain electrode 16d, and the drain-side region of the semiconductor layer 14 overlap. A third region Rgd3 is a region in which the gate electrode 12g and the region on the drain region 14d side of a center 14o in the channel region 14c of the semiconductor layer 14 overlap and do not overlap the drain electrode 16d.

Here, the center 14o of the channel region 14c is defined by the center between the edge of the first opening portion 15a on the drain region 14d side and the edge of the second opening portion 15b on the source region 14s side. In FIG. 3, the center 14o of the channel region 14c is indicated by a chain line. The "drain-side region" of the semiconductor layer 14 refers to a region on the drain region 14d side from the center 14o of the channel region 14c in the semiconductor layer 14. The drain-side region of the semiconductor layer 14 includes the drain region 14d and a region of the channel region 14c on the drain region 14d side from the center 14o.

The parasitic capacitance between the gate and the drain when the TFT is off is formed in the first region Rgd1 and the second region Rgd2. When the TFT is off, in the first region Rgd1 and the second region Rgd2, the gate electrode 12g, the drain electrode 16d, the gate insulating layer 13 therebetween or the gate insulating layer 13 and the protective insulating layer 15 form a parasitic capacitance between the gate and the drain. When the electrostatic capacitance values of the parasitic capacitance between the gate and the drain formed when the TFT is off in the first region Rgd1 and the second region Rgd2 are Cgd1 and Cgd2 off respectively, the electrostatic capacitance value Cgd_off of the parasitic capacitance between the gate and drain when the TFT is off is $$Cgd\_off=Cgd1+Cgd2\_off.$$

The parasitic capacitance between the gate and the drain when the TFT is on is formed in the first region Rgd1, the second region Rgd2, and the third region Rgd3. When the TFT is on, in the first region Rgd1, the gate electrode 12g, the drain electrode 16d, the gate insulating layer 13 therebetween or the gate insulating layer 13 and the protective insulating layer 15 form a parasitic capacitance between the gate and the drain, furthermore, in the second region Rgd2 and the third region Rgd3, the gate electrode 12g, the semiconductor layer 14, and the gate insulating layer 13 therebetween form the parasitic capacitance between the gate and the drain. Here, the parasitic capacitance between the gate and the drain formed in the first region Rgd1 is equal between when the TFT is on and when the TFT is off. On the other hand, the parasitic capacitance between the gate and the drain formed in the second region Rgd2 is different between when the TFT is on and when the TFT is off. In the first region Rgd1, the second region Rgd2, and the third region Rgd3, the electrostatic capacitance values of the parasitic capacitance between the gate and the drain formed when the TFT is on are Cgd1, Cgd2 on and Cgd3, respectively. The electrostatic capacitance value Cgd_on of the parasitic capacitance between the gate and the drain when the TFT is on is $$Cgd\_on=Cgd1+Cgd2\_on+Cgd3.$$

Next, referring to FIG. 4 and FIG. 5, changes in the parasitic capacitance between the gate and the drain are considered when a misalignment in the channel length direction (the first direction (the left-right direction in FIG. 4 and FIG. 5)) occurs between the protective insulating layer 15 and the first conductive layer 12.

When a misalignment occurs in the channel length direction between the protective insulating layer 15 and the first conductive layer 12, the first opening portion 15a, the second opening portion 15b, and the third opening portion 15c of the protective insulating layer 15, and the center 14o of the channel region 14c are shifted in the channel length direction from the state of FIG. 3 with respect to the first conductive layer 12. As shown in FIG. 4 and FIG. 5, the protective insulating layer 15 shifts by ΔL in the direction Db from the first opening portion 15a to the second opening portion 15b, with respect to the first conductive layer 12. FIG. 4 shows the protective insulating layer 15 in the cases of both no shifting and shifting. In FIG. 4, the first opening portion 15a, the second opening portion 15b and the third opening portion 15c which are not shifted, and the center 14o of the channel region 14c are shown by dotted lines. In FIG. 5, the shifted protective insulating layer 15 is shown. An apostrophe may be added to the end of reference symbols of constituent elements whose positions and shapes were changed by shifting.

When a misalignment occurs between the protective insulating layer 15 and the first conductive layer 12, the center 14o of the channel region 14c shifts to change the area of the second region Rgd2 and/or the third region Rgd3. In the illustrated example, as shown in FIG. 5, when a misalignment occurs between the protective insulating layer 15 and the first conductive layer 12, the area of the second region Rgd2 decreases, the third region Rgd3 disappears, and a fourth region Rgd4 appears. The fourth region Rgd4 is a region where the gate electrode 12g, the drain electrode 16d, and a region other than the drain-side region in the semiconductor layer 14 overlap. In the fourth region Rgd4, the gate electrode 12g, the drain electrode 16d, and the gate insulating layer 13 and the protective insulating layer 15 therebetween form a parasitic capacitance when the TFT is off. When the TFT is on, a parasitic capacitance between the gate and the drain is not formed in the fourth region Rgd4. When the electrostatic capacitance value of the parasitic capacitance between the gate and the drain formed in the fourth region Rgd4 when the TFT is off is Cgd4, and, the electrostatic capacitance value of the parasitic capacitance between the gate and the drain formed in the second region Rgd2' after the shift when the TFT is off is Cgd2_off', the electrostatic capacitance value Cgd_off' of the parasitic capacitance between the gate and the drain when the TFT is off after the shift is $Cgd\_off'=Cgd1+Cgd2\_off'+Cgd4.$ The sum of the area of the second region Rgd2' after shifting and the area of the fourth region Rgd4 is equal to the area of the second region Rgd2 before shifting. Accordingly, Cgd2_off=Cgd2_off'+Cgd4 is satisfied, and the parasitic capacitance between the gate and the drain when the TFT is off does not change between before and after shifting (Cgd_off=Cgd_off').

On the other hand, the parasitic capacitance between the gate and the drain when the TFT is on is decreased by the amount of the area of the second region Rgd2 and the area of the third region Rgd3 decreased by the shift. When the electrostatic capacitance value of the parasitic capacitance between the gate and the drain formed when the TFT is on in the second region Rgd2' after shifting is Cgd2_on', the electrostatic capacitance value Cgd_on' of parasitic capacitance between the gate and drain when the TFT is on after shifting is $Cgd\_on'=Cgd1+Cgd2\_on'.$ The change ΔCgd from the electrostatic capacitance value Cgd_on (=Cgd1+Cgd2_on+Cgd3) of the parasitic capacitance between the gate and the drain when the TFT is on before shifting is $\Delta Cgd=Cgd2\_on'-(Cgd2\_on+Cgd3).$ As shown in FIG. 4, the sum (W1×ΔL) of the area of the third region Rgd3 which is removed and the area of the fourth region Rgd4 which appears due to the shifting contributes to the change ΔCgd in the parasitic capacitance between the gate and the drain. W1 is the length of the semiconductor layer 14 in the second direction.

The compensation capacitance unit 30 is formed to compensate for the change ΔCgd in the parasitic capacitance between the gate and the drain due to a misalignment between the protective insulating layer 15 and the first conductive layer 12.

As described with reference to FIG. 1 and FIG. 2, the compensation capacitance unit 30 has the first electrode unit 12a and the second electrode unit 16a. In the region where the first electrode unit 12a and the second electrode unit 16a overlap each other, the first electrode unit 12a, the second electrode unit 16a, and the gate insulating layer 13 or the gate insulating layer 13 and the protective insulating layer 15 therebetween form a compensation capacitance.

The compensation capacitance unit 30 has the third opening portion 15c of the protective insulating layer 15. The third opening portion 15c includes the first portion 15c1 overlapping the first electrode unit 12a and the second electrode unit 16a and the second portion 15c2 not overlapping the first electrode unit 12a. In the first portion 15c1, the first electrode unit 12a, the second electrode unit 16a, and the gate insulating layer 13 therebetween form a compensation capacitance. In the second portion 15c2, since the first electrode unit 12a and the second electrode unit 16a do not overlap, a capacitance is not formed.

In the illustrated example, the gate insulating layer 13 has the first insulating layer 13a and the second insulating layer 13b formed on the first insulating layer 13a, and the second insulating layer 13b has a fourth opening portion 13bh. The side surfaces of the fourth opening portion 13bh are aligned with the side surfaces of the third opening portion 15c. At this time, in the first portion 15c1, the first electrode unit 12a, the second electrode unit 16a, and the first insulating layer 13a therebetween form a capacitance.

"The side surfaces are aligned" of two or more different layers in the opening portion means that not only a case where the side surfaces exposed in the opening portions in these layers are flush with each other in the vertical direction, but also includes a case of continuously forming an inclined surface such as a tapered shape. It is possible to obtain such a configuration by, for example, etching these layers using the same mask, etching one layer as a mask and etching the other layer, or the like. Accordingly, in the illustrated example, when a misalignment occurs between the protective insulating layer 15 and the first conductive layer 12, misalignment may occur with respect to the first conductive layer 12 to the same extent in the fourth opening portion 13bh of the second insulating layer 13b.

It is possible to omit the fourth opening portion 13bh of the second insulating layer 13b. In a case where the second insulating layer 13b does not have an opening portion in the first portion 15c1, in the first portion 15c1, the first electrode unit 12a, the second electrode unit 16a, and the first insulating layer 13a and the second insulating layer 13b therebetween form a capacitance.

In addition, the gate insulating layer 13 may have a single layer structure.

The compensation capacitance unit 30 further has a region (fifth region) 32 overlapping the first electrode unit 12a and the second electrode unit 16a and not overlapping the third opening portion 15c. The fifth region 32 is adjacent to the first portion 15c1 in the direction Db from the first opening portion 15a to the second opening portion 15b. In the fifth region 32, the first electrode unit 12a, the second electrode unit 16a, and the gate insulating layer 13 (including the first insulating layer 13a and the second insulating layer 13b) therebetween and the protective insulating layer 15 form a capacitance.

Referring again to FIG. 4 and FIG. 5, the change in the compensation capacitance unit 30 when a misalignment occurs between the protective insulating layer 15 and the first conductive layer 12 is considered. When the misalignment occurs in the channel length direction between the protective insulating layer 15 and the first conductive layer 12, the third opening portion 15c shifts from the state of FIG. 3 in the channel length direction. Since the fourth opening portion 13bh of the second insulating layer 13b is aligned with the side surfaces of the third opening portion 15c, the fourth opening portion 13bh also shifts from the state of FIG. 3 in the channel length direction by the same amount as the third opening portion 15c. When the third opening portion 15c shifts, the area of the first portion 15c1, the area of the second portion 15c2, and the area of the fifth region 32 change. In the illustrated example, as shown in FIG. 4 and FIG. 5, the area of the first portion 15c1 increases, the area of the second portion 15c2 decreases, and the area of the fifth region 32 decreases.

Attention will be paid to the change in the first portion 15c1 and the fifth region 32 forming the compensation capacitance. Although the sum of the area of the first portion 15c1 and the area of the fifth region 32 does not change before and after the shift, the area of the first portion 15c1 increases and the area of the fifth region 32 decreases. When the relative dielectric constant of the first insulating layer 13a is $\varepsilon_{GI1}$ and the thickness of the first insulating layer 13a is $d_{GI1}$, the electrostatic capacitance value per area of the compensation capacitance formed in the first portion 15c1 is $\varepsilon_{GI1}/d_{GI1}$. On the other hand, when the relative dielectric constant of the first insulating layer 13a, the second insulating layer 13b, and the protective insulating layer 15 is $\varepsilon_{ES+GI1+GI2}$, and the thicknesses of the first insulating layer 13a, the second insulating layer 13b and the protective insulating layer 15 are $d_{ES+GI1+GI2}$, the electrostatic capacitance value per area of the compensation capacitance formed in the fifth region 32 is $\varepsilon_{ES+GI1+GI2}/d_{ES+GI1+GI2}$. The electrostatic capacitance value of the compensation capacitance per area is larger in the first portion 15c1 than in the fifth region 32. Accordingly, the compensation capacitance formed in the compensation capacitance unit 30 increases.

Here, when the relative dielectric constant of the protective insulating layer 15, the first insulating layer 13a, and the second insulating layer 13b are $\varepsilon_{ES}$, $\varepsilon_{GI1}$, and $\varepsilon_{GI2}$, respectively, and the thicknesses of the protective insulating layer 15, the first insulating layer 13a, and the second insulating layer 13b are $d_{ES}$, $d_{GI1}$, and $d_{GI2}$, respectively, the following formulae are satisfied.

$$(\varepsilon_{ES+GI1+GI2}/d_{ES+GI1+GI2})^{-1}=(\varepsilon_{ES}/d_{ES})^{-1}+(\varepsilon_{GI1}/d_{GI1})^{-1}+(\varepsilon_{GI2}/d_{GI2})^{-1}$$

Accordingly, $$(\varepsilon_{ES+GI1+GI2}/d_{ES+GI1+GI2})^{-1}>(\varepsilon_{ES}/d_{ES})^{-1} \text{ and}$$

$$(\varepsilon_{ES+GI1+GI2}/d_{ES+GI1+GI2})<(\varepsilon_{ES}/d_{ES}).$$

The third opening portion 15c having the first portion 15c1 and the second portion 15c2 makes it possible to change the ratio of the area of the first portion 15c1 and the area of the fifth region 32 without changing the sum of the area of the first portion 15c1 and the area of the fifth region 32. The second portion 15c2 being adjacent to the first portion 15c1 in the direction Da from the second opening portion 15b to the first opening portion 15a makes it possible for the change in the compensation capacitance of the compensation capacitance unit 30 due to a misalignment in the channel length direction of the protective insulating layer 15 and the first conductive layer 12 to compensate for the change ΔCgd in the parasitic capacitance between the gate and the drain.

In the illustrated example, the third opening portion 15c has the second portion 15c2 overlapping the second electrode unit 16a and not overlapping the first electrode unit 12a. The third opening portion 15c may include a second portion which overlaps the first electrode unit 12a and does not overlap the second electrode unit 16a. It is sufficient if no capacitance is formed between the first electrode unit 12a and the second electrode unit 16a in the second portion. The second portion may not overlap the first electrode unit 12a and/or the second electrode unit 16a.

When the electrostatic capacitance value of the compensation capacitance formed in the compensation capacitance unit 30 before shifting is Cc and the electrostatic capacitance value of the compensation capacitance formed in the compensation capacitance unit 30 after shifting is Cc', the capacitance change ΔCc in the compensation capacitance unit 30 due to a misalignment between the protective insulating layer 15 and the first conductive layer 12 is $$\Delta Cc = Cc' - Cc.$$

As shown in FIG. 4, an area (W2×ΔL) of a region which is the first portion 15c1' after shifting which is a region which was the fifth region 32 before shifting contributes to the change ΔCc of the compensation capacitance of the compensation capacitance unit 30. W2 is the length of the first portion 15c1 in the second direction. Furthermore, a difference in the electrostatic capacitance value of the compensation capacitance per area between the first portion 15c1 and the fifth region 32 also contributes to the change ΔCc of the compensation capacitance of the compensation capacitance unit 30.

The second insulating layer 13b having the fourth opening portion 13bh as in the illustrated example makes it possible to increase the difference in the electrostatic capacitance value of the compensation capacitance per area between the first portion 15c1 and the fifth region 32. In such a case, it is possible to obtain the effect that it is possible to reduce W2. The side surfaces of the fourth opening portion 13bh are aligned with the side surfaces of the third opening portion 15c. For example, when the second insulating layer 13b and the protective insulating layer 15 are formed of the same material, it is possible to form this type of fourth opening portion 13bh without increasing the number of steps. That is, in the etching step of forming the third opening portion 15c, it is possible to form the fourth opening portion 13bh.

The fourth opening portion 13bh of the second insulating layer 13b may be omitted. Also in such a case, since there is a difference in the electrostatic capacitance value of the compensation capacitance per area between the first portion 15c1 and the fifth region 32 depending on the presence or absence of the protective insulating layer 15, in the same manner as the above, the compensation capacitance of the compensation capacitance unit 30 changes due to a misalignment between the protective insulating layer 15 and the first conductive layer 12, which makes it possible to compensate for the change ΔCgd in the parasitic capacitance between the gate and the drain.

As described above, the capacitance change ΔCc of the compensation capacitance unit 30 can compensate for the change ΔCgd in the parasitic capacitance between the gate and the drain due to a misalignment in the channel length direction between the protective insulating layer 15 and the first conductive layer 12. The TFT substrate 100A having the compensation capacitance unit 30 makes it possible to suppress changes in the parasitic capacitance formed between the gate electrode 12g and the drain electrode 16d due to a misalignment between the protective insulating layer 15 and the first conductive layer 12.

In the example described with reference to FIG. 3 to FIG. 5, the protective insulating layer 15 shifts by ΔL with respect to the first conductive layer 12 in the direction Db from the first opening portion 15a to the second opening portion 15b;

however, compensating for changes in the parasitic capacitance between the gate and the drain using the compensation capacitance unit 30 is not limited to such a case. Even in a case where the protective insulating layer 15 shifts in the direction Da from the second opening portion 15b to the first opening portion 15a with respect to the first conductive layer 12, in the same manner, the change ΔCgd in the parasitic capacitance between the gate and the drain due to a misalignment between the protective insulating layer 15 and the first conductive layer 12 is compensated for by the capacitance change ΔCc in the compensation capacitance unit 30. In such a case, due to a misalignment between the protective insulating layer 15 and the first conductive layer 12, the parasitic capacitance between the gate and the drain increases, and the compensation capacitance formed in the compensation capacitance unit 30 decreases.

It is sufficient if the compensation capacitance unit 30 is designed such that the capacitance change ΔCc in the compensation capacitance unit 30 is able to compensate for at least a part of the change ΔCgd in the parasitic capacitance between the gate and the drain due to a misalignment between the protective insulating layer 15 and the first conductive layer 12. The compensation capacitance unit 30 may be designed such that the capacitance change ΔCc in the compensation capacitance unit 30 can completely compensate for the change ΔCgd in the parasitic capacitance between the gate and the drain.

It is possible to express the absolute value of the change ΔCgd in the parasitic capacitance between the gate and the drain by $|\Delta Cgd| = (\varepsilon_{GI1+GI2}/d_{GI1+GI2}) \times W1 \times \Delta L.$ Here, $\varepsilon_{GI1+GI2}$ represents the relative dielectric constant of the first insulating layer 13a and the second insulating layer 13b, and $d_{GI1+GI2}$ represents the thickness of the first insulating layer 13a and the second insulating layer 13b. In addition, when the relative dielectric constants of the first insulating layer 13a and the second insulating layer 13b are respectively $\varepsilon_{GI1}$ and $\varepsilon_{GI2}$ and the thicknesses of the first insulating layer 13a and the second insulating layer 13b are respectively $d_{GI1}$ and $d_{GI2}$, the following equation is satisfied.

$(\varepsilon_{GI1+GI2}/d_{GI1+GI2})^{-1} = (\varepsilon_{GI1}/d_{GI1})^{-1} + (\varepsilon_{GI2}/d_{GI2})^{-1}$ It is possible to represent the absolute value of the capacitance change ΔCc in the compensation capacitance unit 30 by $|\Delta Cc| = [(\varepsilon_{GI1}/d_{GI1}) - (\varepsilon_{ES+GI1+GI2}/d_{ES+GI1+GI2})] \times W2 \times \Delta L.$ In a case where it is desired to completely compensate for the change ΔCgd in the parasitic capacitance between the gate and the drain when the protective insulating layer 15 shifts in the channel length direction by the compensation capacitance unit 30, the compensation capacitance unit 30 may be designed such that the following equation is satisfied.

$|\Delta Cgd| = |\Delta Cc|$

At this time, the following equation is satisfied.

$$W_2 = \frac{(\varepsilon_{GI1+GI2}/d_{GI1+GI2})}{(\varepsilon_{GI1}/d_{GI1}) - (\varepsilon_{ES+GI1+GI2}/d_{ES+GI1+GI2})} W_1 = K \times W_1 \quad [\text{Math. 1}]$$

Here, in a case where $|\Delta Cgd|=|\Delta Cc|$ is satisfied, the ratio of the length W2 of the first portion 15c1 in the second direction to the length W1 of the semiconductor layer 14 in the second direction is defined as K.

The present embodiment is not limited to a case where W2=K×W1 is satisfied. For example, from the viewpoint of improving mass productivity by permitting a misalignment in a prescribed range in the step of manufacturing the TFT substrate 100A, and from the viewpoint of suppressing a decrease in the aperture ratio of the display device using the TFT substrate 100A, it is preferable to set W2 to 0.3K×W1 or more and 3K×W1 or less.

In a case where $|\Delta Cgd|=|\Delta Cc|$ is satisfied, the ratio K of W2 to W1 is determined by the material and the thickness of the gate insulating layer 13 and the protective insulating layer 15. For example, when the first insulating layer 13a is formed of a silicon nitride (SixNy) film (thickness: 447 nm), the second insulating layer 13b is formed of silicon oxide (SiOx) film (thickness: 69 nm), and the protective insulating layer 15 is formed of a silicon oxide (SiOx) film (thickness: 125 nm), K is estimated to be 1.81. The value of K is not limited to this example, for example, K is 0.7 or more and 4.0 or less. When K is in this range and W2 is set to 0.3K×W1 or more and 3K×W1 or less, W2 is 0.21W1 or more and 12.0W1 or less.

In a case where the fourth opening portion 13bh of the second insulating layer 13b is omitted, when $|\Delta Cgd|=|\Delta Cc|$ is satisfied, the following equation is satisfied.

$$W_2 = \frac{(\varepsilon_{GI1+GI2}/d_{GI1+GI2})}{(\varepsilon_{GI1+GI2}/d_{GI1+GI2}) - (\varepsilon_{ES+GI1+GI2}/d_{ES+GI1+GI2})} W_1 = K \times W_1 \quad [\text{Math. 2}]$$

For example, when the first insulating layer 13a is formed of a silicon nitride (SixNy) film (thickness: 447 nm), the second insulating layer 13b is formed of a silicon oxide (SiOx) film (thickness: 69 nm), and the protective insulating layer 15 is formed of a silicon oxide (SiOx) film (thickness: 125 nm), K is estimated to be 3.57. Even in a case where the fourth opening portion 13bh of the second insulating layer 13b is omitted, K may be set to 0.7 or more and 4.0 or less, for example. When K is in this range and W2 is set to 0.3K×W1 or more and 3K×W1 or less, W2 is 0.21W1 or more and 12.0W1 or less.

The structure of the compensation capacitance unit 30 is not limited to the above example. The compensation capacitance unit of each pixel of the TFT substrate 100A includes a part of the first conductive layer 12 and a part of the second conductive layer 16 and may be formed to compensate for at least a part of the change in the capacitance formed between the gate electrode 12g and the drain electrode 16d when the protective insulating layer 15 shifts in the channel length direction with respect to the first conductive layer 12.

The TFT substrate 100A is also designed so as to suppress changes in the parasitic capacitance formed between the gate electrode 12g and the drain electrode 16d due to a misalignment in the channel length direction between the second conductive layer (source layer) 16 and the first conductive layer 12.

In the TFT substrate 100A, in the changes in the parasitic capacitance between the gate and the drain due to a misalignment between the second conductive layer 16 and the first conductive layer 12, changes in the parasitic capacitance (electrostatic capacitance value: Cgd1) between the gate and the drain formed when the TFT is off and on in the first region Rgd1 are compensated for by the change in the compensation capacitance formed in the compensation capacitance unit 30 by adopting a design in which Wa=Wb is satisfied. Here, Wa is the amount of change in the area of the first region Rgd1 per unit length of the shift amount when the second conductive layer 16 shifts in the channel length direction with respect to the first conductive layer 12. Wb is the amount of change in the area of the fifth region 32 per unit length of the shift amount when the second conductive layer 16 shifts in the channel length direction with respect to the first conductive layer 12. The change in area of the first region Rgd1 when the second conductive layer 16 shifts in the channel length direction with respect to the first conductive layer 12 may be compensated for by a change in the area of the fifth region 32.

A more specific description will be given. As shown in FIG. 4, in TFT substrate 100A, Wa corresponds to W3+W4. The TFT 10 has a sixth region 19a adjacent to the first region Rgd1 in the direction Da extending from the second opening portion 15b to the first opening portion 15a, which overlaps the gate electrode 12g and does not overlap the semiconductor layer 14 and the drain electrode 16d. W3+W4 is a length of a portion in the first region Rgd1 adjacent to the sixth region 19a in the second direction.

As shown in FIG. 4, Wb corresponds to W5 in the TFT substrate 100A. The compensation capacitance unit 30 has a seventh region 33a adjacent to the fifth region 32 in the direction Db from the first opening portion 15a to the second opening portion 15b, which overlaps the first electrode unit 12a and which does not overlap the second electrode unit 16a. W5 is a length of a portion in the fifth region 32 adjacent to the seventh region 33a in the second direction. In order for Wa=Wb to be satisfied, a design may be adopted in which W5=W3+W4 is satisfied. In the present embodiment, for example, W2>W5.

The difference in the electrostatic capacitance value of the parasitic capacitance between the gate and drain per area between the first region Rgd1 and the sixth region 19a is equal to the difference in the electrostatic capacitance value of the compensation capacitance per area between the fifth region 32 and the seventh region 33a. Accordingly, by adopting a design in which W5=W3+W4 is satisfied, the change in the parasitic capacitance between the gate and the drain formed in the first region Rgd1 is compensated for by the change in the compensation capacitance formed in the compensation capacitance unit 30.

In order to obtain the above effect, it is preferable to adopt a design in which Wa is equal to Wb (that is, such that Wa=Wb is satisfied), but the embodiment of the present invention is not limited thereto, and a design may be adopted in which Wa is substantially equal to Wb. That is, the relational expression of Wa=Wb (for example, W3+W4=W5 in the present embodiment) allows for a prescribed amount of error. For example, the embodiment may be designed to satisfy 0.3×Wa≤Wb≤Wa+W1. For example, the present embodiment may be designed such that 0.3×(W3+W4) ≤W5≤(W3+W4)+W1 is satisfied. At this time, at least a part of the above effect is obtained.

In the TFT substrate 100A, in the changes in the parasitic capacitance between the gate and the drain due to a misalignment in the channel length direction between the second conductive layer 16 and the first conductive layer 12, the change in the parasitic capacitance formed in the second region Rgd2 and the third region Rgd3 is not compensated for by the compensation capacitance unit 30. However, as described above, with the structure described above, since it is possible to compensate for a part of the changes in the parasitic capacitance formed between the gate electrode 12g and the drain electrode 16d due to a misalignment in the channel length direction between the second conductive layer 16 and the first conductive layer 12, it is possible to suppress changes in the parasitic capacitance between the gate and the drain.

Figure 6:
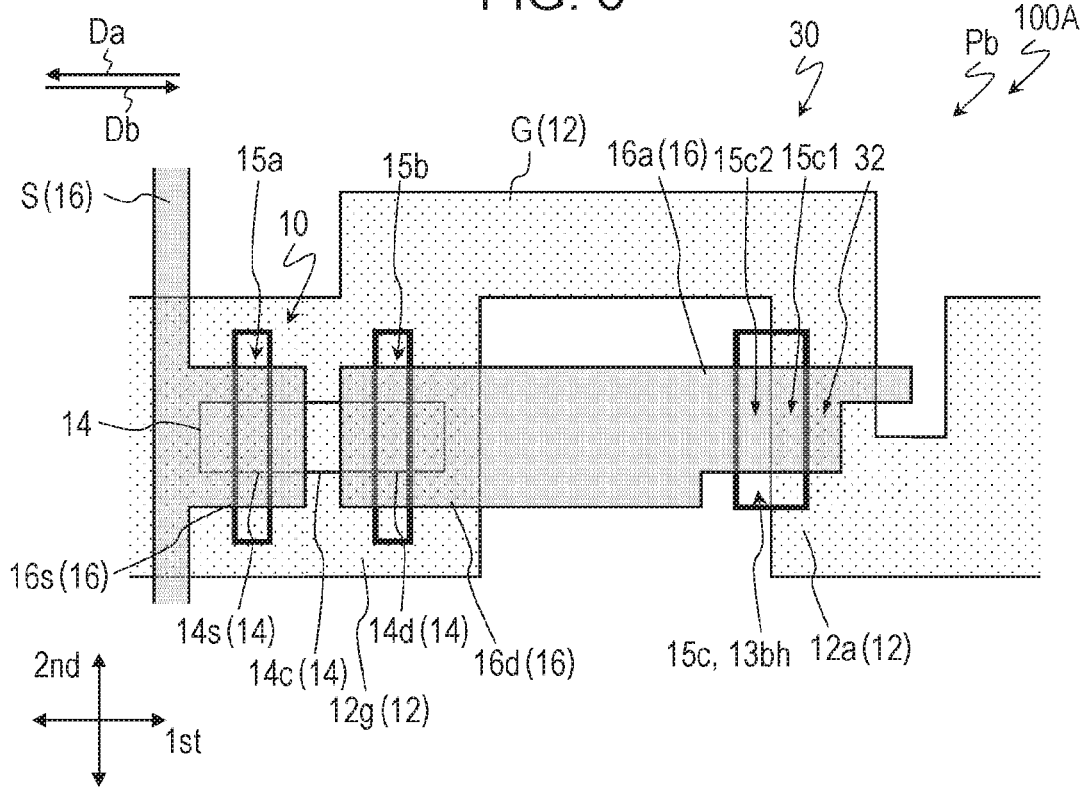
FIG. 6 is a plan view schematically showing the TFT substrate 100A, and shows pixels having a pixel structure different from the pixel structure shown in FIG. 1.
Figure 7:
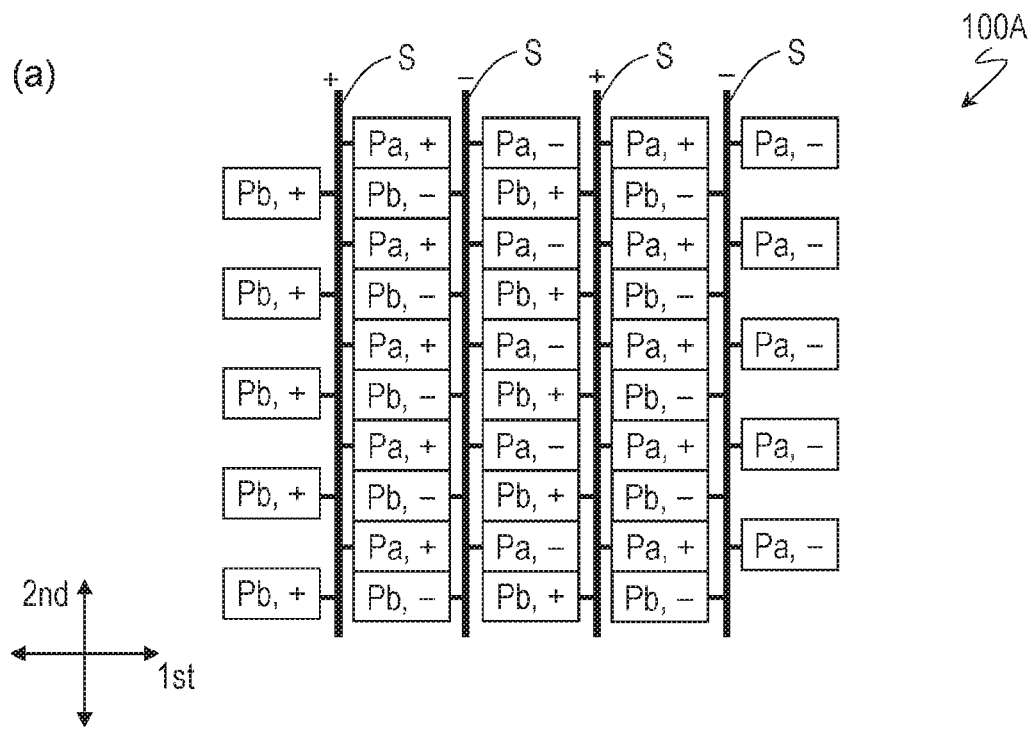
FIG. 7(a) is a diagram schematically showing an example of an arrangement of pixels in the TFT substrate 100A, and shows the electrical connection relationship between the TFT of each pixel and the source bus line S.
FIG. 7(b) is a diagram schematically showing an example of an arrangement of pixels in a TFT substrate 100x which is a modification of the TFT substrate 100A, and shows the electrical connection relationship between the TFT of each pixel and the source bus line S.
Figure 7:
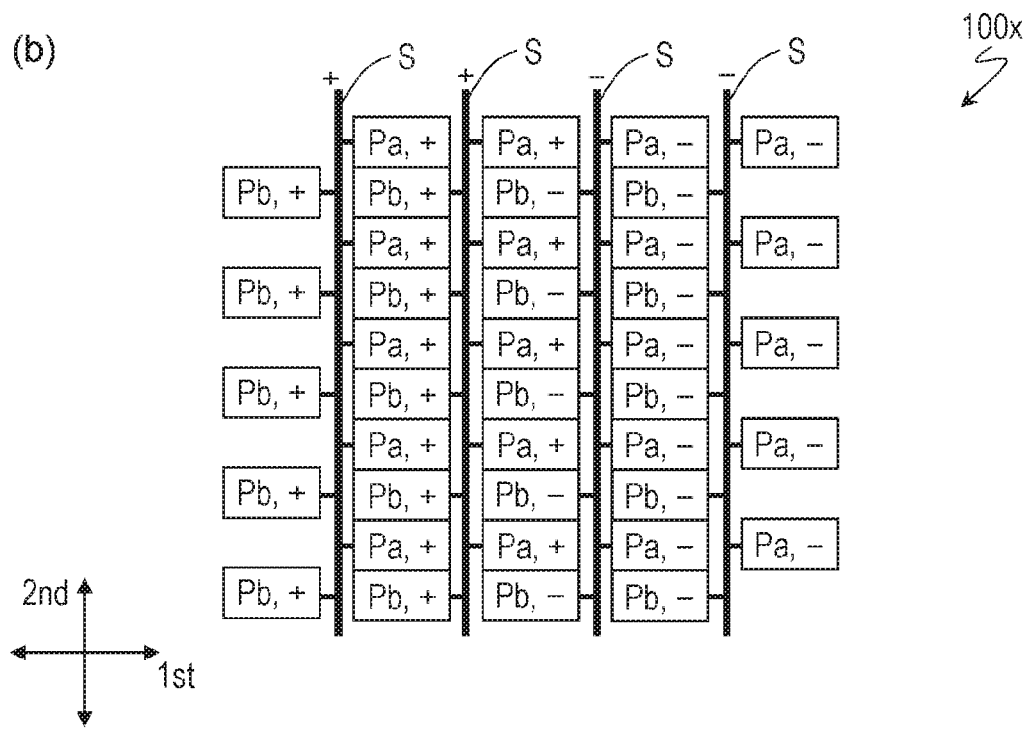

With reference to FIG. 6 and FIG. 7(a), a description will be given of the pixel structure of a plurality of pixels of the TFT substrate 100A. FIG. 6 is a plan view schematically showing the TFT substrate 100A, and shows pixels having a pixel structure different from the pixel structure shown in FIG. 1. FIG. 7(a) is a schematic diagram showing an example of the arrangement of pixels in the TFT substrate 100A, and schematically shows the electrical connection relationship between the TFT of each pixel and the source bus line S. FIG. 7(a) shows the types of pixel structures (the first pixel Pa or the second pixel Pb) of each pixel and the polarity of the display signal voltage applied to each pixel in a certain vertical scanning period. Here, the "vertical scanning period" means a period from the time a certain gate bus line is selected until the next gate bus line is selected.

Figure 51:
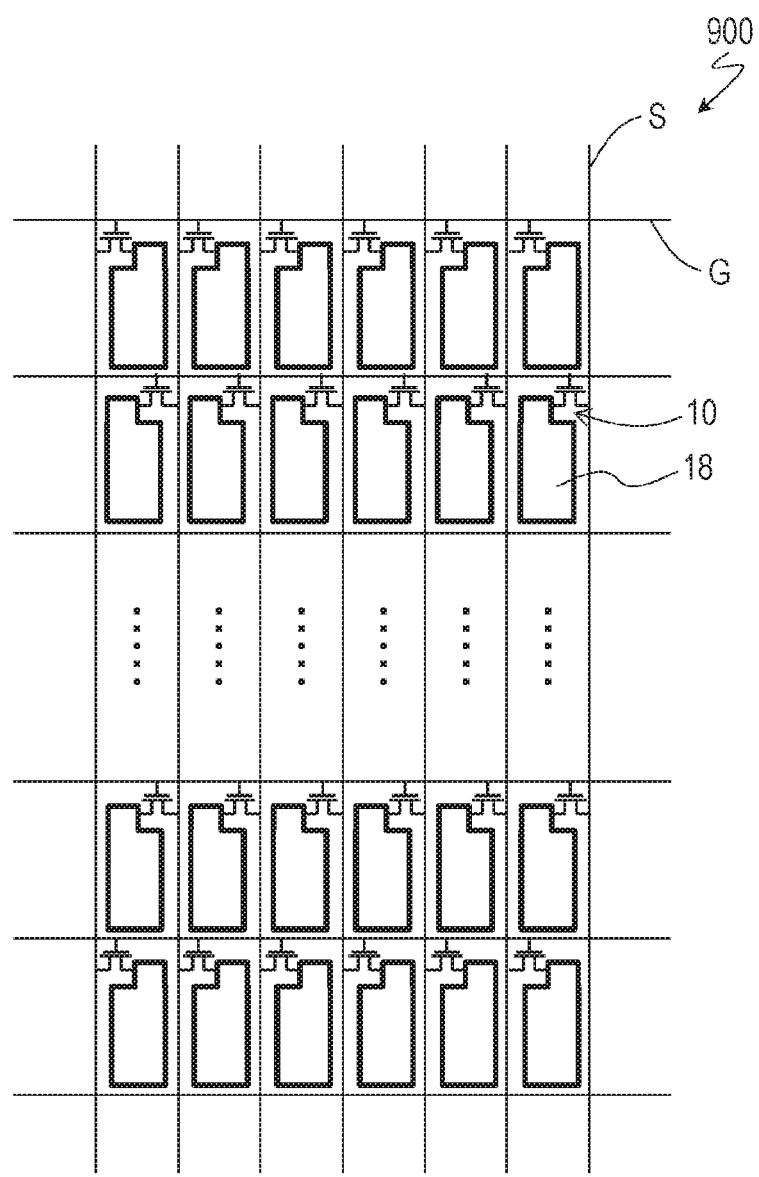
FIG. 51 is a view schematically showing a TFT substrate 900 having a connection relationship in FIG. 2 of PTL 1.

The TFT substrate 100A is the same as the TFT substrate 900 shown in FIG. 51 in the electrical connection relationship between the TFT 10 of each pixel, the source bus line S, and the gate bus line G. The TFT substrate 100A has a plurality of gate bus lines G extending in the row direction and a plurality of source bus lines S extending in the column direction. Each gate bus line G is electrically connected to one of the gate electrodes 12g of the TFT 10 of the TFT substrate 100A and each source bus line S is electrically connected to one of the source electrodes 16s of the TFT 10 of the TFT substrate 100A. In the present embodiment, the row direction substantially coincides with the first direction, and the column direction substantially coincides with the second direction. Each of the gate bus lines G is associated with one of the pixel rows. In FIG. 7(a), illustration of the gate bus line G is omitted.

A pixel having the pixel structure shown in FIG. 1 may be referred to as a first pixel Pa, and a pixel having a pixel structure shown in FIG. 6 may be referred to as a second pixel Pb. The first pixel Pa and the second pixel Pb have the positional relationship opposite to each other, between the first opening portion 15a and the second opening portion 15b. That is, the first pixel Pa has the direction Da from the second opening portion 15b to the first opening portion 15a that is opposite to the direction Da the second pixel Pb has. The first pixel Pa and the second pixel Pb are adjacent to each other in the second direction (channel width direction). In the TFT substrate 100A, the first pixel Pa and the second pixel Pb are not adjacent to each other in the first direction (channel length direction).

In the illustrated example, the first pixel Pa and the second pixel Pb have a symmetrical pixel structure with respect to the second direction. That is, the first pixel Pa and the second pixel Pb have a relationship in which the second pixel Pb is obtained by inverting the first pixel Pa in the first direction (left-right direction in FIG. 1).

As shown in FIG. 7(a), in the TFT substrate 100A, TFTs of two pixels adjacent to each other in the direction (column direction) in which each source bus line S extends are connected to source bus lines S different to each other. That is, the TFTs 10 of each pixel are arranged in a zigzag manner with respect to the source bus line S. Two pixels adjacent to each other in the column direction have opposite directions Da from the second opening portion 15b to the first opening portion 15a. On the other hand, in the two pixels adjacent to each other in the row direction, the directions Da from the second opening portion 15b to the first opening portion 15a are parallel to each other.

In the first pixel Pa and the second pixel Pb, changes in the parasitic capacitance formed between the gate electrode 12g and the drain electrode 16d due to a misalignment in the channel length direction between the protective insulating layer 15 and the first conductive layer 12 are opposite to each other. For example, when the parasitic capacitance between the gate and the drain increases in the first pixel Pa, the parasitic capacitance between the gate and the drain in the second pixel Pb decreases. When the parasitic capacitance between the gate and the drain in the first pixel Pa decreases, the parasitic capacitance between the gate and the drain in the second pixel Pb increases.

The TFT substrate 100A having the compensation capacitance unit 30 makes it possible to suppress differences in the parasitic capacitance between the gate and the drain in the first pixel Pa and the second pixel Pb due to a misalignment in the channel length direction between the protective insulating layer 15 and the first conductive layer 12. Accordingly, the generation of display unevenness is suppressed in the display device provided with the TFT substrate 100A.

As shown in FIG. 7(a), the polarities of the display signal voltages supplied to the two source bus lines S adjacent to each other in each vertical scanning period are opposite to each other. In each vertical scanning period (may be referred to as a frame period), the polarities of the display signal voltages supplied to the pixels adjacent to each other are opposite to each other and enter a dot inversion state. It is possible for the display device provided with the TFT substrate 100A to suppress the generation of flickering.

Figure 8:
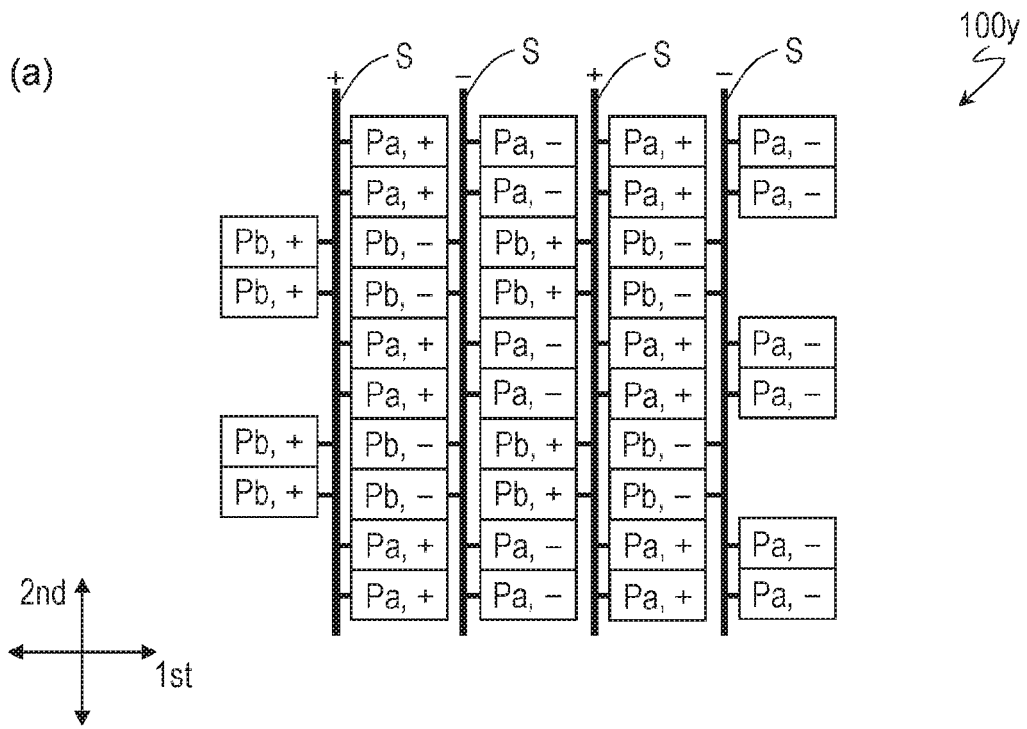
FIG. 8(a) is a diagram schematically showing an example of an arrangement of pixels in a TFT substrate 100y which is a modification of the TFT substrate 100A, and shows an electrical connection relationship between the TFT of each pixel and the source bus line S.
FIG. 8(b) is a diagram schematically showing an example of an arrangement of pixels in a TFT substrate 100z which is a modification of the TFT substrate 100A, and shows the electrical connection relationship between the TFT of each pixel and the source bus line S.
Figure 8:
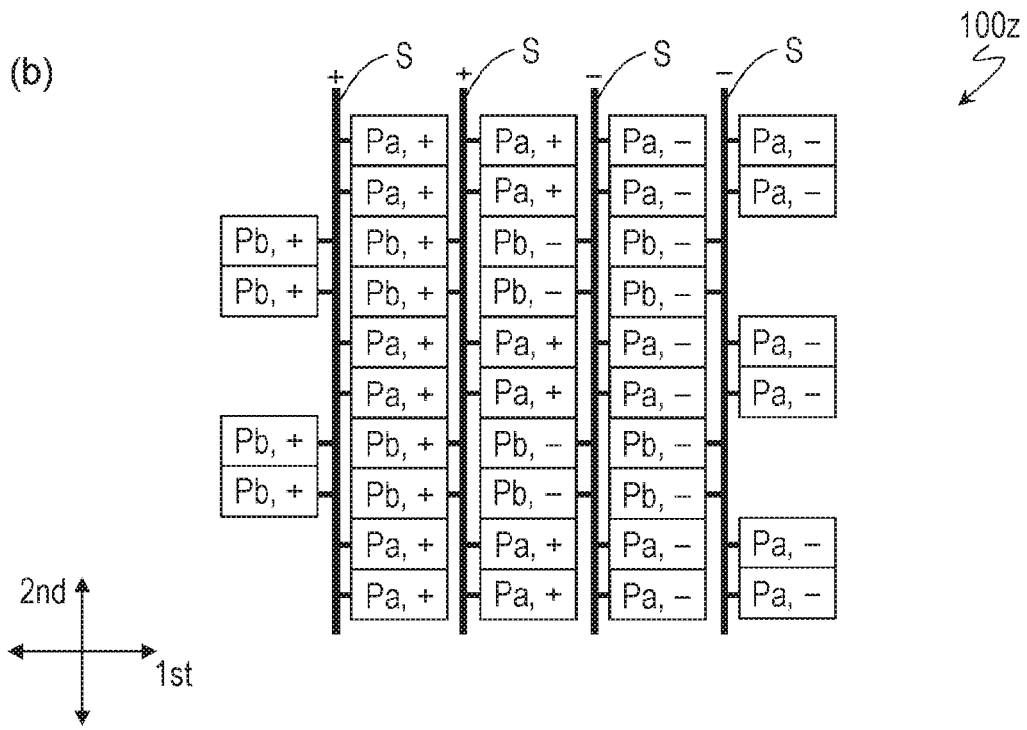

With reference to FIG. 7(b), FIG. 8(a) and FIG. 8(b), a description will be given of a TFT substrate 100x, a TFT substrate 100y, and a TFT substrate 100z of Modifications 1 to 3 of the present embodiment. FIG. 7(b), FIG. 8(a), and FIG. 8(b) schematically show the electrical connection relationship between the TFT of each pixel and the source bus line S, in the same manner as in FIG. 7(a).

A description will be given of the TFT substrate 100x of Modification 1 of the present embodiment. In the TFT substrate 100A, the polarities of the display signal voltages supplied to the two source bus lines S adjacent to each other are opposite to each other, while, as shown in FIG. 7(b), in the TFT substrate 100x, the polarity of the display signal voltage supplied to the source bus line S is inverted every two lines in the row direction.

Even in the TFT substrate 100x, it is possible to obtain the same effect as that of the TFT substrate 100A. However, since the TFT substrate 100x does not enter a dot inversion state in each vertical scanning period, it is inferior to the TFT substrate 100A from the viewpoint of suppressing the generation of flickering.

A description will be given of the TFT substrate 100y according to Modification 2 of the present embodiment. As shown in FIG. 8(a), the TFT substrate 100y differs from the TFT substrate 100A in the following points. In the TFT substrate 100y, when two pixels adjacent to each other in a column are pixel pairs, the TFTs of the two pixels forming the pixel pair are connected to the same source bus line S. In the two pixels forming the pixel pair, the directions Da from the second opening portion 15b to the first opening portion 15a are parallel to each other. TFTs of two pixel pairs adjacent to each other in the column direction are connected to source bus lines S different to each other. For two pixel pairs adjacent to each other in the column direction, the directions Da from the second opening portion 15b to the first opening portion 15a are opposite to each other. As shown in FIG. 8(a), the polarities of the display signal voltages supplied to the two source bus lines S adjacent to each other in each vertical scanning period are opposite to each other. In each vertical scanning period, there is a dot inversion state of 2 rows and 1 column.

Also in the TFT substrate 100y, it is possible to obtain the same effect as that of the TFT substrate 100A.

A description will be given of the TFT substrate 100z according to Modification 3 of the present embodiment. In the TFT substrate 100y, the polarities of the display signal voltages supplied to the two source bus lines S adjacent to each other are opposite to each other, while, as shown in FIG. 8(b), in the TFT substrate 100z, the polarity of the display signal voltage supplied to the source bus line S is inverted every two lines in the row direction.

Also in the TFT substrate 100z, it is possible to obtain the same effect as that of the TFT substrate 100A. However, since the TFT substrate 100z does not enter a dot inversion state in each vertical scanning period, it is inferior to the TFT substrate 100A from the viewpoint of suppressing the generation of flickering.

The semiconductor layer 14 of the TFT substrate 100A may be an oxide semiconductor layer. The oxide semiconductor included in the oxide semiconductor layer may be an amorphous oxide semiconductor or a crystalline oxide semiconductor having a crystalline portion. Examples of the crystalline oxide semiconductor include a polycrystalline oxide semiconductor, a microcrystalline oxide semiconductor, a crystalline oxide semiconductor in which the c-axis is oriented substantially perpendicularly to the layer surface, and the like.

The oxide semiconductor layer may have a laminated structure of two or more layers. In a case where the oxide semiconductor layer has a laminated-layer structure, the oxide semiconductor layer may include an amorphous oxide semiconductor layer and a crystalline oxide semiconductor layer. Alternatively, a plurality of crystalline oxide semiconductor layers having different crystal structures may be included. In addition, a plurality of amorphous oxide semiconductor layers may be included. In a case where the oxide semiconductor layer has a two-layer structure including a higher layer and a lower layer, the energy gap of the oxide semiconductor included in the higher layer is preferably larger than the energy gap of the oxide semiconductor included in the lower layer. However, in a case where the difference in energy gap between these layers is comparatively small, the energy gap of the lower layer oxide semiconductor may be larger than the energy gap of the higher layer oxide semiconductor.

The material, the structure, the film formation method, the configuration of the oxide semiconductor layer having a laminated structure, and the like of the amorphous oxide semiconductor and each of the above-described crystalline oxide semiconductors are described in, for example, Japanese Unexamined Patent Application Publication No. 2014-007399. For reference, all the disclosed content of Japanese Unexamined Patent Application Publication No. 2014-007399 is incorporated herein.

The oxide semiconductor layer may include, for example, at least one metal element selected from In, Ga, and Zn. In the present embodiment, the oxide semiconductor layer includes, for example, an In—Ga—Zn—O-based semiconductor (for example, indium gallium zinc oxide). Here, the In—Ga—Zn—O-based semiconductor is a ternary oxide of In (indium), Ga (gallium), and Zn (zinc), and the ratio of In, Ga, and Zn (composition ratio) is not particularly limited and includes, for example, In:Ga:Zn=2:2:1, In:Ga:Zn=1:1:1, In:Ga:Zn=1:1:2, and the like. It is possible to form such an oxide semiconductor layer from an oxide semiconductor film including an In—Ga—Zn—O-based semiconductor.

The In—Ga—Zn—O-based semiconductor may be amorphous or crystalline. As a crystalline In—Ga—Zn—O-based semiconductor, a crystalline In—Ga—Zn—O-based semiconductor in which the c-axis is oriented to be substantially perpendicular to the layer surface is preferable.

The crystal structure of a crystalline In—Ga—Zn—O-based semiconductor is disclosed in, for example, Japanese Unexamined Patent Application Publication No. 2014-007399, Japanese Unexamined Patent Application Publication No. 2012-134475, Japanese Unexamined Patent Application Publication No. 2014-209727, and the like described above. For reference, all of the disclosures of Japanese Unexamined Patent Application Publication No. 2012-134475 and Japanese Unexamined Patent Application Publication No. 2014-209727 are incorporated in the present specification by reference. Since a TFT having an In—Ga—Zn—O-based semiconductor layer has high mobility (more than 20 times as compared with a-Si TFT) and low current leakage (less than 1/100 of a-Si TFT), it is possible to suitably use the TFT as a driving TFT (for example, a TFT included in a driving circuit provided on the same substrate as a display region in the periphery of a display region including a plurality of pixels) and a pixel TFT (a TFT provided in a pixel).

Instead of the In—Ga—Zn—O-based semiconductor, the oxide semiconductor layer may include another oxide semiconductor. For example, the oxide semiconductor layer may include an In—Sn—Zn—O-based semiconductor (for example, $In_2O_3$—$SnO_2$—ZnO; InSnZnO). The In—Sn—Zn—O-based semiconductor is a ternary oxide of In (indium), Sn (tin), and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, and the like.

Embodiment 2

Figure 9:
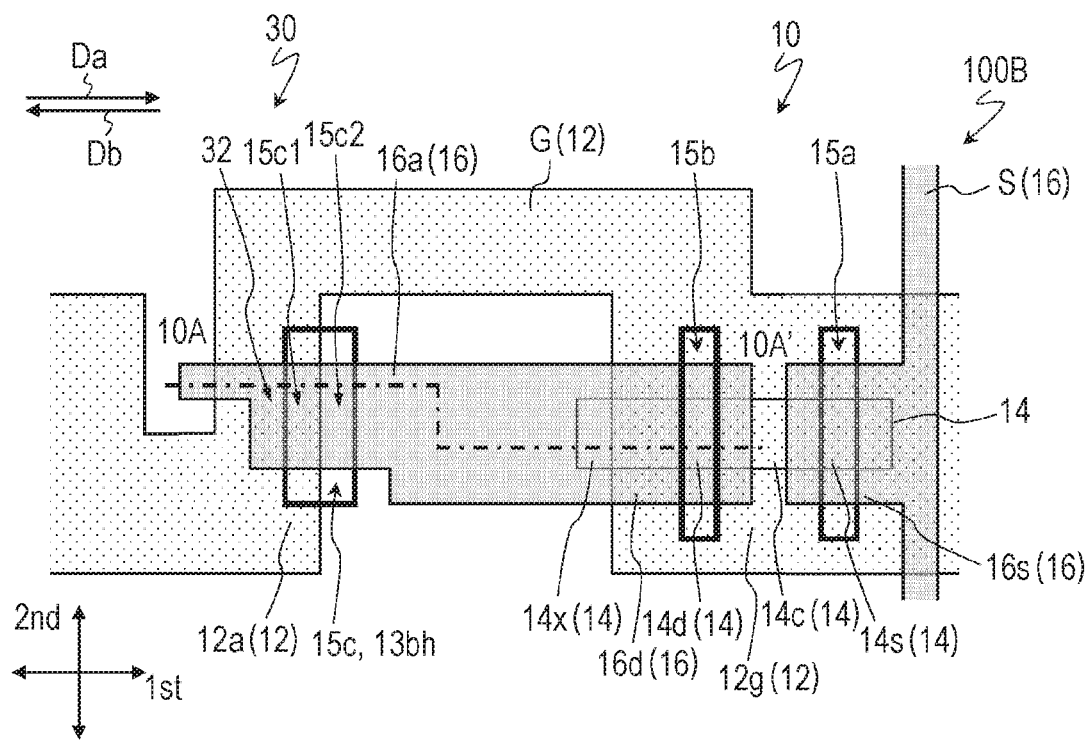
FIG. 9 is a plan view schematically showing a TFT substrate 100B according to an embodiment of the present invention.
Figure 10:
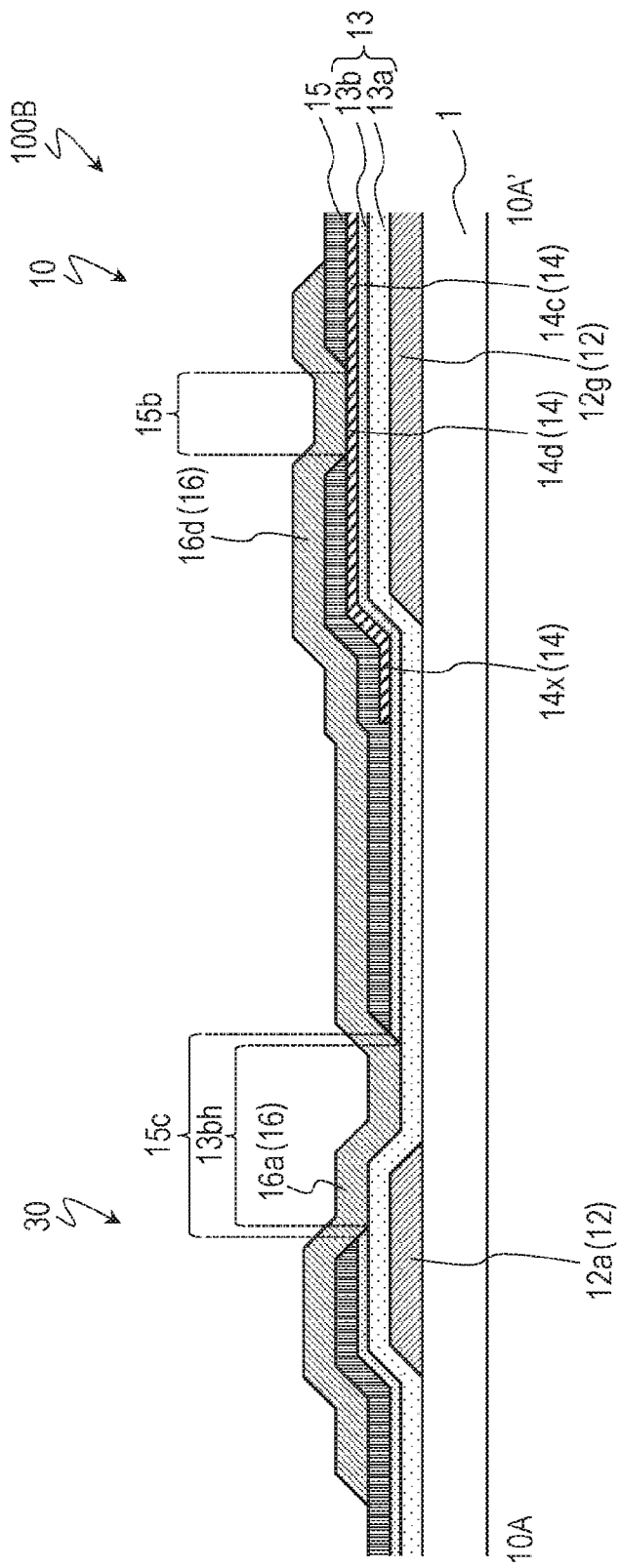
FIG. 10 is a sectional view schematically showing the TFT substrate 100B, and shows a sectional structure taken along a line 10A-10A' in FIG. 9.
Figure 11:
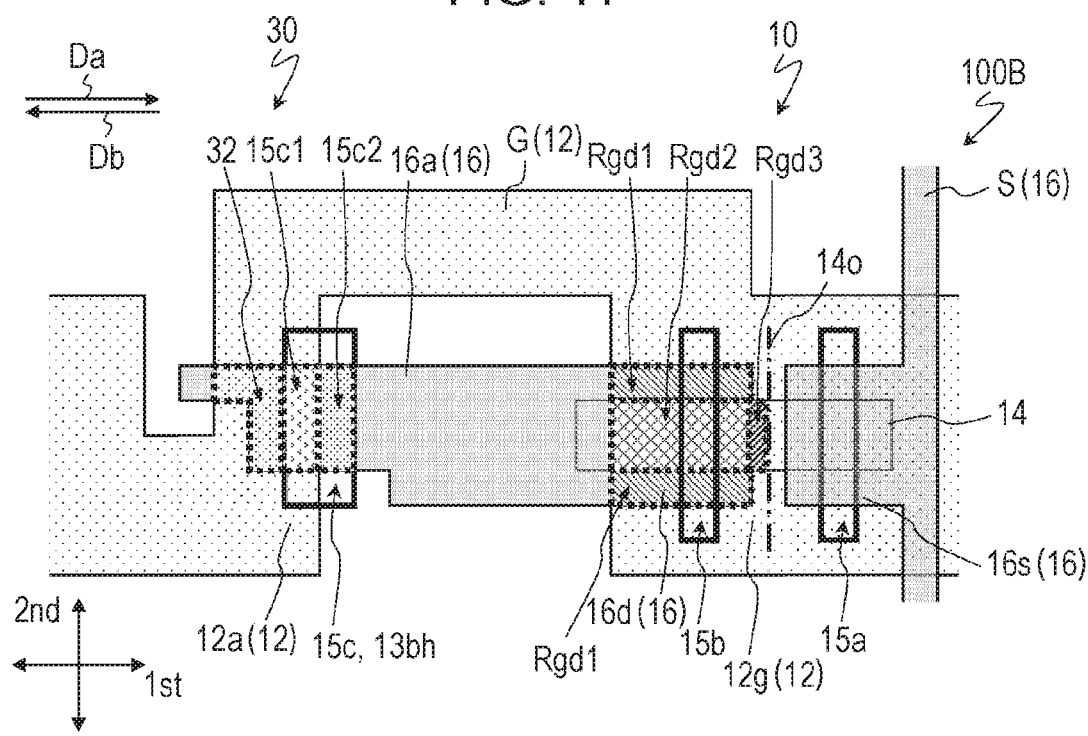
FIG. 11 is a plan view schematically showing the TFT substrate 100B, and shows the TFT substrate 100B in which no misalignment occurs between the protective insulating layer 15 and the first conductive layer 12.
Figure 12:
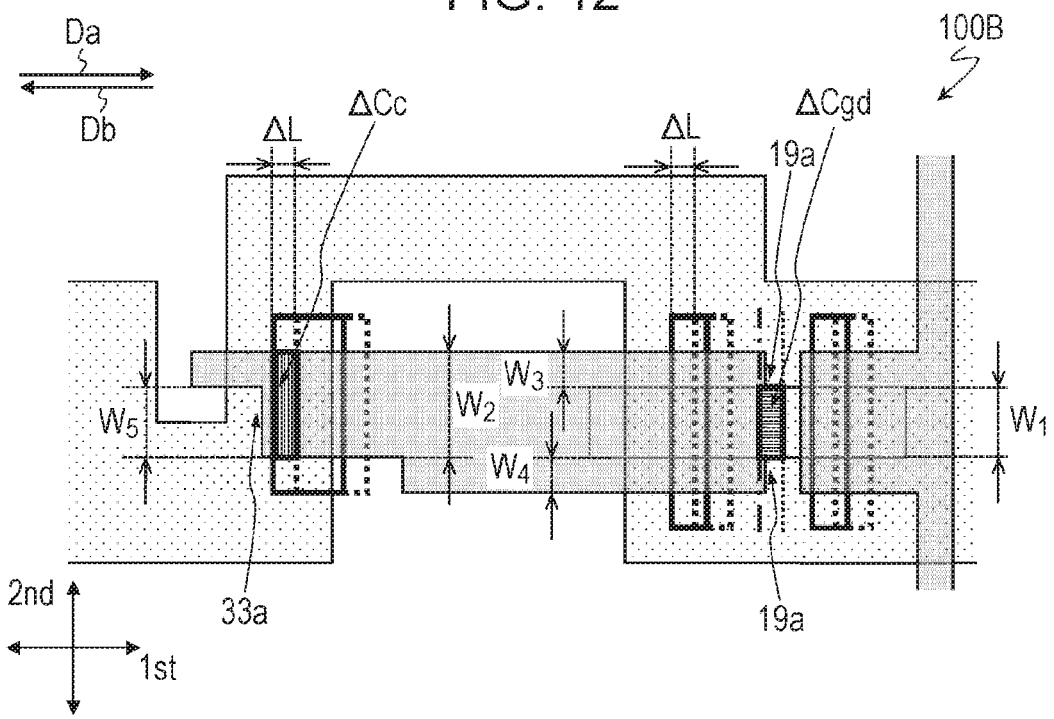
FIG. 12 is a schematic plan view of the TFT substrate 100B and shows a misalignment (a shift from the state of FIG. 11) between the protective insulating layer 15 and the first conductive layer 12.

With reference to FIG. 9 to FIG. 12, a description will be given of a TFT substrate 100B of the present embodiment. FIG. 9 and FIG. 10 are a plan view and a sectional view schematically showing the TFT substrate 100B. FIG. 10 shows a sectional structure taken along the line 10A-10A' in FIG. 9. FIG. 11 and FIG. 12 are schematic plan views of the TFT substrate 100B, and are schematic views for illustrating effects obtained in the TFT substrate 100B. FIG. 11 shows the TFT substrate 100B in which no misalignment occurred between the protective insulating layer 15 and the first conductive layer 12, and FIG. 12 schematically shows a misalignment between the protective insulating layer 15 and the first conductive layer 12 (a shift from the state of FIG. 11). A description will be given below mainly of the difference between the TFT substrate 100B and the TFT substrate 100A in Embodiment 1.

The TFT substrate 100B is different from the TFT substrate 100A in the shape of the semiconductor layer 14. In the TFT substrate 100A, the semiconductor layer 14 is inside the gate electrode 12g as viewed from the normal direction of the substrate 1. In contrast, in the TFT substrate 100B, the semiconductor layer 14 has a portion which does not overlap the gate electrode 12g in the drain-side region. The semiconductor layer 14 includes an extended portion 14x extending from the drain region 14d across the edge of the gate electrode 12g on the drain electrode 16d side.

The TFT substrate 100B having the compensation capacitance unit 30 makes it possible to suppress changes in the parasitic capacitance formed between the gate electrode 12g and the drain electrode 16d due to a misalignment between the protective insulating layer 15 and the gate electrode 12g.

Also in the TFT substrate 100B, by adopting a design in which W5=W3+W4 is satisfied in the same manner as the TFT substrate 100A, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by changes in the compensation capacitance formed in the compensation capacitance unit 30.

Furthermore, the TFT substrate 100B having the extended portion 14x makes it possible to suppress changes in the parasitic capacitance formed between the gate electrode 12g and the drain electrode 16d due to a misalignment between the semiconductor layer 14 and the first conductive layer 12. In the TFT substrate 100B, the areas of the first region Rgd1, the second region Rgd2, and the third region Rgd3 do not change even if a misalignment occurs between the semiconductor layer 14 and the first conductive layer 12. Accordingly, the parasitic capacitance between the gate electrode 12g and the drain electrode 16d formed in these regions does not change.

Embodiment 3

Figure 13:
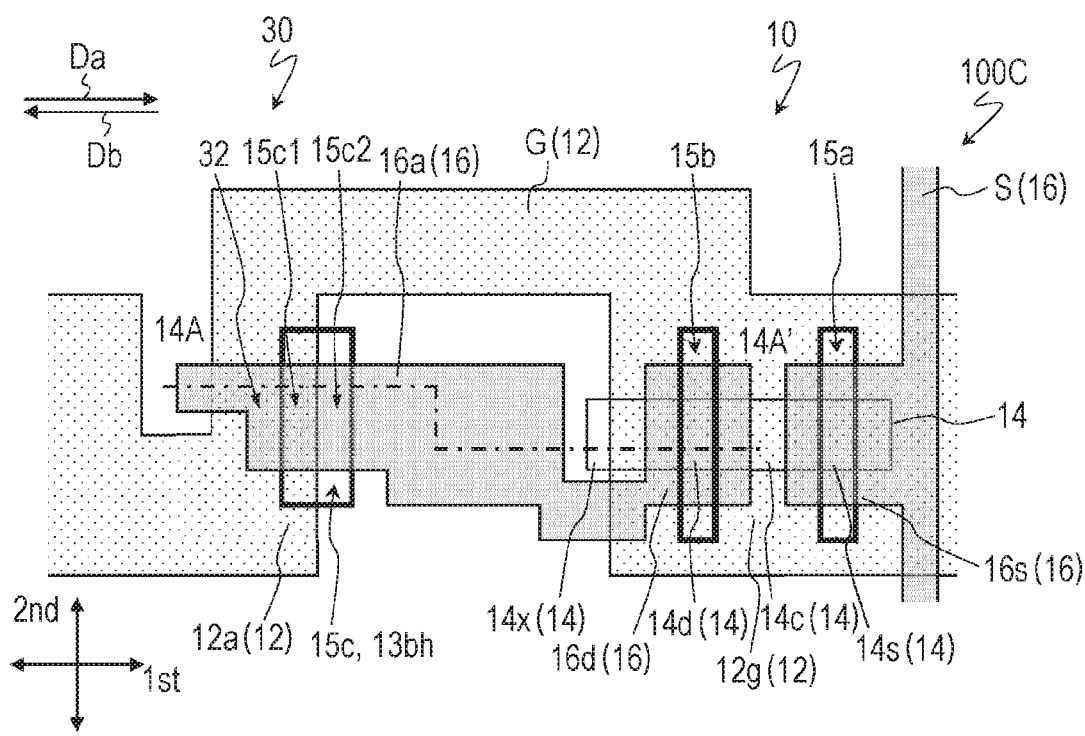
FIG. 13 is a plan view schematically showing a TFT substrate 100C according to an embodiment of the present invention.
Figure 14:
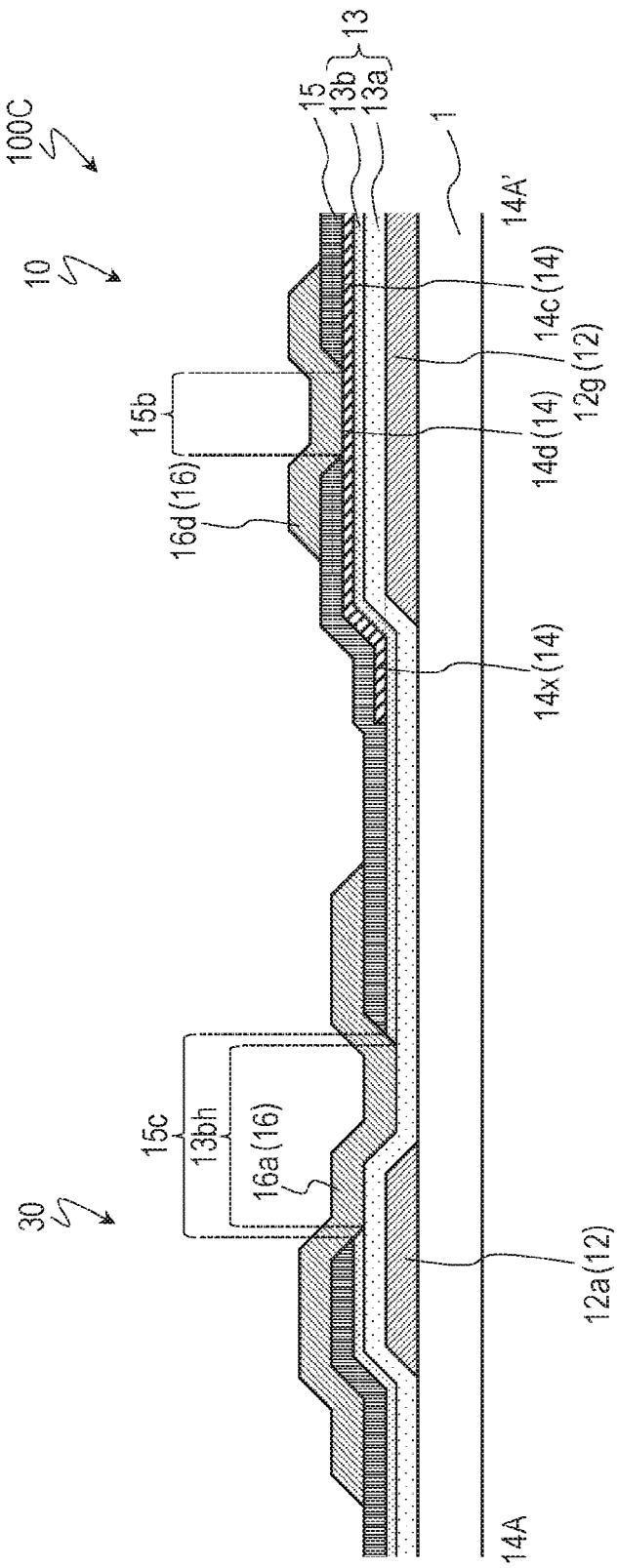
FIG. 14 is a sectional view schematically showing the TFT substrate 100C, and shows a sectional structure taken along a line 14A-14A' in FIG. 13.
Figure 15:
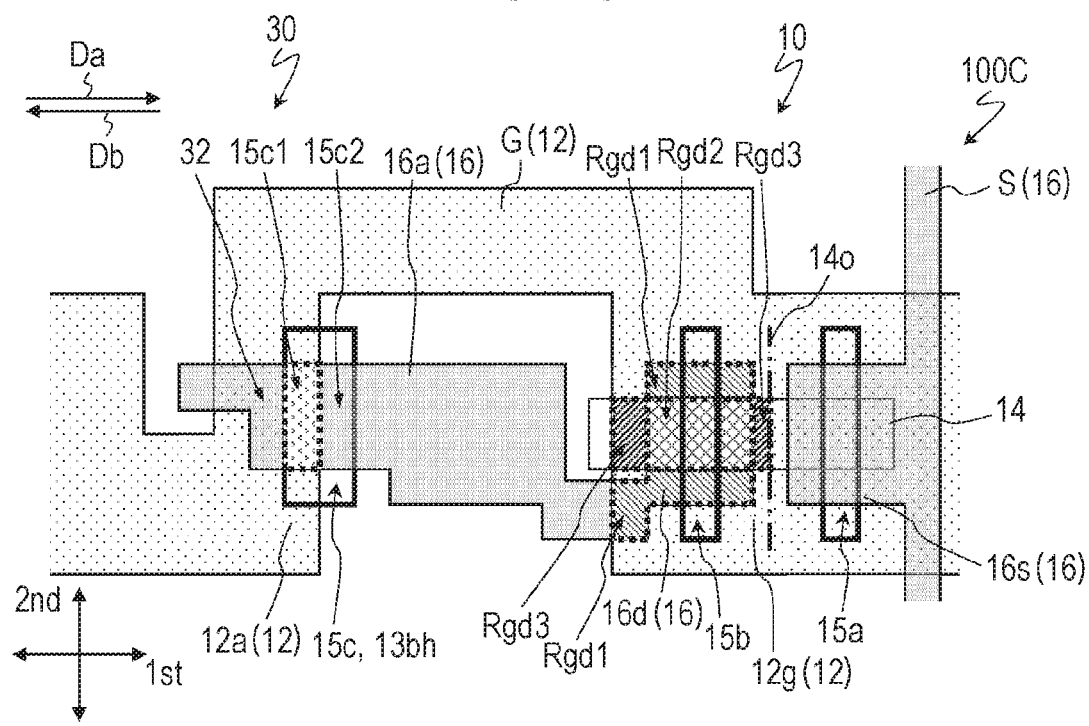
FIG. 15 is a plan view schematically showing the TFT substrate 100C, and shows the TFT substrate 100C in which no misalignment occurs between the protective insulating layer 15 and the first conductive layer 12.
Figure 16:
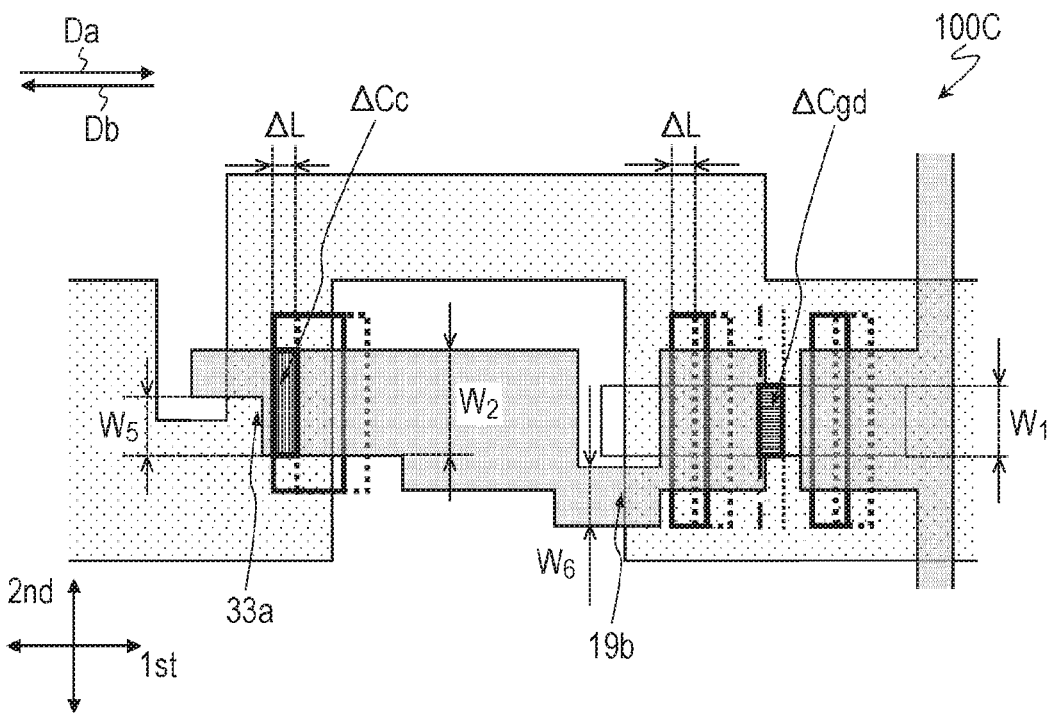
FIG. 16 is a plan view schematically showing the TFT substrate 100C, and shows a misalignment (a shift from the state of FIG. 15) between the protective insulating layer 15 and the first conductive layer 12.

With reference to FIG. 13 to FIG. 16, a description will be given of a TFT substrate 100C of the present embodiment. FIG. 13 and FIG. 14 are a plan view and a sectional view schematically showing the TFT substrate 100C. FIG. 14 shows a sectional structure taken along the line 14A-14A' in FIG. 13. FIG. 15 and FIG. 16 are schematic plan views of the TFT substrate 100C and are schematic views for illustrating effects obtained in the TFT substrate 100C. FIG. 15 shows the TFT substrate 100C in which no misalignment occurs between the protective insulating layer 15 and the first conductive layer 12, and FIG. 16 schematically shows a misalignment (a shift from the state of FIG. 15) between the protective insulating layer 15 and the first conductive layer 12. A description will be given below mainly of the difference between the TFT substrate 100C and the TFT substrate 100B in Embodiment 2.

The TFT substrate 100C is different from the TFT substrate 100B in the shapes of the drain electrode 16d and the second electrode unit 16a.

In the TFT substrate 100B, the portion of the semiconductor layer 14 on the drain electrode 16d side from the edge of the drain electrode 16d on the source electrode 16s side is entirely covered with the drain electrode 16d and/or the second electrode unit 16a formed integrally with the drain electrode 16d. In contrast, in the TFT substrate 100C, the edge of the drain electrode 16d crosses the semiconductor layer 14 between the second opening portion 15b and the edge of the gate electrode 12g on the drain electrode 16d side.

Due to the above structural difference, the following difference occurs. In the TFT substrate 100B, the end of the second region Rgd2 on the drain electrode 16*d* side out of the end on the source electrode 16*s* side and the end on the drain electrode 16*d* side is defined by the edge of the gate electrode 12*g* on the drain electrode 16*d* side. In contrast, in the TFT substrate 100C, the end of the second region Rgd2 on the drain electrode 16*d* side is defined by the edge of the drain electrode 16*d*. In the TFT substrate 100B, it is possible to form the third region Rgd3 only on the source electrode 16*s* side of the second region Rgd2, while, in the TFT substrate 100C, it is possible to form the third region Rgd3 on the source electrode 16*s* side and the drain electrode 16*d* side of the second region Rgd2.

The TFT substrate 100C having the compensation capacitance unit 30 makes it possible to suppress changes in the parasitic capacitance formed between the gate electrode 12*g* and the drain electrode 16*d* due to a misalignment between the protective insulating layer 15 and the gate electrode 12*g*.

In the TFT substrate 100C, as shown in FIG. 16, by adopting a design in which W5=W6 is satisfied, in the changes in the parasitic capacitance between the gate and drain due to a misalignment in the channel length direction between the second conductive layer 16 and the first conductive layer 12, changes in the parasitic capacitance (electrostatic capacitance value: Cgd1) between the gate and the drain formed in the first region Rgd1 when the TFT is off and on are compensated for by the change in the compensation capacitance formed in the compensation capacitance unit 30. In the present embodiment, the amount of change Wa of the area of the first region Rgd1 per unit length of the shift amount when the second conductive layer 16 shifts in the channel length direction with respect to the first conductive layer 12 corresponds to W6, and the amount of change Wb of the area of the fifth region 32 per unit length of the shift amount when the second conductive layer 16 shifts in the channel length direction with respect to the first conductive layer 12 corresponds to W5.

As shown in FIG. 16, the TFT 10 has an eighth region 19*b* adjacent to the first region Rgd1 in the direction Db from the first opening portion 15*a* to the second opening portion 15*b* and which overlaps the drain electrode 16*d*, and does not overlap the semiconductor layer 14 and the gate electrode 12*g*. W6 is the length of a portion of the first region Rgd1 adjacent to the eighth region 19*b* in the second direction.

Furthermore, in the TFT substrate 100C, even if a misalignment occurs in the channel length direction between the second conductive layer 16 and the first conductive layer 12, the areas of the second region Rgd2 and the third region Rgd3 do not change. Accordingly, in the changes in the parasitic capacitance between the gate and the drain due to a misalignment in the channel length direction between the second conductive layer 16 and the first conductive layer 12, the parasitic capacitance between the gate and drain formed in the second region Rgd2 and the third region Rgd3 also does not change.

In order to obtain this effect, namely, even if a misalignment occurs in the channel length direction between the second conductive layer 16 and the first conductive layer 12, in order that the areas of the second region Rgd2 and the third region Rgd3 do not change, the third region Rgd3 may be formed to be adjacent to the second region Rgd2 in the direction Db from the first opening portion 15*a* to the second opening portion 15*b*. This structure is obtained by the edge of the drain electrode 16*d* crossing the semiconductor layer 14 between the second opening portion 15*b* and the edge of the gate electrode 12*g* on the drain electrode 16*d* side. The edge of the drain electrode 16*d* may be the edge of the opening portion of the drain electrode 16*d* as described below with reference to FIG. 21 in Embodiment 6.

Embodiment 4

Figure 17:
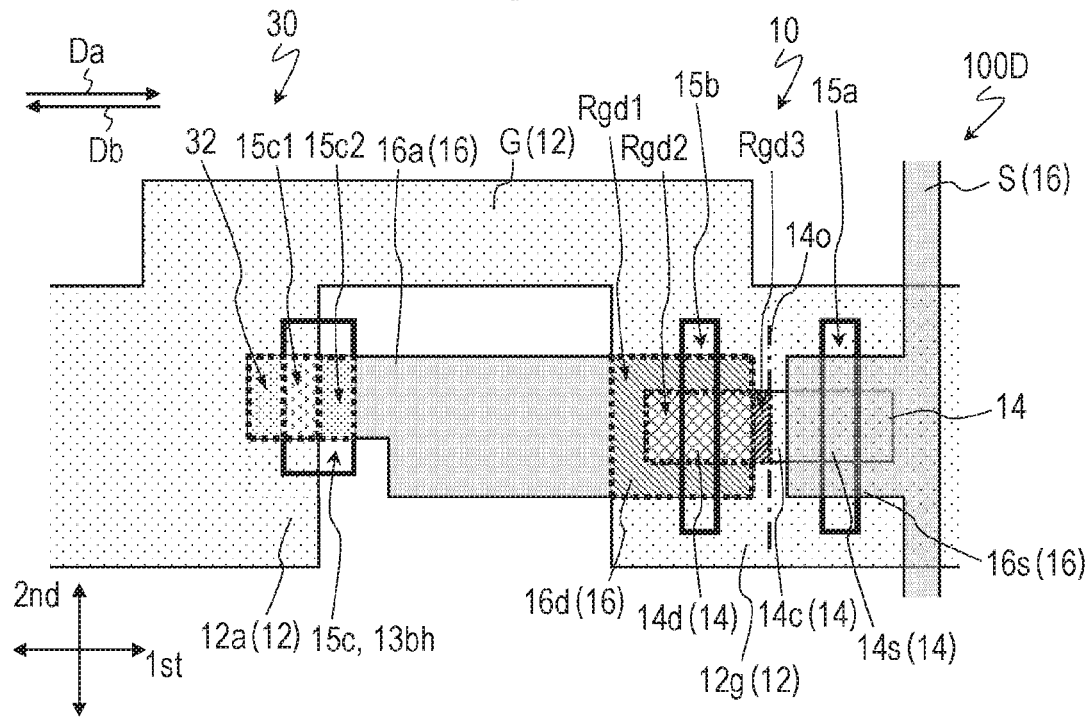
FIG. 17 is a plan view schematically showing a TFT substrate 100D according to an embodiment of the present invention.
Figure 18:
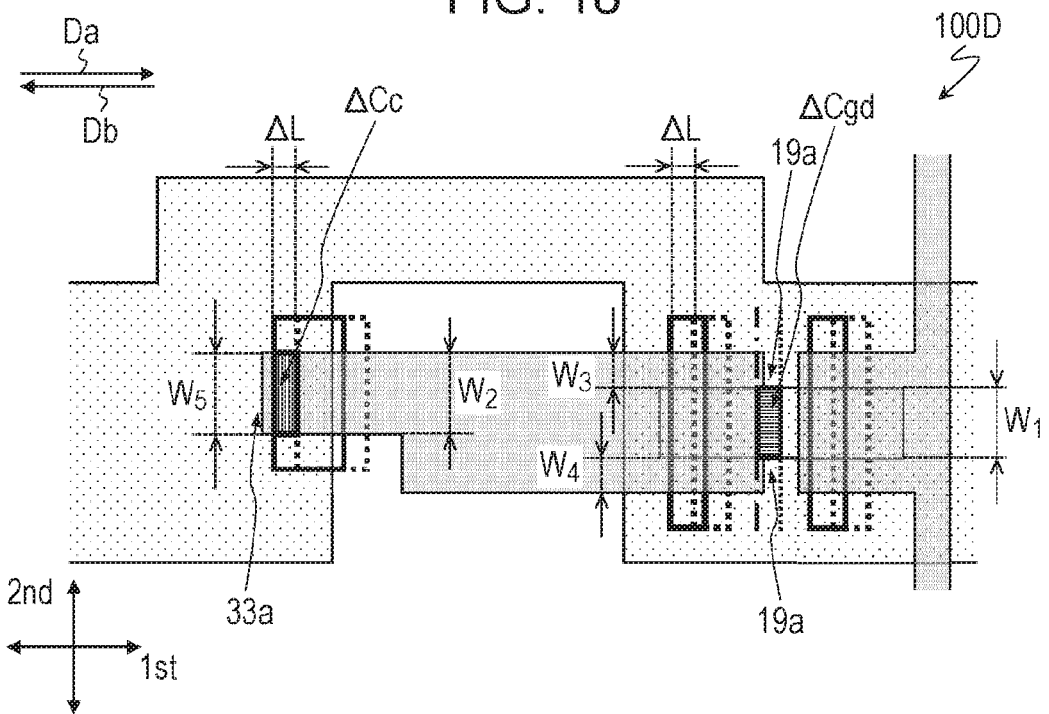
FIG. 18 is a plan view schematically showing the TFT substrate 100D, and shows a misalignment (a shift from the state of FIG. 17) between the protective insulating layer 15 and the first conductive layer 12.

With reference to FIG. 17 and FIG. 18, a description will be given of a TFT substrate 100D of the present embodiment. FIG. 17 and FIG. 18 are plan views schematically showing the TFT substrate 100D. FIG. 18 schematically shows a misalignment (a shift from the state of FIG. 17) between the protective insulating layer 15 and the first conductive layer 12. A description will be given below mainly of the difference between the TFT substrate 100D and the TFT substrate 100A in Embodiment 1.

The TFT substrate 100D is different from the TFT substrate 100A in shapes of the first electrode unit 12*a* and the second electrode unit 16*a*. In the TFT substrate 100A, W2>W5, while in the TFT substrate 100D, W2=W5.

The TFT substrate 100D having the compensation capacitance unit 30 makes it possible to suppress changes in the parasitic capacitance formed between the gate electrode 12*g* and the drain electrode 16*d* due to a misalignment occurring in the step of forming the protective insulating layer 15.

Also in the TFT substrate 100D, by adopting a design in which W5=W3+W4 is satisfied in the same manner as the TFT substrate 100A, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by changes in the compensation capacitance formed in the compensation capacitance unit 30.

Embodiment 5

Figure 19:
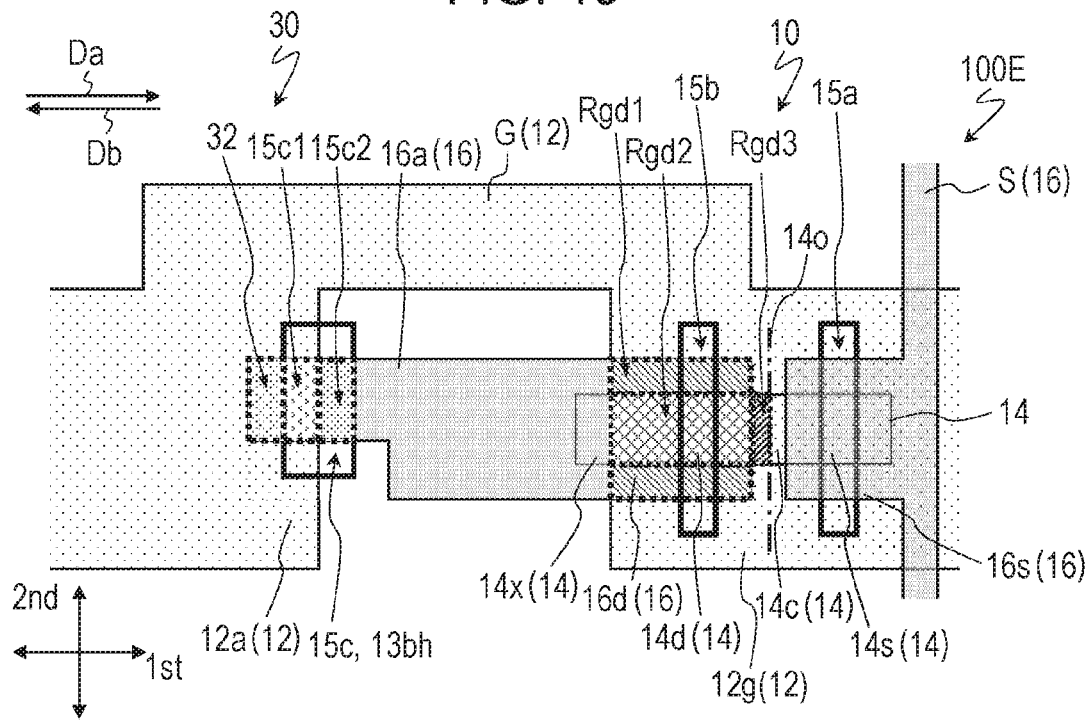
FIG. 19 is a plan view schematically showing a TFT substrate 100E according to an embodiment of the present invention.
Figure 20:
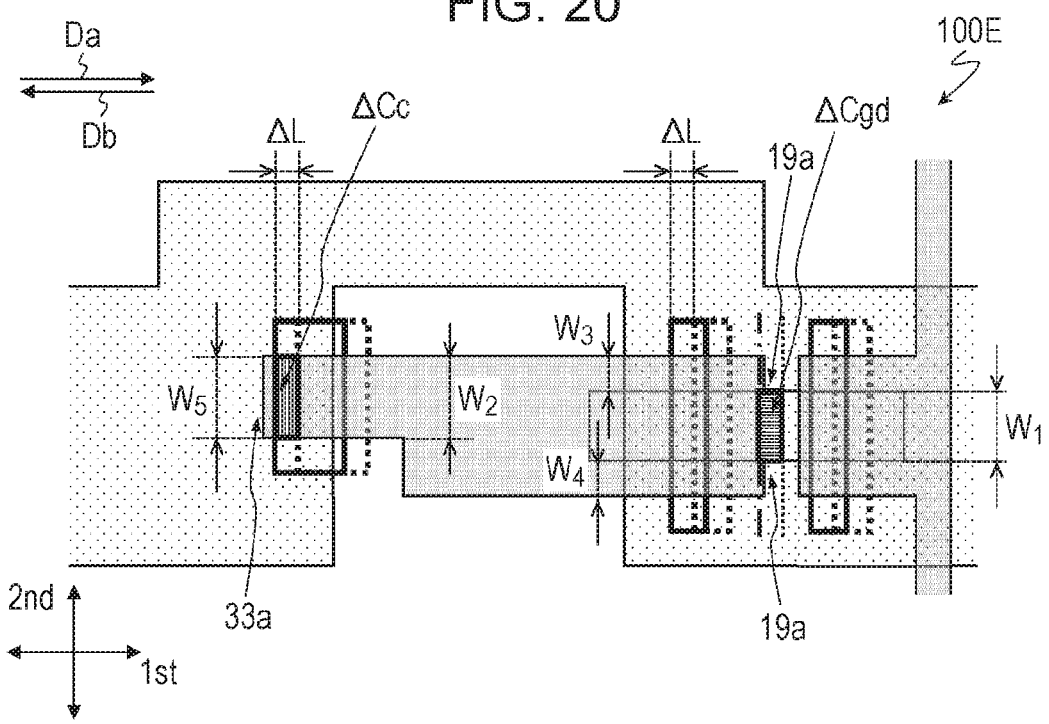
FIG. 20 is a plan view schematically showing the TFT substrate 100E, and shows a misalignment (a shift from the state of FIG. 19) between the protective insulating layer 15 and the first conductive layer 12.

With reference to FIG. 19 and FIG. 20, a description will be given of a TFT substrate 100E of the present embodiment. FIG. 19 and FIG. 20 are plan views schematically showing the TFT substrate 100E. FIG. 20 schematically shows a misalignment (a shift from the state of FIG. 19) between the protective insulating layer 15 and the first conductive layer 12. A description will be given below mainly of the difference between the TFT substrate 100E and the TFT substrate 100D in Embodiment 4.

The TFT substrate 100E is different from the TFT substrate 100D in the shape of the semiconductor layer 14. In the TFT substrate 100D, the semiconductor layer 14 is inside the gate electrode 12*g* when viewed from the normal direction of the substrate 1. In contrast, in the TFT substrate 100E, the semiconductor layer 14 has a portion which does not overlap the gate electrode 12*g* in the drain-side region. The semiconductor layer 14 includes the extended portion 14*x* extending from the drain region 14*d* across the edge of the gate electrode 12*g* on the drain electrode 16*d* side.

The TFT substrate 100E having the compensation capacitance unit 30 makes it possible to suppress changes in the parasitic capacitance formed between the gate electrode 12*g* and the drain electrode 16*d* due to a misalignment between the protective insulating layer 15 and the gate electrode 12*g*.

Also in the TFT substrate 100E, in the same manner as the TFT substrate 100D, by adopting a design in which W5=W3+W4 is satisfied, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by changes in the compensation capacitance formed in the compensation capacitance unit 30.

Furthermore, the TFT substrate 100E having the extended portion 14x makes it possible to suppress changes in the parasitic capacitance formed between the gate electrode 12g and the drain electrode 16d due to a misalignment between the semiconductor layer 14 and the first conductive layer 12. In the TFT substrate 100E, even if a misalignment occurs between the semiconductor layer 14 and the first conductive layer 12, the areas of the first region Rgd1, the second region Rgd2, and the third region Rgd3 do not change. Accordingly, the parasitic capacitance between the gate electrode 12g and the drain electrode 16d formed in these regions does not change.

Embodiment 6

Figure 21:
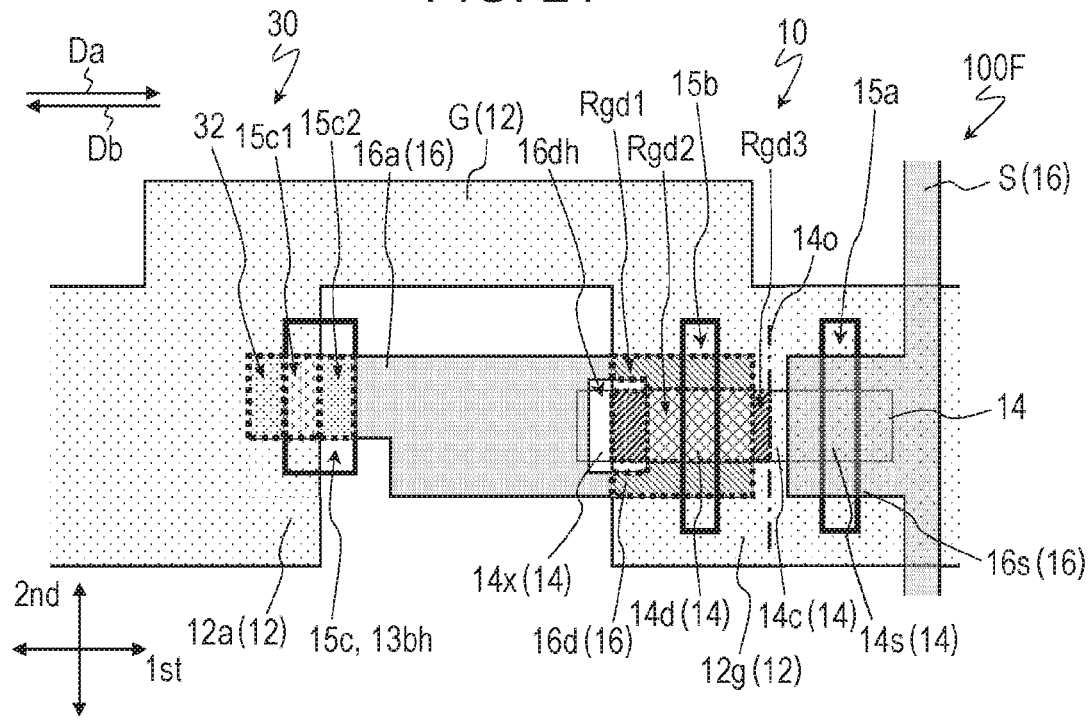
FIG. 21 is a plan view schematically showing a TFT substrate 100F according to an embodiment of the present invention.
Figure 22:
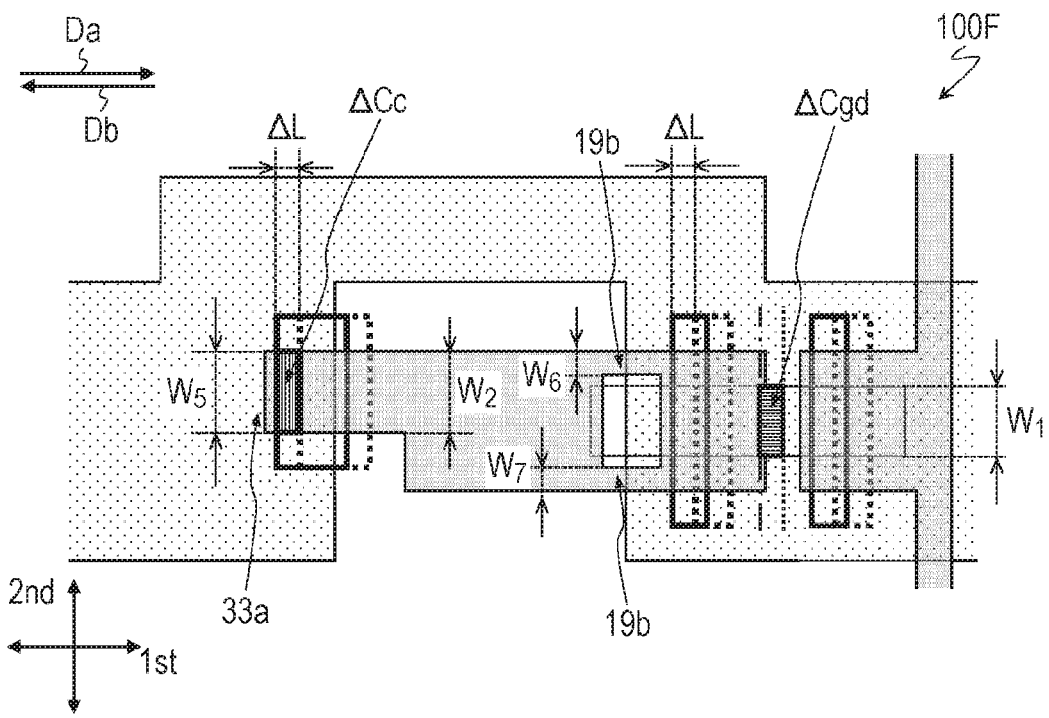
FIG. 22 is a plan view schematically showing the TFT substrate 100F, and shows a misalignment (a shift from the state of FIG. 21) between the protective insulating layer 15 and the first conductive layer 12.

With reference to FIG. 21 and FIG. 22, a description will be given of a TFT substrate 100F of the present embodiment. FIG. 21 and FIG. 22 are plan views schematically showing the TFT substrate 100F. FIG. 22 schematically shows a misalignment (a shift from the state of FIG. 21) between the protective insulating layer 15 and the first conductive layer 12. A description will be given below mainly of differences from the TFT substrate 100E in Embodiment 5.

The TFT substrate 100F is different from the TFT substrate 100E in the shapes of the drain electrode 16d and the second electrode unit 16a. The TFT substrate 100F is different from the TFT substrate 100E in that the drain electrode 16d has a fifth opening portion 16dh crossing the edge of the gate electrode 12g on the drain electrode 16d side.

In the TFT substrate 100E, the portion of the semiconductor layer 14 on the drain electrode 16d side from the edge of the drain electrode 16d on the source electrode 16s side is entirely overlapped with the drain electrode 16d and/or the second electrode unit 16a which is formed integrally with the drain electrode 16d. On the other hand, in the TFT substrate 100F, the edge of the fifth opening portion 16dh of the drain electrode 16d crosses the semiconductor layer 14 between the second opening portion 15b and the edge of the gate electrode 12g on the drain electrode 16d side.

In the TFT substrate 100E, the end of the second region Rgd2 on the drain electrode 16d side out of the end on the source electrode 16s side and the end on the drain electrode 16d side are defined by the edge of the gate electrode 12g on the drain electrode 16d side. In contrast, in the TFT substrate 100F, the end of the second region Rgd2 on the drain electrode 16d side is defined by the edge of the fifth opening portion 16dh of the drain electrode 16d. In the TFT substrate 100E, it is possible to form the third region Rgd3 only on the source electrode 16s side of the second region Rgd2, while, in the TFT substrate 100F, it is possible to form the third region Rgd3 on the source electrode 16s side and the drain electrode 16d side of the second region Rgd2.

The TFT substrate 100F having the compensation capacitance unit 30 makes it possible to suppress changes in the parasitic capacitance formed between the gate electrode 12g and the drain electrode 16d due to a misalignment between the protective insulating layer 15 and the gate electrode 12g.

In the TFT substrate 100F, by adopting a design in which W5=W6+W7 is satisfied as shown in FIG. 22, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 when the TFT is off and on are compensated for by changes in compensation capacitance formed in the compensation capacitance unit 30. In the present embodiment, Wa corresponds to W6+W7, and Wb corresponds to W5.

In the TFT substrate 100F, the TFT 10 has the eighth region 19b adjacent to the first region Rgd1 in the direction Db from the first opening portion 15a to the second opening portion 15b and which overlaps the drain electrode 16d and does not overlap the semiconductor layer 14 and the gate electrode 12g. W6+W7 is the length of a portion of the first region Rgd1 adjacent to the eighth region 19b in the second direction.

Furthermore, in the TFT substrate 100F, even if a misalignment occurs in the channel length direction between the second conductive layer 16 and the first conductive layer 12, the areas of the second region Rgd2 and the third region Rgd3 do not change. Accordingly, in the changes in the parasitic capacitance between the gate and the drain due to a misalignment in the channel length direction between the second conductive layer 16 and the first conductive layer 12, the parasitic capacitance between the gate and drain formed in the second region Rgd2 and the third region Rgd3 also does not change.

Embodiment 7

Figure 23:
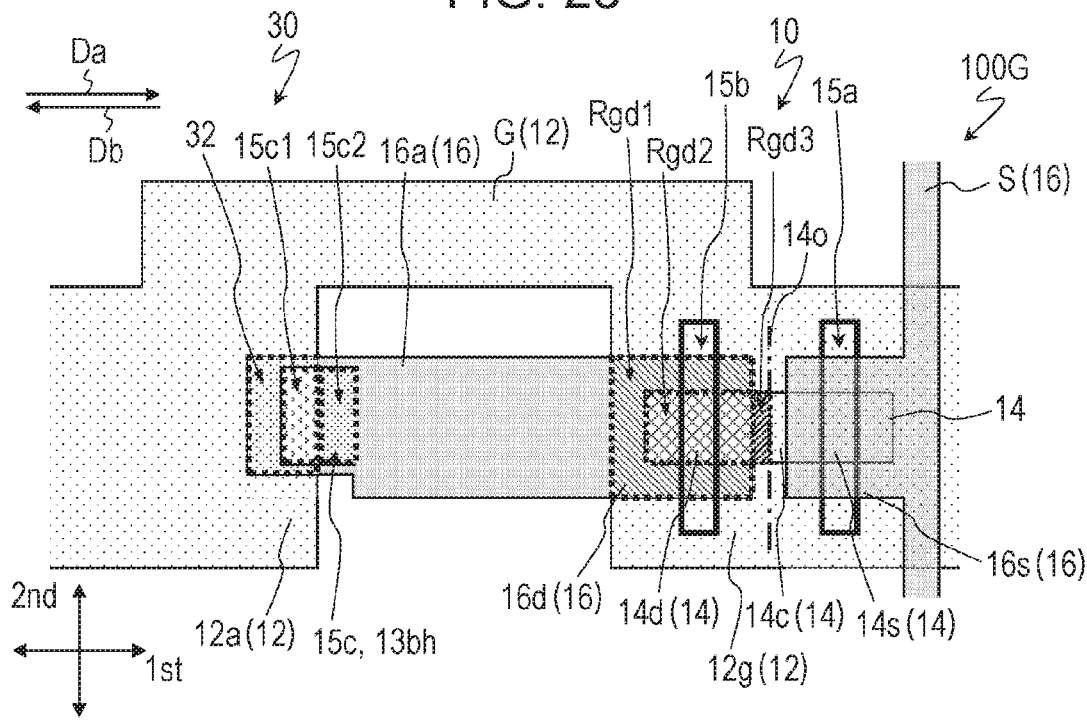
FIG. 23 is a plan view schematically showing a TFT substrate 100G according to an embodiment of the present invention.
Figure 24:
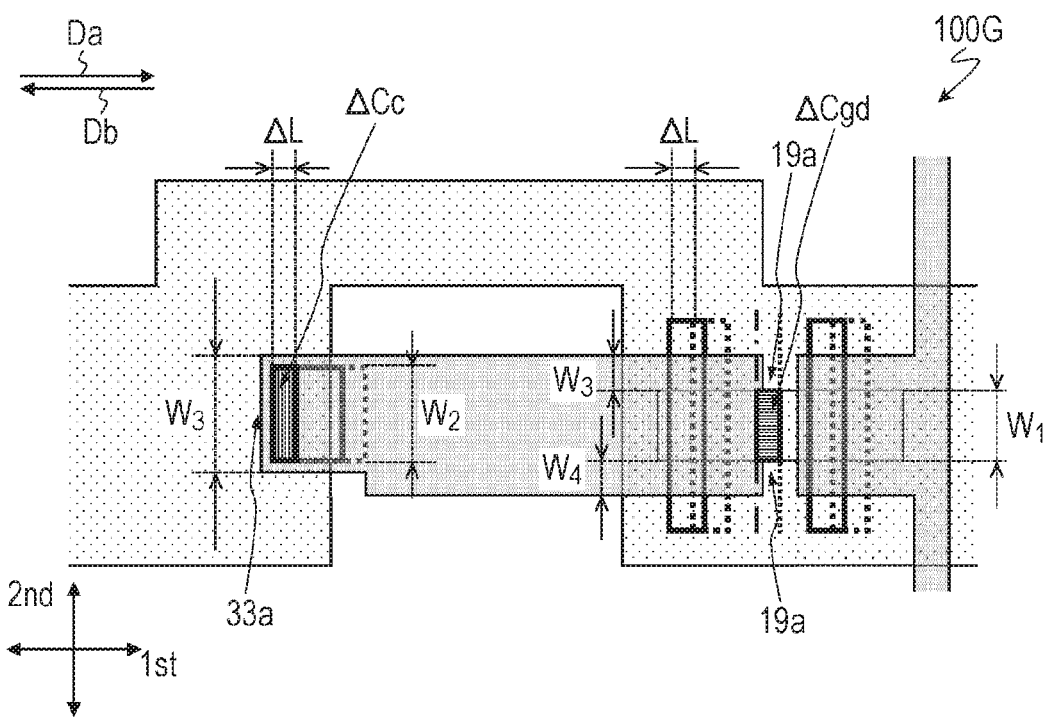
FIG. 24 is a plan view schematically showing the TFT substrate 100G, and shows a misalignment (a shift from the state of FIG. 23) between the protective insulating layer 15 and the first conductive layer 12.

With reference to FIG. 23 and FIG. 24, a description will be given of a TFT substrate 100G of the present embodiment. FIG. 23 and FIG. 24 are plan views schematically showing the TFT substrate 100G. FIG. 24 schematically shows a misalignment (a shift from the state of FIG. 23) between the protective insulating layer 15 and the first conductive layer 12. A description will be given below mainly of the difference between the TFT substrate 100G and the TFT substrate 100A in Embodiment 1.

The TFT substrate 100G is different from the TFT substrate 100A in that the third opening portion 15c is inside the second electrode unit 16a when viewed from the normal direction of the substrate 1. Due to this, in the TFT substrate 100A, W2>W5, while in the TFT substrate 100G, W2<W5.

The TFT substrate 100G having the compensation capacitance unit 30 makes it possible to suppress changes in the parasitic capacitance formed between the gate electrode 12g and the drain electrode 16d due to a misalignment occurring in the step of forming the protective insulating layer 15.

Also in the TFT substrate 100G, by adopting a design in which W5=W3+W4 is satisfied in the same manner as the TFT substrate 100A, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by the change in the compensation capacitance formed in the compensation capacitance unit 30.

Embodiment 8

Figure 25:
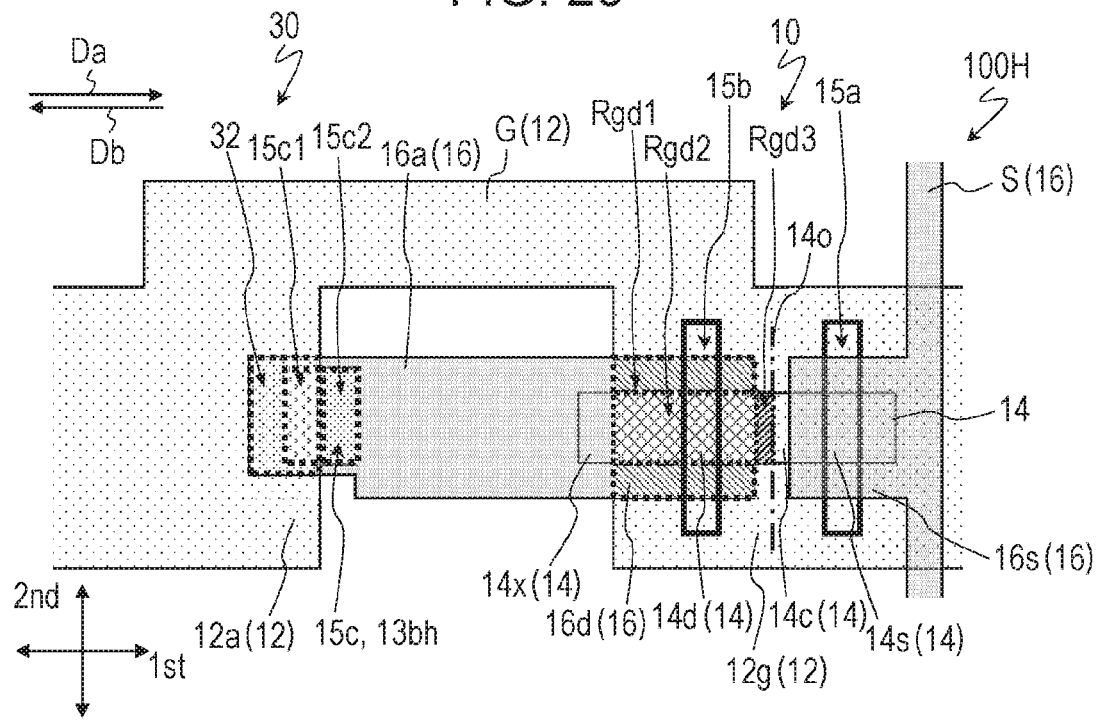
FIG. 25 is a plan view schematically showing a TFT substrate 100H according to an embodiment of the present invention.
Figure 26:
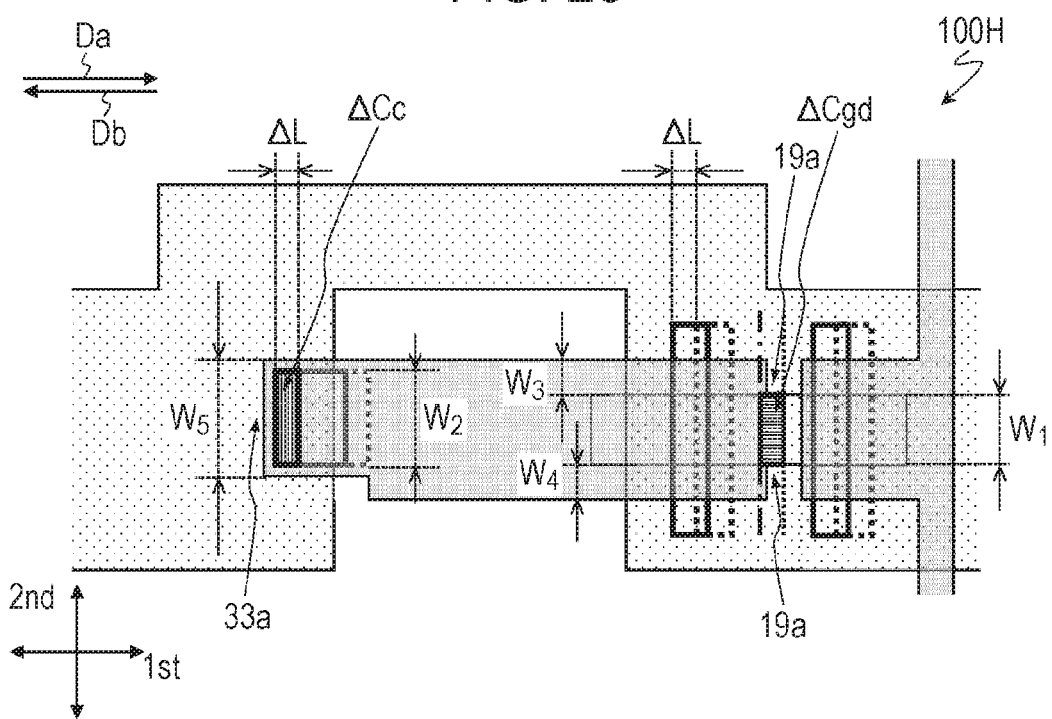
FIG. 26 is a plan view schematically showing the TFT substrate 100H, and shows a misalignment (a shift from the state of FIG. 25) between the protective insulating layer 15 and the first conductive layer 12.

With reference to FIG. 25 and FIG. 26, a description will be given of a TFT substrate 100H of the present embodiment. FIG. 25 and FIG. 26 are plan views schematically showing the TFT substrate 100H. FIG. 26 schematically shows a misalignment (a shift from the state of FIG. 25)

between the protective insulating layer 15 and the first conductive layer 12. A description will be given below mainly of the difference between the TFT substrate 100H and the TFT substrate 100G in Embodiment 7.

The TFT substrate 100H is different from the TFT substrate 100G in the shape of the semiconductor layer 14. In the TFT substrate 100G, the semiconductor layer 14 is inside the gate electrode 12g when viewed from the normal direction of the substrate 1. In contrast, in the TFT substrate 100H, the semiconductor layer 14 has a portion which does not overlap the gate electrode 12g in the drain-side region. The semiconductor layer 14 includes the extended portion 14x extending from the drain region 14d across the edge of the gate electrode 12g on the drain electrode 16d side.

The TFT substrate 100H having the compensation capacitance unit 30 makes it possible to suppress changes in the parasitic capacitance formed between the gate electrode 12g and the drain electrode 16d due to a misalignment between the protective insulating layer 15 and the gate electrode 12g.

Designing the TFT substrate 100H such that W5=W3+W4 is satisfied in the same manner as the TFT substrate 100G means that, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by changes in the compensation capacitance formed in the compensation capacitance unit 30.

Furthermore, the TFT substrate 100H having the extended portion 14x makes it possible to suppress changes in the parasitic capacitance formed between the gate electrode 12g and the drain electrode 16d due to a misalignment between the semiconductor layer 14 and the first conductive layer 12. In the TFT substrate 100H, even if a misalignment occurs between the semiconductor layer 14 and the first conductive layer 12, the areas of the first region Rgd1, the second region Rgd2, and the third region Rgd3 do not change. Accordingly, the parasitic capacitance between the gate electrode 12g and the drain electrode 16d formed in these regions does not change.

Embodiment 9

Figure 27:
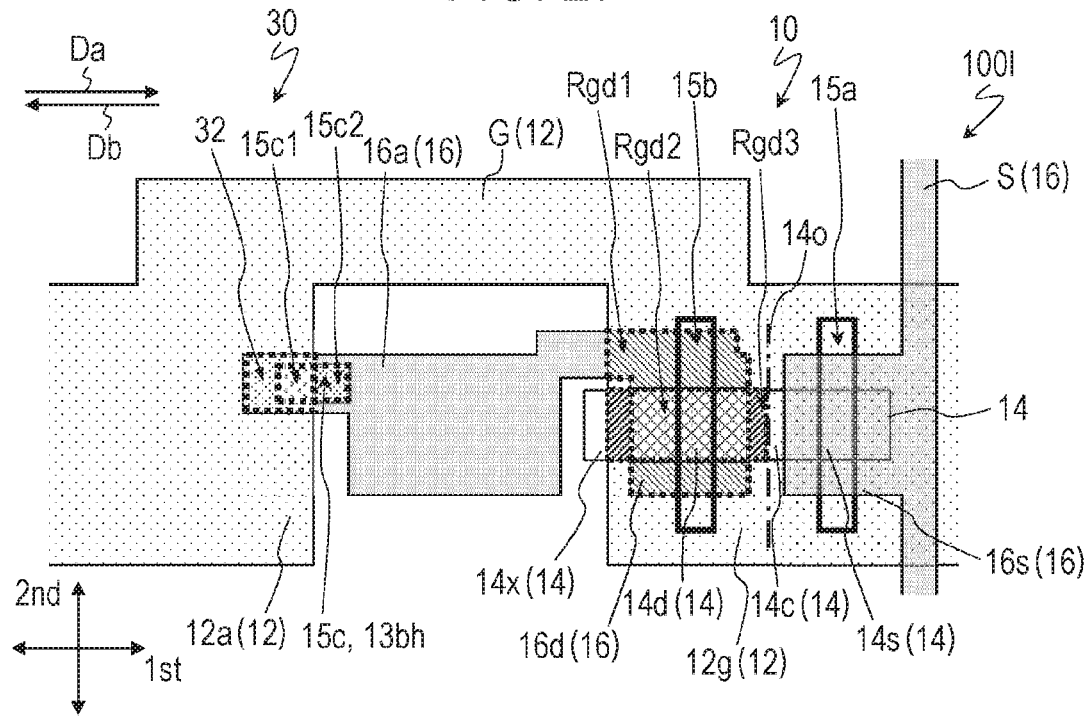
FIG. 27 is a plan view schematically showing a TFT substrate 100I according to an embodiment of the present invention.
Figure 28:
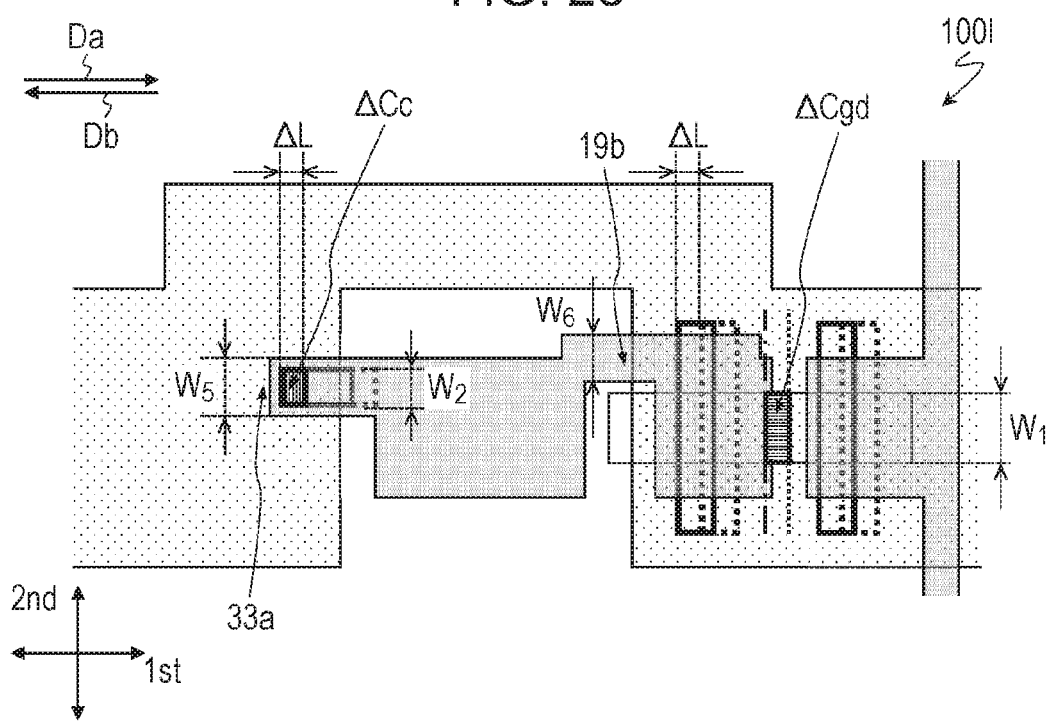
FIG. 28 is a plan view schematically showing the TFT substrate 100I, and shows a misalignment (a shift from the state of FIG. 27) between the protective insulating layer 15 and the first conductive layer 12.

With reference to FIG. 27 and FIG. 28, a description will be given of a TFT substrate 100I of the present embodiment. FIG. 27 and FIG. 28 are plan views schematically showing the TFT substrate 100I. FIG. 28 schematically shows a misalignment (a shift from the state of FIG. 27) between the protective insulating layer 15 and the first conductive layer 12. A description will be given below mainly of the differences from the TFT substrate 100H in Embodiment 8.

The TFT substrate 100I is different from the TFT substrate 100H in the shapes of the drain electrode 16d and the second electrode unit 16a.

In the TFT substrate 100H, the portion of the semiconductor layer 14 on the drain electrode 16d side from the edge of the drain electrode 16d on the source electrode 16s side is entirely overlapped with the drain electrode 16d and/or the second electrode unit 16a which is formed integrally with the drain electrode 16d. In contrast, in the TFT substrate 100I, the edge of the drain electrode 16d crosses the semiconductor layer 14 between the second opening portion 15b and the edge of the gate electrode 12g on the drain electrode 16d side.

In the TFT substrate 100H, the end of the second region Rgd2 on the drain electrode 16d side out of the end on the source electrode 16s side and the end on the drain electrode 16d side is defined by the edge of the gate electrode 12g on the drain electrode 16d side. In contrast, in the TFT substrate 100I, the end of the second region Rgd2 on the drain electrode 16d side is defined by the edge of the drain electrode 16d. In the TFT substrate 100H, it is possible to form the third region Rgd3 only on the source electrode 16s side of the second region Rgd2, while, in the TFT substrate 100I, it is possible to form the third region Rgd3 on the source electrode 16s side and the drain electrode 16d side of the second region Rgd2.

The TFT substrate 100I having the compensation capacitance unit 30 makes it possible to suppress changes in the parasitic capacitance formed between the gate electrode 12g and the drain electrode 16d due to a misalignment between the protective insulating layer 15 and the gate electrode 12g.

In the TFT substrate 100I, as shown in FIG. 28, by adopting a design in which W5=W6 is satisfied, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 when the TFT is off and on are compensated for by changes in the compensation capacitance formed in the compensation capacitance unit 30. In the present embodiment, Wa corresponds to W6 and Wb corresponds to W5.

As shown in FIG. 28, the TFT 10 has the eighth region 19b adjacent to the first region Rgd1 in the direction Db from the first opening portion 15a to the second opening portion 15b and which overlaps the drain electrode 16d, and does not overlap the semiconductor layer 14 and the gate electrode 12g. W6 is a length of a portion of the first region Rgd1 adjacent to the eighth region 19b in the second direction.

Furthermore, in the TFT substrate 100I, even if a misalignment occurs in the channel length direction between the second conductive layer 16 and the first conductive layer 12, the areas of the second region Rgd2 and the third region Rgd3 do not change. Accordingly, in the changes in the parasitic capacitance between the gate and the drain due to a misalignment in the channel length direction between the second conductive layer 16 and the first conductive layer 12, the parasitic capacitance between the gate and drain formed in the second region Rgd2 and the third region Rgd3 also does not change.

Embodiment 10

Figure 29:
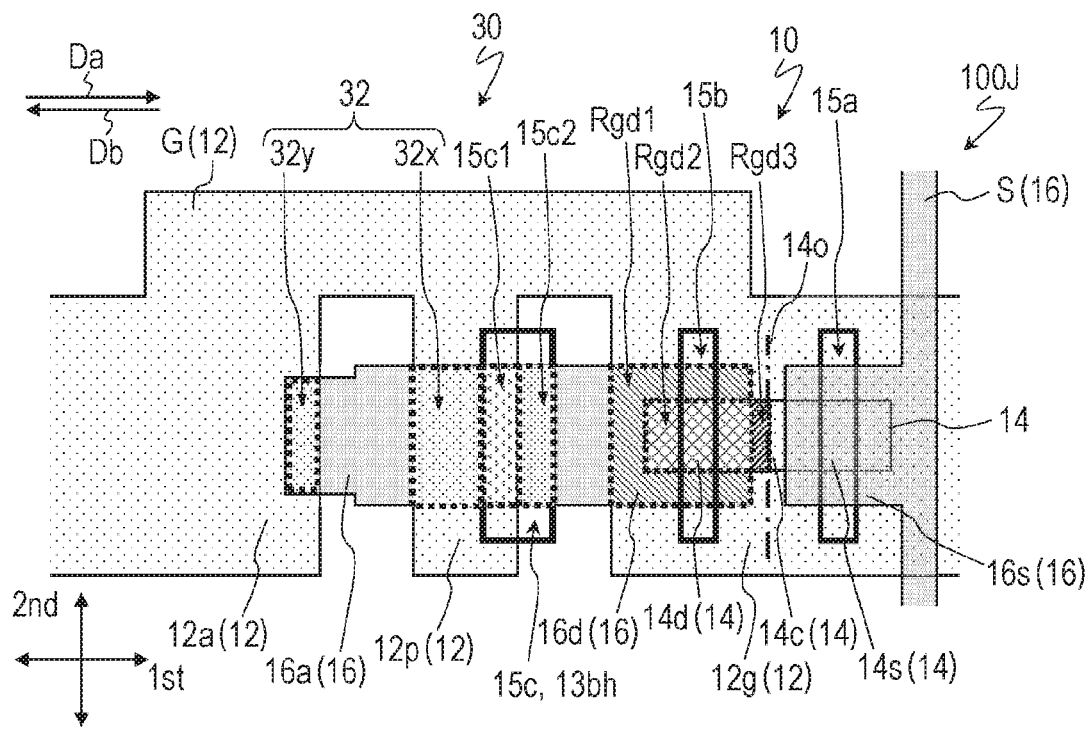
FIG. 29 is a plan view schematically showing a TFT substrate 100J according to an embodiment of the present invention.
Figure 30:
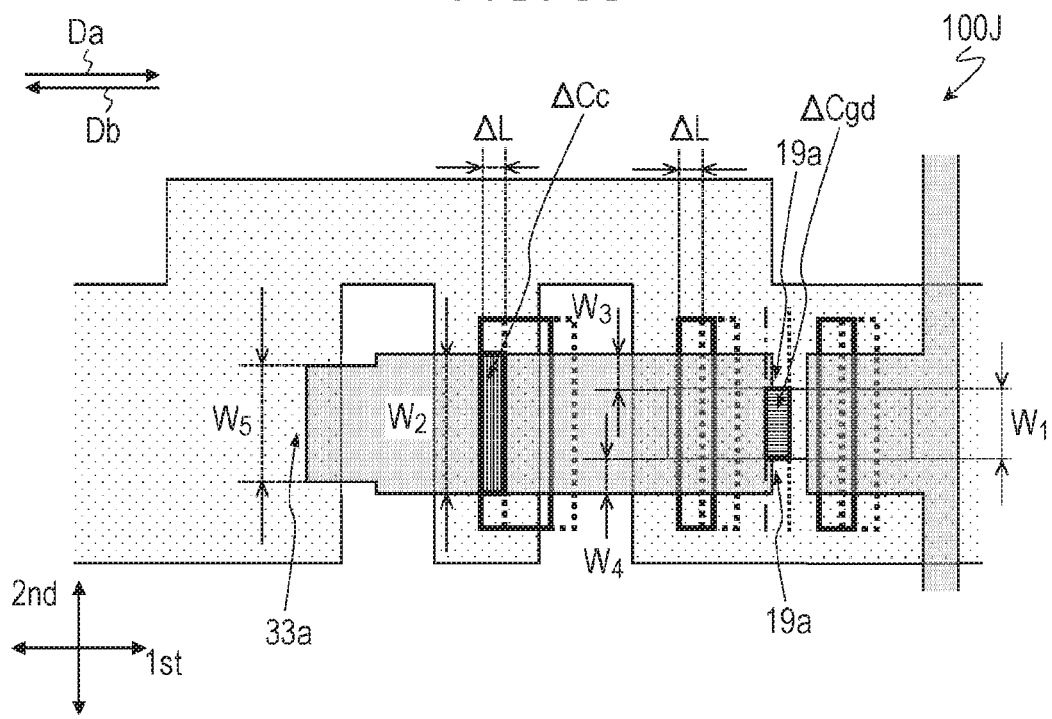
FIG. 30 is a plan view schematically showing the TFT substrate 100J, and shows a misalignment (a shift from the state of FIG. 29) between the protective insulating layer 15 and the first conductive layer 12.

With reference to FIG. 29 and FIG. 30, a description will be given of a TFT substrate 100J of the present embodiment. FIG. 29 and FIG. 30 are plan views schematically showing the TFT substrate 100J. FIG. 30 schematically shows a misalignment (a shift from the state of FIG. 29) between the protective insulating layer 15 and the first conductive layer 12. A description will be given below mainly of the difference between the TFT substrate 100J and the TFT substrate 100A in Embodiment 1.

The TFT substrate 100J is different from the TFT substrate 100A in the shape of the first electrode unit 12a. The TFT substrate 100J is different from the TFT substrate 100A in that the fifth region 32 includes two separated portions.

In the TFT substrate 100J, the first electrode unit 12a includes a protruding portion 12p protruding from the gate bus line G to the second electrode unit 16a. The fifth region 32 includes a portion 32x in which the protruding portion 12p and the second electrode unit 16a overlap each other and a portion 32y in the first electrode unit 12a in which the portion opposing the protruding portion 12p and the second electrode unit 16a overlap each other. In the TFT substrate 100J, the length W2 of the portion 32x of the fifth region 32 in the second direction is the length W5 or more of the portion 32y of the fifth region 32 in the second direction (W2≥W5).

The TFT substrate 100J having the compensation capacitance unit 30 makes it possible to suppress changes in the parasitic capacitance formed between the gate electrode 12g and the drain electrode 16d due to a misalignment occurring in the step of forming the protective insulating layer 15.

Also in the TFT substrate 100J, by adopting a design in which W5=W3+W4 is satisfied in the same manner as the TFT substrate 100A, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by the change in the compensation capacitance formed in the compensation capacitance unit 30.

Embodiment 11

Figure 31:
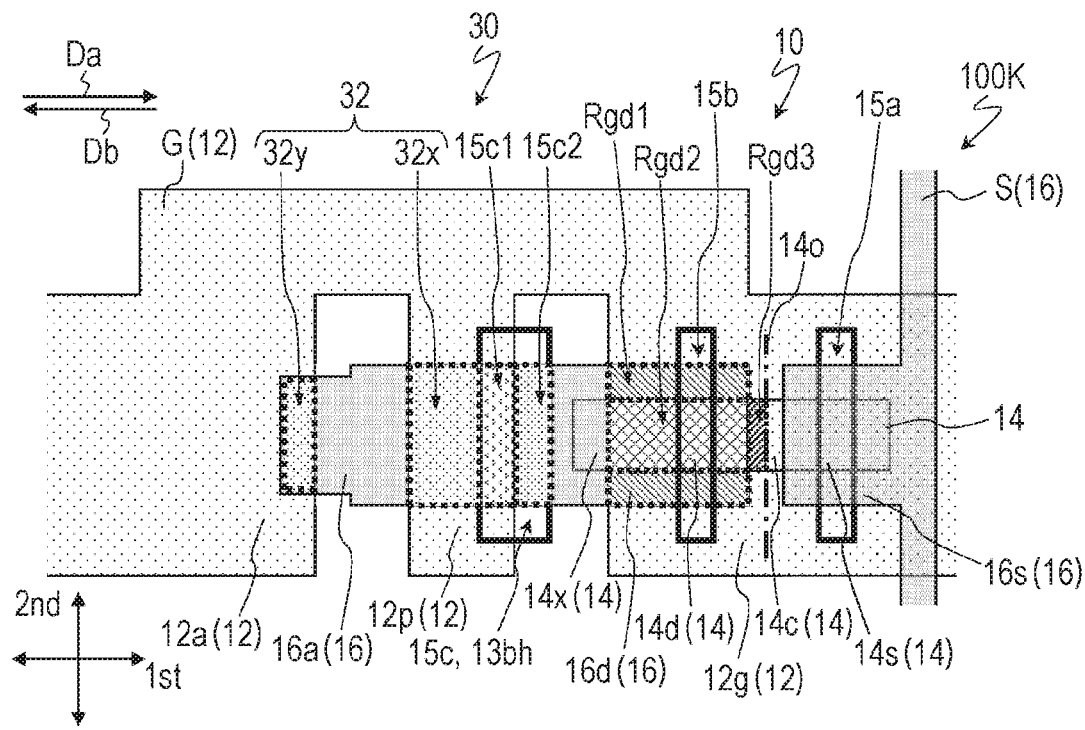
FIG. 31 is a plan view schematically showing a TFT substrate 100K according to an embodiment of the present invention.
Figure 32:
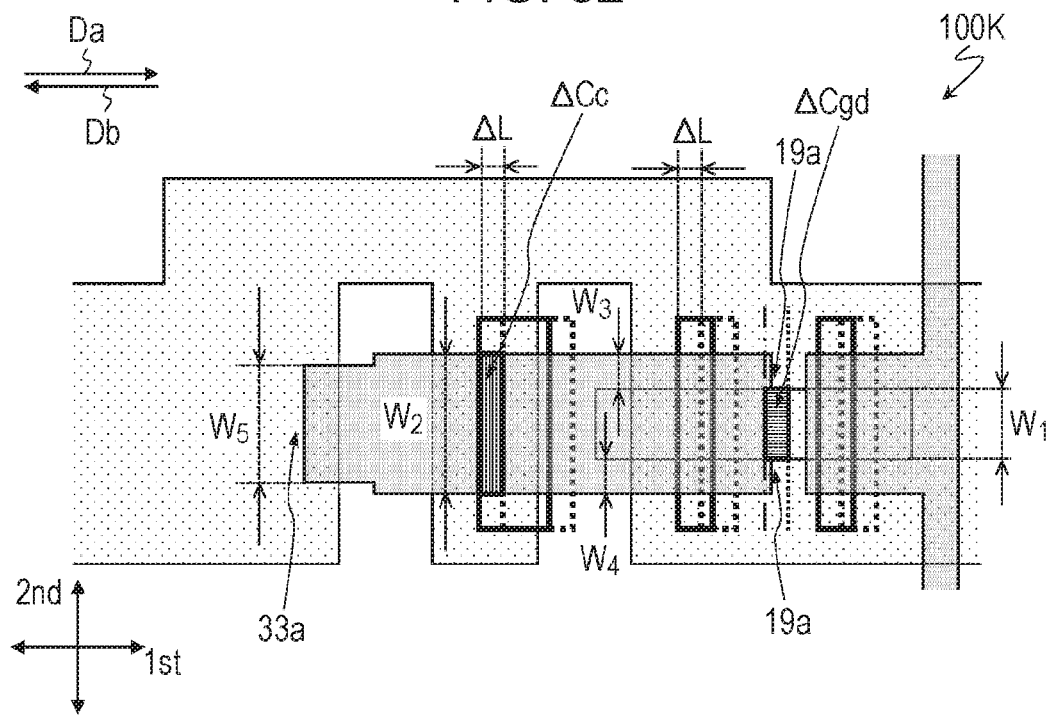
FIG. 32 is a plan view schematically showing the TFT substrate 100K, and shows a misalignment (a shift from the state of FIG. 31) between the protective insulating layer 15 and the first conductive layer 12.

With reference to FIG. 31 and FIG. 32, a description will be given of a TFT substrate 100K of the present embodiment. FIG. 31 and FIG. 32 are plan views schematically showing the TFT substrate 100K. FIG. 32 schematically shows a misalignment (a shift from the state of FIG. 31) between the protective insulating layer 15 and the first conductive layer 12. A description will be given below mainly of the difference between the TFT substrate 100K and the TFT substrate 100J in Embodiment 10.

The TFT substrate 100K is different from the TFT substrate 100J in the shape of the semiconductor layer 14. In the TFT substrate 100J, the semiconductor layer 14 is inside the gate electrode 12g when viewed from the normal line direction of the substrate 1. In contrast, in the TFT substrate 100K, the semiconductor layer 14 has a portion which does not overlap the gate electrode 12g in the drain-side region. The semiconductor layer 14 includes the extended portion 14x extending from the drain region 14d across the edge of the gate electrode 12g on the drain electrode 16d side.

The TFT substrate 100K having the compensation capacitance unit 30 makes it possible to suppress changes in the parasitic capacitance formed between the gate electrode 12g and the drain electrode 16d due to a misalignment between the protective insulating layer 15 and the gate electrode 12g.

In the TFT substrate 100K, by adopting a design in which W5=W3+W4 is satisfied in the same manner as the TFT substrate 100J, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by the change in the compensation capacitance formed in the compensation capacitance unit 30.

Furthermore, the TFT substrate 100K having the extended portion 14x makes it possible to suppress changes in the parasitic capacitance formed between the gate electrode 12g and the drain electrode 16d due to a misalignment between the semiconductor layer 14 and the first conductive layer 12.

In the TFT substrate 100K, the area of the first region Rgd1, the second region Rgd2, and the third region Rgd3 does not change even when a misalignment occurs between the semiconductor layer 14 and the first conductive layer 12. Accordingly, the parasitic capacitance between the gate electrode 12g and the drain electrode 16d formed in these regions does not change.

Embodiment 12

Figure 33:
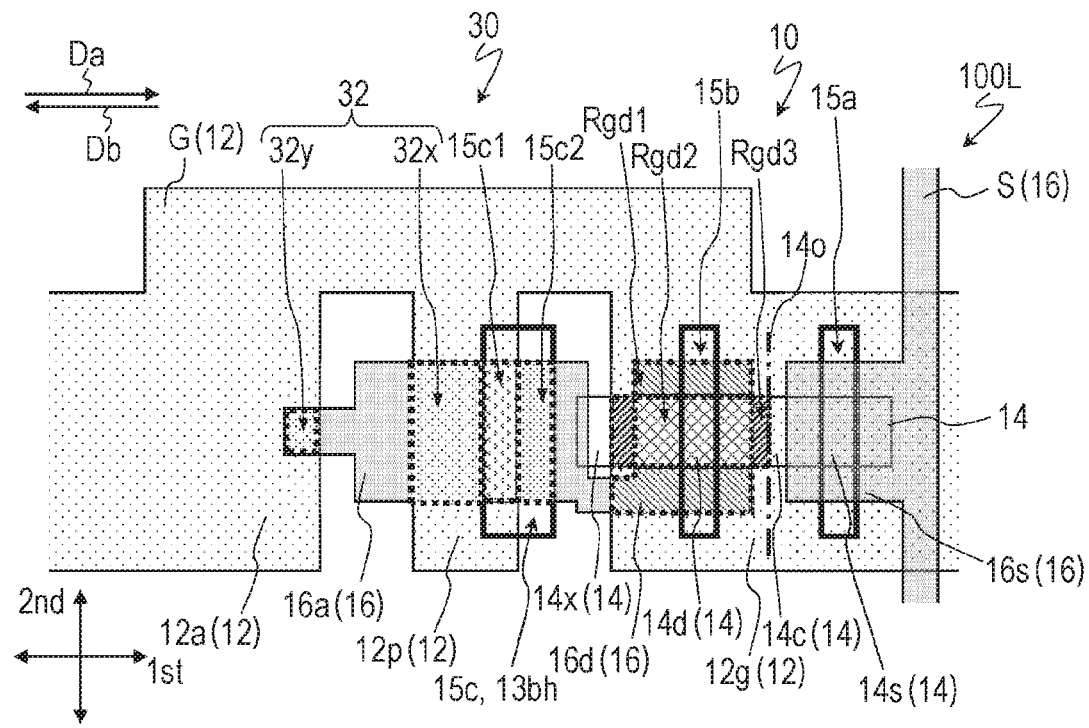
FIG. 33 is a plan view schematically showing a TFT substrate 100L according to an embodiment of the present invention.
Figure 34:
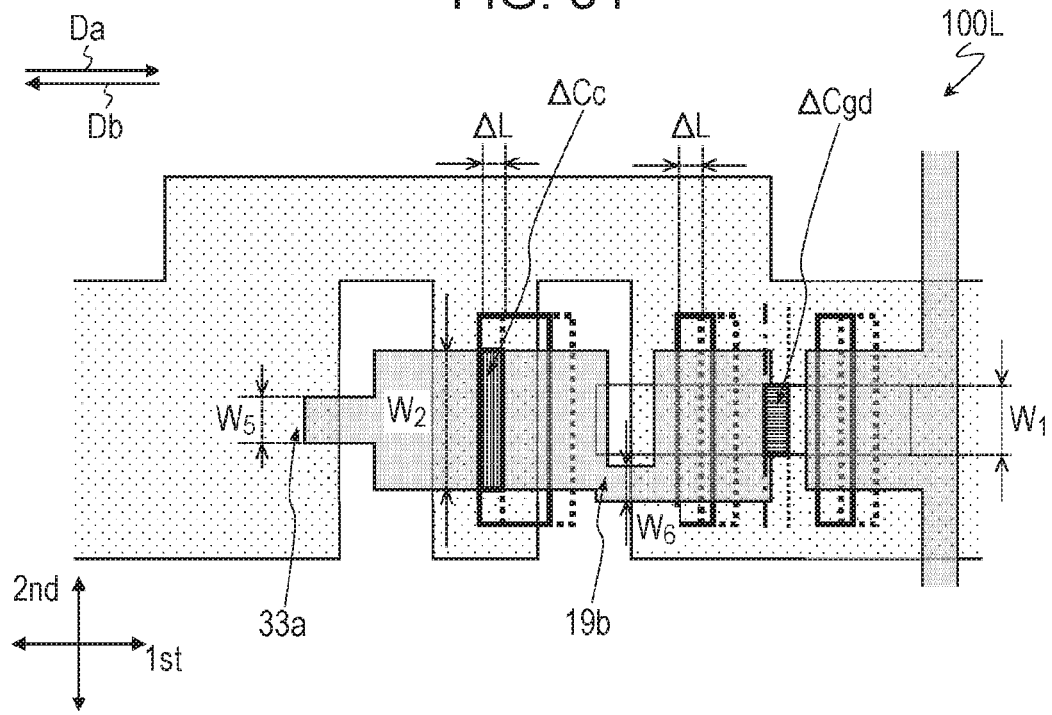
FIG. 34 is a plan view schematically showing the TFT substrate 100L, and shows a misalignment (a shift from the state of FIG. 33) between the protective insulating layer 15 and the first conductive layer 12.

With reference to FIG. 33 and FIG. 34, a description will be given of a TFT substrate 100L of the present embodiment. FIG. 33 and FIG. 34 are plan views schematically showing the TFT substrate 100L. FIG. 34 schematically shows a misalignment (a shift from the state of FIG. 33) between the protective insulating layer 15 and the first conductive layer 12. A description will be given below mainly of differences from the TFT substrate 100K in Embodiment 11.

The TFT substrate 100L is different from the TFT substrate 100K in the shapes of the drain electrode 16d and the second electrode unit 16a.

In the TFT substrate 100K, a portion of the semiconductor layer 14 on the drain electrode 16d side from the edge of the drain electrode 16d on the source electrode 16s side is entirely overlapped with the drain electrode 16d and/or the second electrode unit 16a formed integrally with the drain electrode 16d. In contrast, in the TFT substrate 100L, the edge of the drain electrode 16d crosses the semiconductor layer 14 between the second opening portion 15b and the edge of the gate electrode 12g on the drain electrode 16d side.

In the TFT substrate 100K, the end of the second region Rgd2 on the drain electrode 16d side out of the end on the source electrode 16s side and the end on the drain electrode 16d side is defined by the edge of the gate electrode 12g on the drain electrode 16d side. In contrast, in the TFT substrate 100L, the end of the second region Rgd2 on the drain electrode 16d side is defined by the edge of the drain electrode 16d. In the TFT substrate 100K, it is possible to form the third region Rgd3 only on the source electrode 16s side of the second region Rgd2, while in the TFT substrate 100L, it is possible to form the third region Rgd3 on the source electrode 16s side and the drain electrode 16d side of the second region Rgd2.

The TFT substrate 100L having the compensation capacitance unit 30 makes it possible to suppress changes in the parasitic capacitance formed between the gate electrode 12g and the drain electrode 16d due to a misalignment between the protective insulating layer 15 and the gate electrode 12g.

Designing the TFT substrate 100L such that W5=W6 is satisfied as shown in FIG. 34 means that, in the changes in the parasitic capacitance between the gate and the drain due to a misalignment in the channel length direction between the second conductive layer 16 and the first conductive layer 12, a change in the parasitic capacitance (electrostatic capacitance value: Cgd1) between the gate and the drain formed in the first region Rgd1 when the TFT is off and on is compensated for by changes in the compensation capacitance formed in the compensation capacitance unit 30. In the present embodiment, Wa corresponds to W6 and Wb corresponds to W5.

As shown in FIG. 34, the TFT 10 has the eighth region 19b adjacent to the first region Rgd1 in the direction Db from the first opening portion 15a to the second opening portion 15b and which overlaps the drain electrode 16d and which does not overlap the semiconductor layer 14 and the gate electrode 12g. W6 is the length of a portion of the first region Rgd1 adjacent to the eighth region 19b in the second direction.

Furthermore, in the TFT substrate 100L, even if a misalignment occurs in the channel length direction between the second conductive layer 16 and the first conductive layer 12, the areas of the second region Rgd2 and the third region Rgd3 do not change. Accordingly, in the changes in the parasitic capacitance between the gate and the drain due to a misalignment in the channel length direction between the second conductive layer 16 and the first conductive layer 12, the parasitic capacitance between the gate and drain in the second region Rgd2 and the third region Rgd3 also does not change.

Embodiment 13

Figure 35:
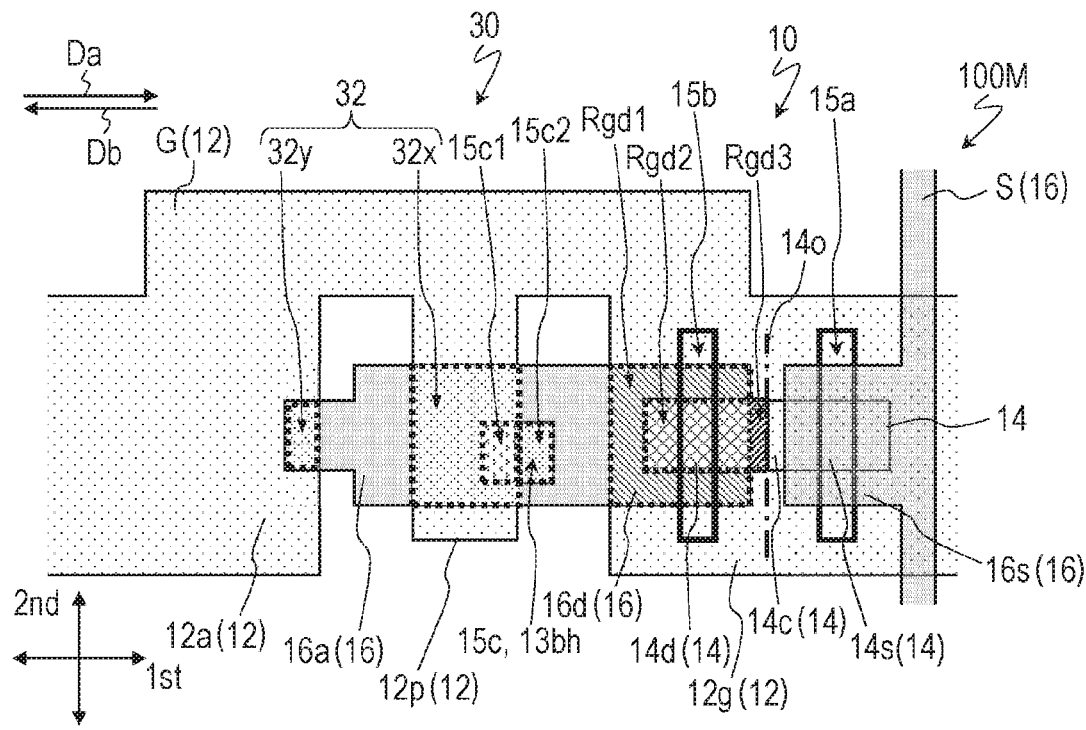
FIG. 35 is a plan view schematically showing a TFT substrate 100M according to an embodiment of the present invention.
Figure 36:
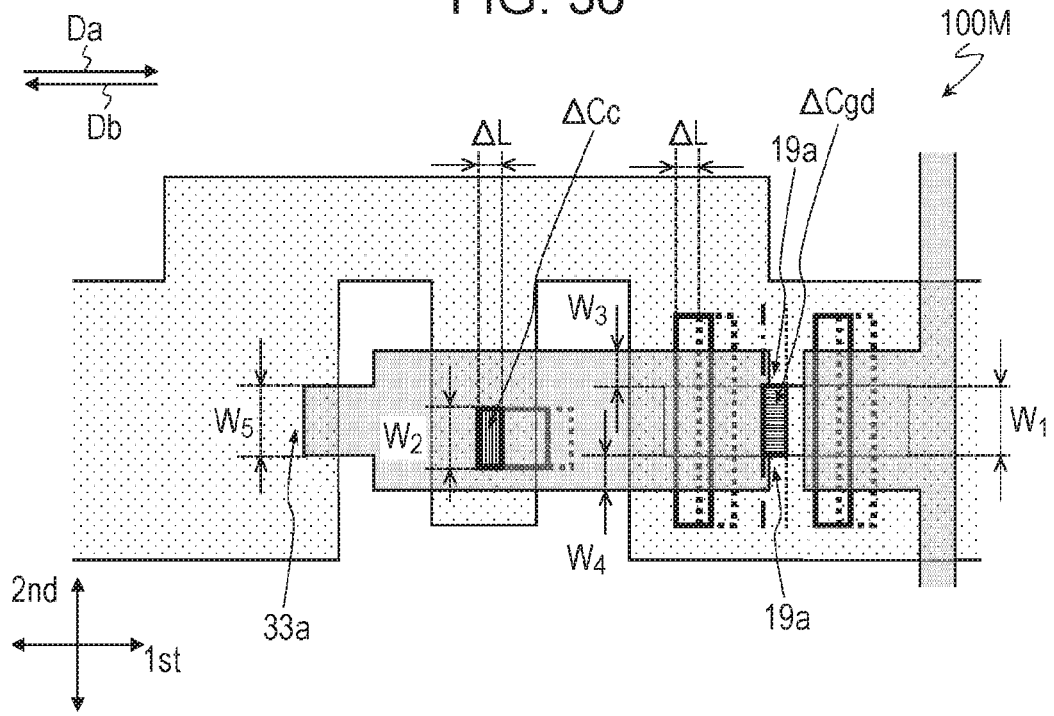
FIG. 36 is a plan view schematically showing the TFT substrate 100M, and shows a misalignment (a shift from the state of FIG. 35) between the protective insulating layer 15 and the first conductive layer 12.

With reference to FIG. 35 and FIG. 36, a description will be given of a TFT substrate 100M of the present embodiment. FIG. 35 and FIG. 36 are plan views schematically showing the TFT substrate 100M. FIG. 36 schematically shows a misalignment (a shift from the state of FIG. 35) between the protective insulating layer 15 and the first conductive layer 12. A description will be given below mainly of the difference between the TFT substrate 100M and the TFT substrate 100J in Embodiment 10.

The TFT substrate 100M is different from the TFT substrate 100J in the shape of the second electrode unit 16a. In the TFT substrate 100J, W2 W5, while in the TFT substrate 100M, W2 W5.

The TFT substrate 100M having the compensation capacitance unit 30 makes it possible to suppress changes in the parasitic capacitance formed between the gate electrode 12g and the drain electrode 16d due to a misalignment occurring in the step of forming the protective insulating layer 15.

In the TFT substrate 100M, by adopting a design in which W5=W3+W4 is satisfied in the same manner as the TFT substrate 100J, in the changes in the parasitic capacitance between the gate and the drain due to a misalignment in the channel length direction between the second conductive layer 16 and the first conductive layer 12, the changes in the parasitic capacitance (electrostatic capacitance value: Cgd1) between the gate and the drain formed in the first region Rgd1 are compensated for by changes in the compensation capacitance formed in the compensation capacitance unit 30.

Embodiment 14

Figure 37:
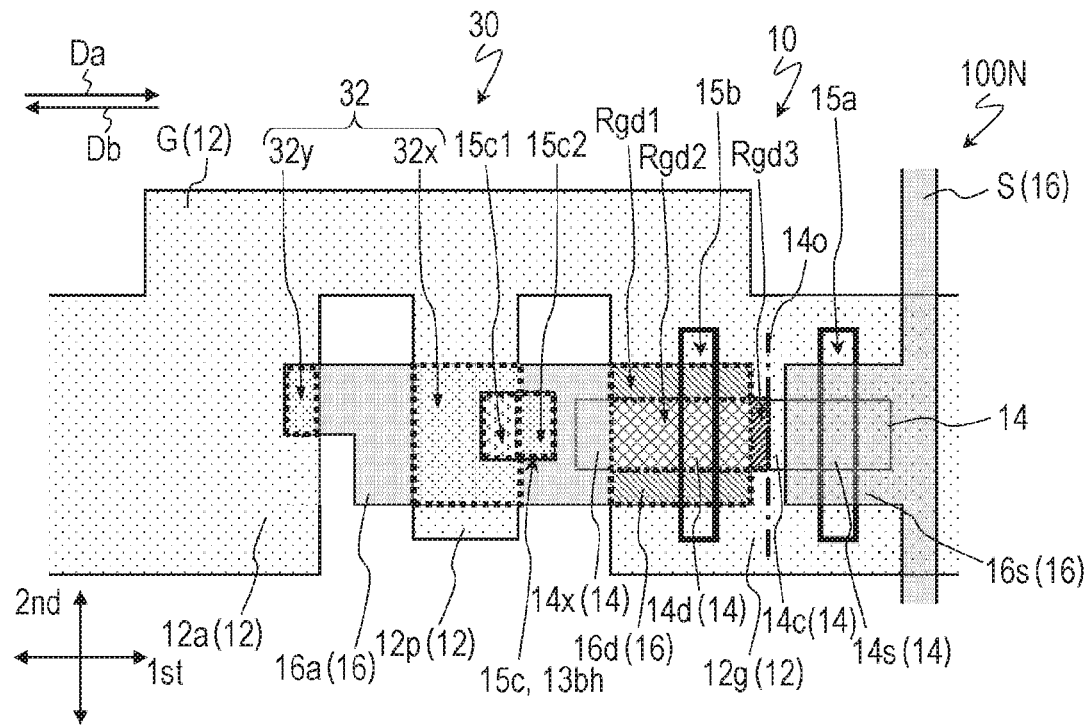
FIG. 37 is a plan view schematically showing a TFT substrate 100N according to an embodiment of the present invention.
Figure 38:
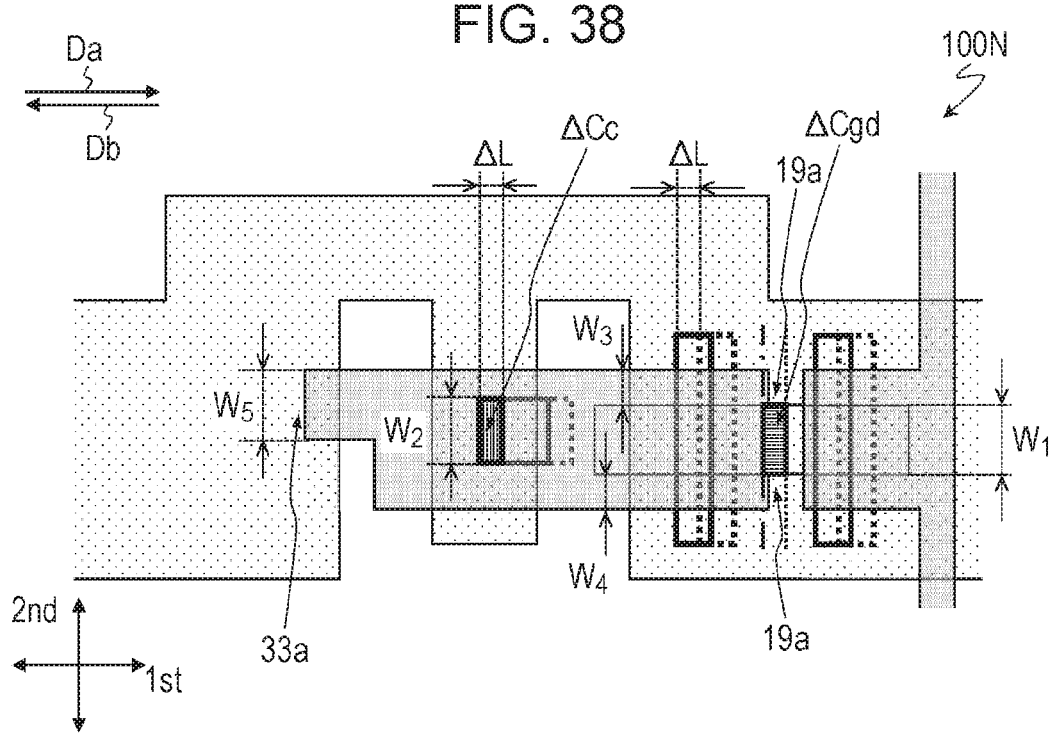
FIG. 38 is a plan view schematically showing the TFT substrate 100N, and shows a misalignment (a shift from the state of FIG. 37) between the protective insulating layer 15 and the first conductive layer 12.

With reference to FIG. 37 and FIG. 38, a description will be given of a TFT substrate 100N of the present embodiment. FIG. 37 and FIG. 38 are plan views schematically showing the TFT substrate 100N. FIG. 38 schematically shows a misalignment (a shift from the state of FIG. 37) between the protective insulating layer 15 and the first conductive layer 12. A description will be given below mainly of the difference between the TFT substrate 100N and the TFT substrate 100M in Embodiment 13.

The TFT substrate 100N is different from the TFT substrate 100M in the shape of the semiconductor layer 14. In the TFT substrate 100M, the semiconductor layer 14 is inside the gate electrode 12g when viewed from the normal direction of the substrate 1. In contrast, in the TFT substrate 100N, the semiconductor layer 14 has a portion which does not overlap the gate electrode 12g in the drain-side region. The semiconductor layer 14 includes the extended portion 14x extending from the drain region 14d across the edge of the gate electrode 12g on the drain electrode 16d side.

The TFT substrate 100N having the compensation capacitance unit 30 makes it possible to suppress changes in the parasitic capacitance formed between the gate electrode 12g and the drain electrode 16d due to a misalignment between the protective insulating layer 15 and the gate electrode 12g.

Also in TFT substrate 100N, by adopting a design in which W5=W3+W4 is satisfied in the same manner as the TFT substrate 100M, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by changes in the compensation capacitance formed in the compensation capacitance unit 30.

Furthermore, the TFT substrate 100N having the extended portion 14x makes it possible to suppress changes in the parasitic capacitance formed between the gate electrode 12g and the drain electrode 16d due to a misalignment between the semiconductor layer 14 and the first conductive layer 12. In the TFT substrate 100N, the area of the first region Rgd1, the second region Rgd2, and the third region Rgd3 does not change even when the misalignment between the semiconductor layer 14 and the first conductive layer 12 occurs. Accordingly, the parasitic capacitance between the gate electrode 12g and the drain electrode 16d formed in these regions does not change.

Embodiment 15

Figure 39:
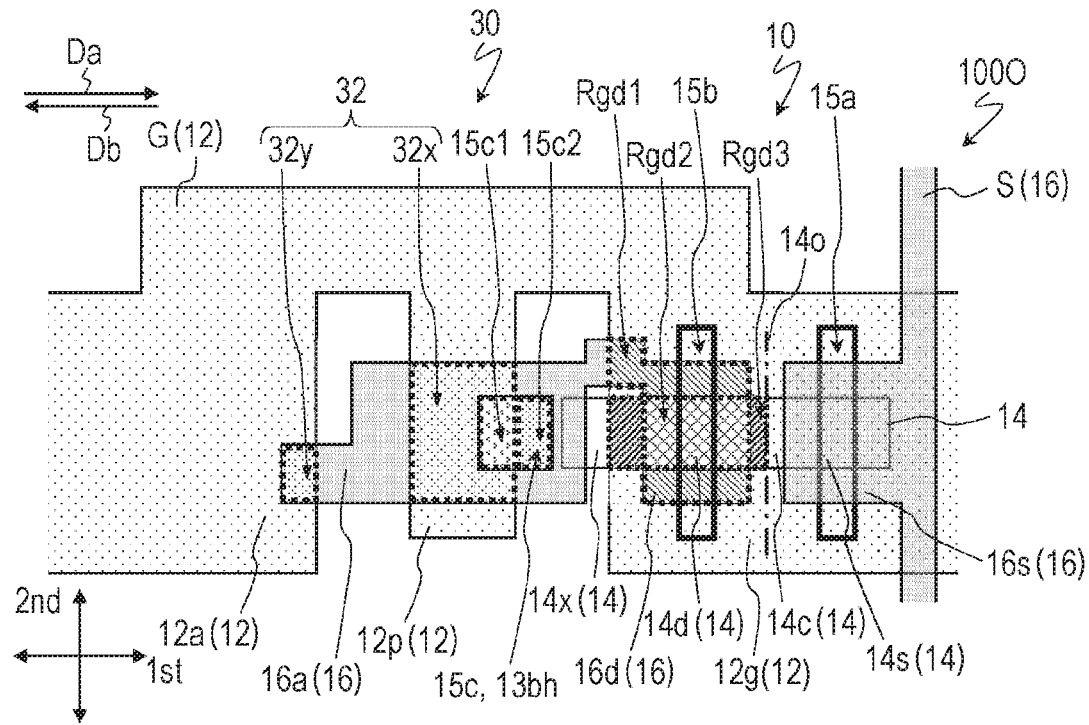
FIG. 39 is a plan view schematically showing a TFT substrate 100O according to an embodiment of the present invention.
Figure 40:
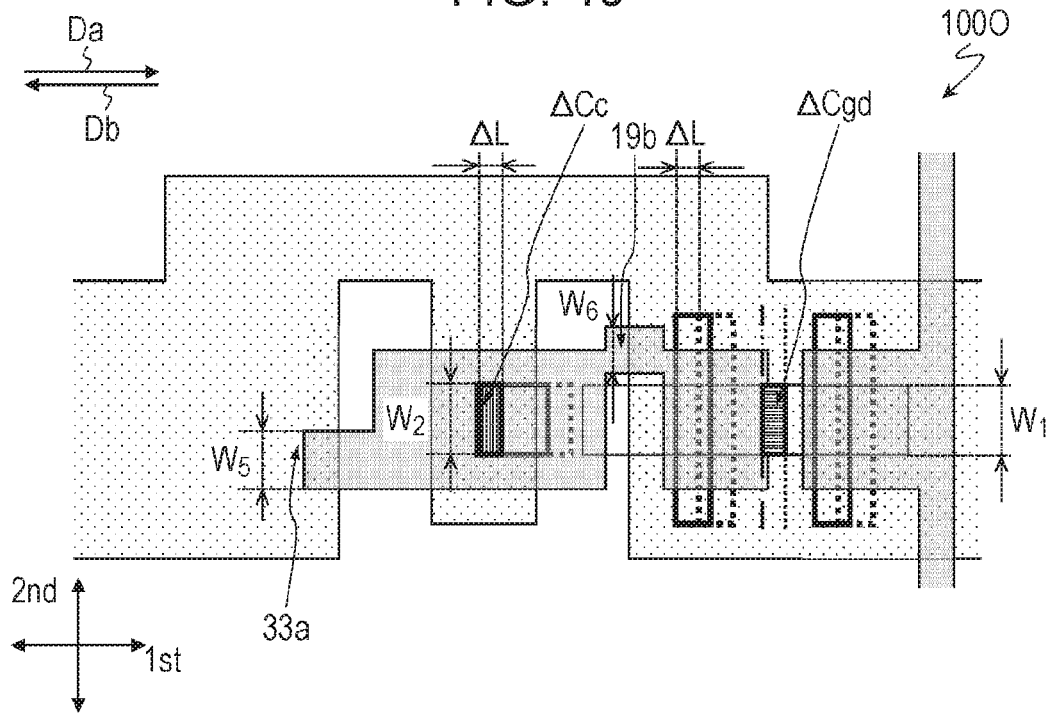
FIG. 40 is a plan view schematically showing the TFT substrate 100O, and shows a misalignment (a shift from the state of FIG. 39) between the protective insulating layer 15 and the first conductive layer 12.

With reference to FIG. 39 and FIG. 40, a description will be given of a TFT substrate 100O of the present embodiment. FIG. 39 and FIG. 40 are plan views schematically showing the TFT substrate 100O. FIG. 40 schematically shows a misalignment (a shift from the state of FIG. 39) between the protective insulating layer 15 and the first conductive layer 12. A description will be given below mainly of differences from the TFT substrate 100N in Embodiment 14.

The TFT substrate 100O is different from the TFT substrate 100N in the shapes of the drain electrode 16d and the second electrode unit 16a.

In the TFT substrate 100N, the portion of the semiconductor layer 14 on the drain electrode 16d side from the edge of the drain electrode 16d on the source electrode 16s side is entirely covered with the drain electrode 16d and/or the second electrode unit 16a integrally formed with the drain electrode 16d. In contrast, in the TFT substrate 100O, the edge of the drain electrode 16d crosses the semiconductor layer 14 between the second opening portion 15b and the edge of the gate electrode 12g on the drain electrode 16d side.

In the TFT substrate 100N, the end of the second region Rgd2 on the drain electrode 16d side out of the end on the source electrode 16s side and the end on the drain electrode 16d side is defined by the edge of the gate electrode 12g on the drain electrode 16d side. In contrast, in the TFT substrate 100O, the end of the second region Rgd2 on the drain electrode 16d side is defined by the edge of the drain electrode 16d. In the TFT substrate 100N, it is possible to form the third region Rgd3 only on the source electrode 16s side of the second region Rgd2, while in the TFT substrate 100O, it is possible to form the third region Rgd3 on the source electrode 16s side of the second region Rgd2 and the drain electrode 16d side.

The TFT substrate 100O having the compensation capacitance unit 30 makes it possible to suppress changes in the parasitic capacitance formed between the gate electrode 12g and the drain electrode 16d due to a misalignment between the protective insulating layer 15 and the gate electrode 12g.

In the TFT substrate 100O, by adopting a design in which W5=W6 is satisfied as shown in FIG. 40, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed when the TFT is off and on in the first region Rgd1 are compensated for by changes in the compensation capacitance formed in the compensation capacitance unit 30. In the present embodiment, Wa corresponds to W6 and Wb corresponds to W5.

As shown in FIG. 40, the TFT 10 has the eighth region 19b adjacent to the first region Rgd1 in the direction Db from the first opening portion 15a to the second opening portion 15b and which overlaps the drain electrode 16d and which does not overlap the semiconductor layer 14 and the gate electrode 12g. W6 is a length of a portion of the first region Rgd1 adjacent to the eighth region 19b in the second direction.

Furthermore, in the TFT substrate 100O, even if a misalignment occurs in the channel length direction between the second conductive layer 16 and the first conductive layer 12, the areas of the second region Rgd2 and the third region Rgd3 do not change. Accordingly, in the changes in the parasitic capacitance between the gate and the drain due to a misalignment in the channel length direction between the second conductive layer 16 and the first conductive layer 12, the parasitic capacitance between the gate and drain formed in the second region Rgd2 and the third region Rgd3 also does not change.

Embodiment 16

Figure 41:
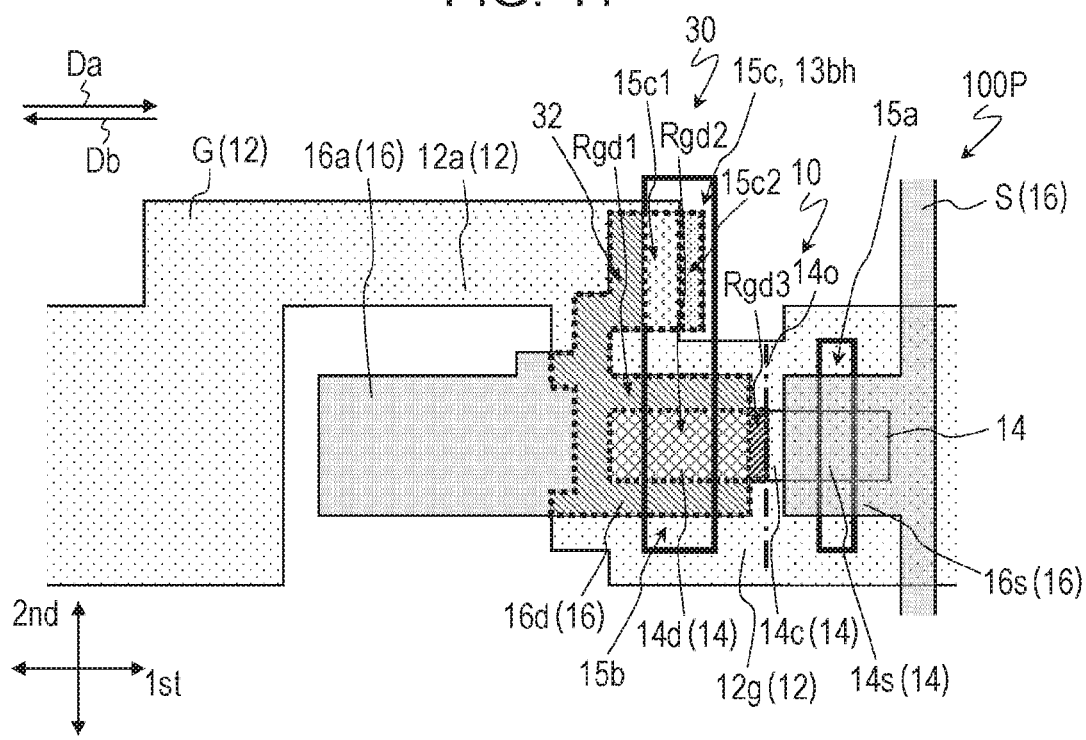
FIG. 41 is a plan view schematically showing a TFT substrate 100P according to an embodiment of the present invention.
Figure 42:
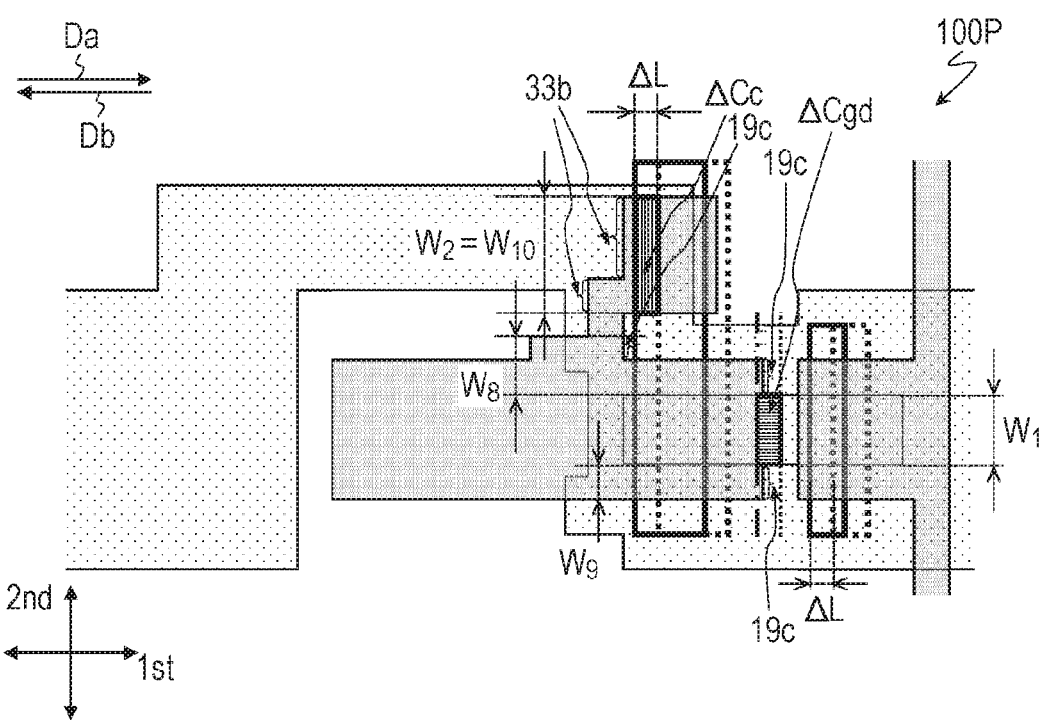
FIG. 42 is a plan view schematically showing the TFT substrate 100P, and shows a misalignment (a shift from the state of FIG. 41) between the protective insulating layer 15 and the first conductive layer 12.

With reference to FIG. 41 and FIG. 42, a description will be given of a TFT substrate 100P of the present embodiment. FIG. 41 and FIG. 42 are plan views schematically showing the TFT substrate 100P. FIG. 42 schematically shows a misalignment (a shift from the state of FIG. 41) between the protective insulating layer 15 and the first conductive layer 12. A description will be given below mainly of the difference between the TFT substrate 100P and the TFT substrate 100A in Embodiment 1.

The TFT substrate 100P is different from the TFT substrate 100A in that the second opening portion 15b and the third opening portion 15c are continuous. Due to this, in the TFT substrate 100P, the first region Rgd1 and the fifth region 32 are integrally formed.

The TFT substrate 100P having the compensation capacitance unit 30 makes it possible to suppress changes in the parasitic capacitance formed between the gate electrode 12g and the drain electrode 16d due to a misalignment occurring in the step of forming the protective insulating layer 15.

In the TFT substrate 100P, by adopting a design in which W10=W8+W9 is satisfied as shown in FIG. 42, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by changes in the compensation capacitance formed in the compensation capacitance unit 30. In the present embodiment, Wa corresponds to W8+W9 and Wb corresponds to W10.

As shown in FIG. 42, in the TFT substrate 100P, the TFT 10 has a ninth region 19c adjacent to the first region Rgd1 in the direction Da from the second opening portion 15b to the first opening portion 15a, and in which the area changes in a region which overlaps the gate electrode 12g and which does not overlap the semiconductor layer 14 and the drain electrode 16d when the second conductive layer 16 shifts in the channel length direction with respect to the first conductive layer 12. W8+W9 is the length of the portion of the first region Rgd1 adjacent to the ninth region 19c in the second direction.

As shown in FIG. 42, in the TFT substrate 100P, the compensation capacitance unit 30 has a tenth region 33b adjacent to the fifth region 32 in the direction Db from the first opening portion 15a to the second opening portion 15b, in which the area changes in a region which overlaps the first electrode unit 12a and which does not overlap the second electrode unit 16a when the second conductive layer 16 shifts in the channel length direction with respect to the first conductive layer 12. W10 is the length of a portion of the fifth region 32 adjacent to the tenth region 33b in the second direction. In addition, in the present embodiment, for example, W2=W10.

Embodiment 17

Figure 43:
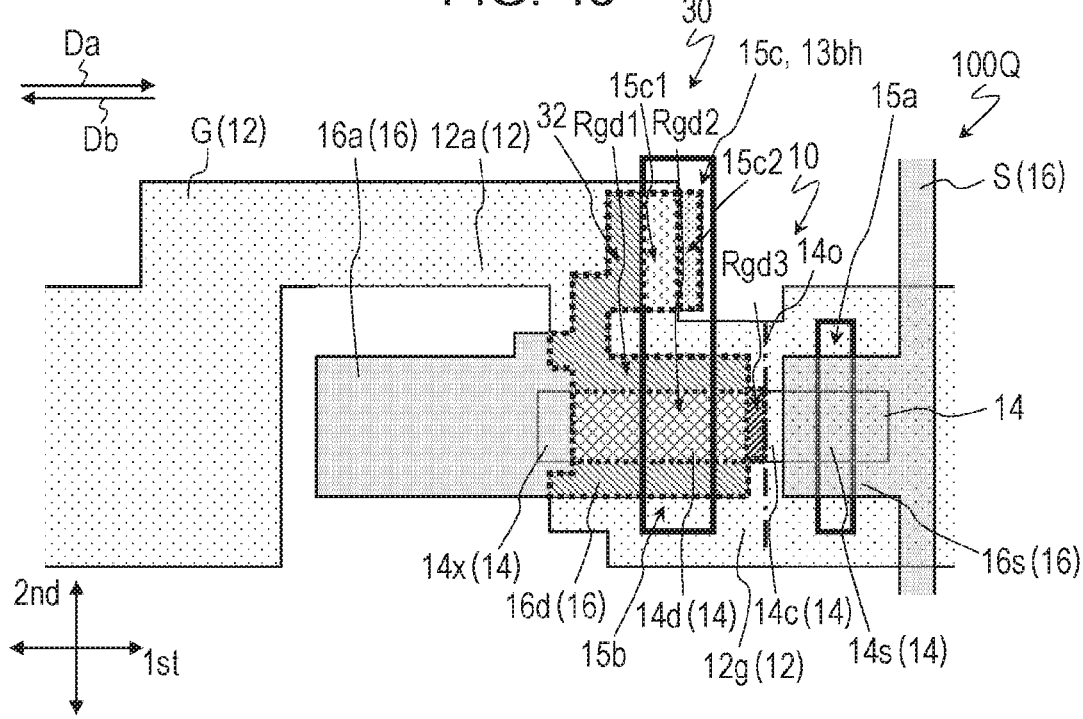
FIG. 43 is a plan view schematically showing a TFT substrate 100Q according to an embodiment of the present invention.
Figure 44:
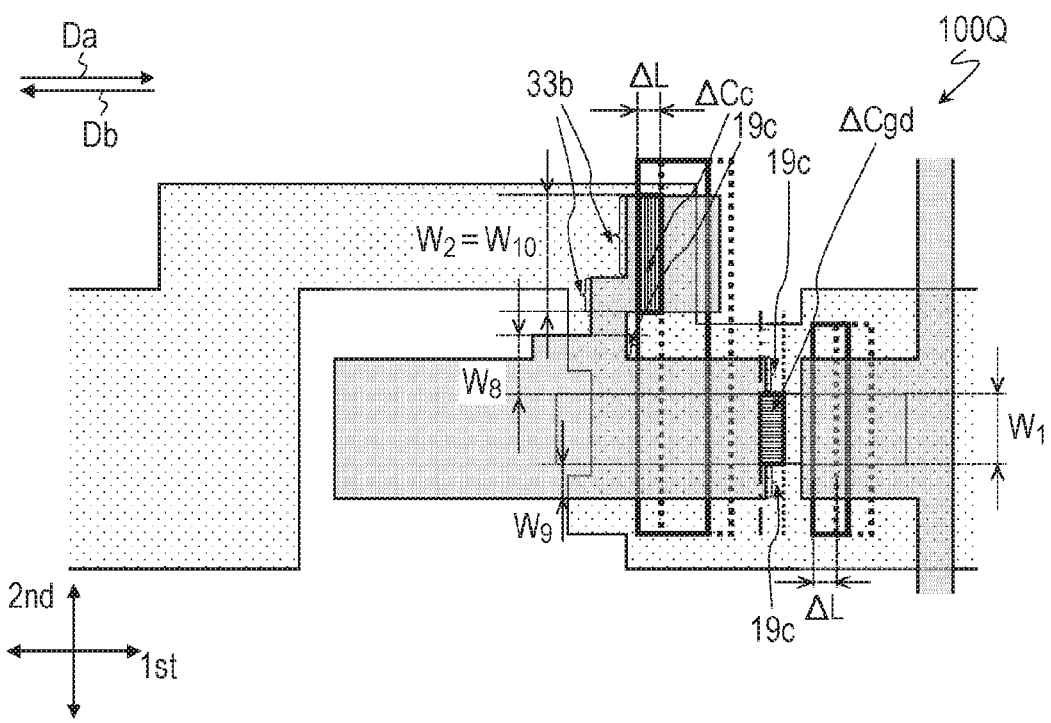
FIG. 44 is a plan view schematically showing the TFT substrate 100Q, and shows a misalignment (a shift from the state of FIG. 43) between the protective insulating layer 15 and the first conductive layer 12.

With reference to FIG. 43 and FIG. 44, a description will be given of a TFT substrate 100Q of the present embodiment. FIG. 43 and FIG. 44 are plan views schematically showing the TFT substrate 100Q. FIG. 44 schematically shows a misalignment (a shift from the state of FIG. 43) between the protective insulating layer 15 and the first conductive layer 12. A description will be given below mainly of the difference between the TFT substrate 100Q and the TFT substrate 100P in Embodiment 16.

The TFT substrate 100Q is different from the TFT substrate 100P in the shape of the semiconductor layer 14. In the TFT substrate 100P, the semiconductor layer 14 is inside the gate electrode 12g when viewed from the normal direction of the substrate 1. On the other hand, in the TFT substrate 100Q, the semiconductor layer 14 has a portion which does not overlap the gate electrode 12g in the drain-side region. The semiconductor layer 14 includes the extended portion 14x extending from the drain region 14d across the edge of the gate electrode 12g on the drain electrode 16d side.

The TFT substrate 100Q having the compensation capacitance unit 30 makes it possible to suppress changes in the parasitic capacitance formed between the gate electrode 12g and the drain electrode 16d due to a misalignment between the protective insulating layer 15 and the gate electrode 12g.

In the TFT substrate 100Q, by adopting a design in which W10=W8+W9 is satisfied in the same manner as the TFT substrate 100P, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by changes in the compensation capacitance formed in the compensation capacitance unit 30.

Furthermore, the TFT substrate 100Q having the extended portion 14x makes it possible to suppress changes in the parasitic capacitance between the gate electrode 12g and the drain electrode 16d due to a misalignment between the semiconductor layer 14 and the first conductive layer 12. In the TFT substrate 100Q, even if a misalignment occurs between the semiconductor layer 14 and the first conductive layer 12, the areas of the first region Rgd1, the second region Rgd2, and the third region Rgd3 do not change. Accordingly, the parasitic capacitance between the gate electrode 12g and the drain electrode 16d formed in these regions does not change.

Embodiment 18

Figure 45:
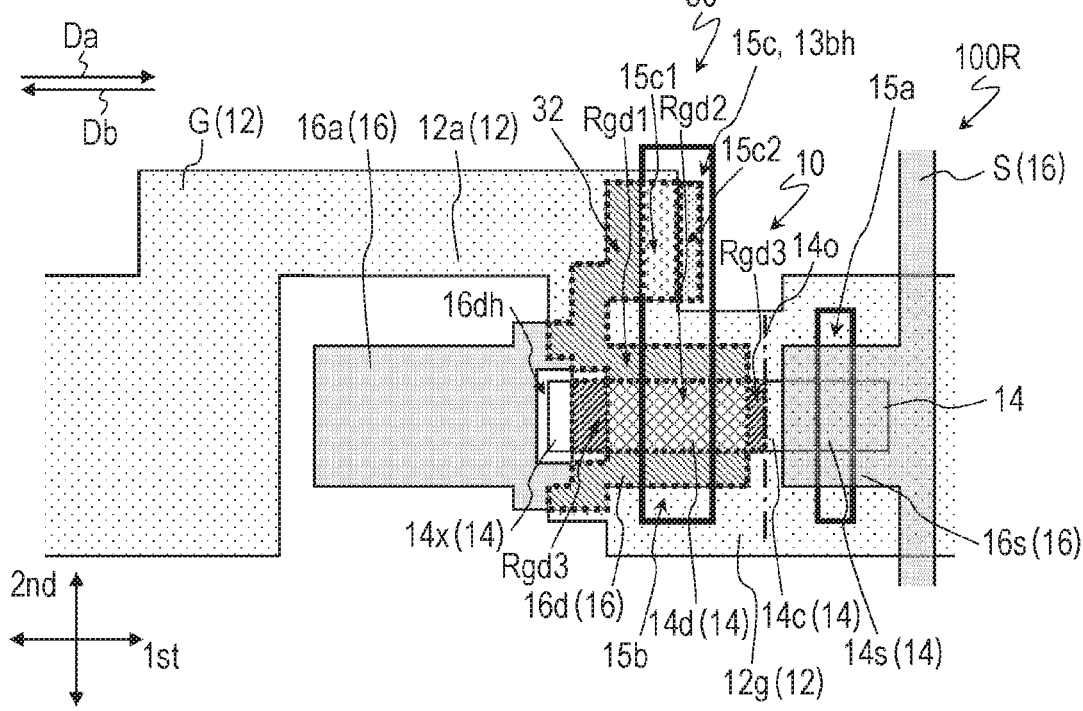
FIG. 45 is a plan view schematically showing a TFT substrate 100R according to an embodiment of the present invention.
Figure 46:
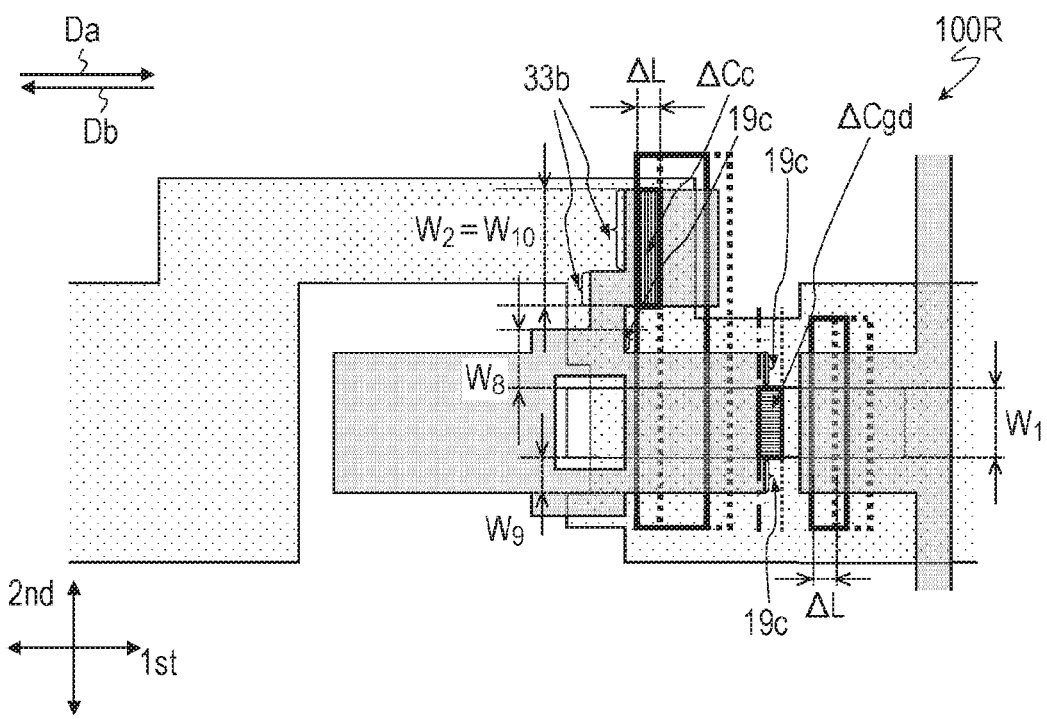
FIG. 46 is a plan view schematically showing the TFT substrate 100R, and shows a misalignment (a shift from the state of FIG. 45) between the protective insulating layer 15 and the first conductive layer 12.

With reference to FIG. 45 and FIG. 46, a description will be given of a TFT substrate 100R of the present embodiment. FIG. 45 and FIG. 46 are plan views schematically showing the TFT substrate 100R. FIG. 46 schematically shows a misalignment (a shift from the state of FIG. 45) between the protective insulating layer 15 and the first conductive layer 12. A description will be given below mainly of differences from the TFT substrate 100Q in Embodiment 17.

The TFT substrate 100R is different from the TFT substrate 100Q in the shapes of the drain electrode 16d and the second electrode unit 16a. The TFT substrate 100R is different from the TFT substrate 100Q in that the drain electrode 16d has a fifth opening portion 16dh crossing the edge of the gate electrode 12g on the drain electrode 16d side.

In the TFT substrate 100Q, the portion of the semiconductor layer 14 on the drain electrode 16d side from the edge of the drain electrode 16d on the source electrode 16s side is entirely covered with the drain electrode 16d and/or the second electrode unit 16a integrally formed with the drain electrode 16d. In contrast, in the TFT substrate 100R, the edge of the fifth opening portion 16dh of the drain electrode 16d crosses the semiconductor layer 14 between the second opening portion 15b and the edge of the gate electrode 12g on the drain electrode 16d side.

In the TFT substrate 100Q, the end of the second region Rgd2 on the drain electrode 16d side out of the end on the source electrode 16s side and the end on the drain electrode 16d side is defined by the edge of the gate electrode 12g on the drain electrode 16d side. In contrast, in the TFT substrate 100R, the end of the second region Rgd2 on the drain electrode 16d side is defined by the edge of the fifth opening portion 16dh of the drain electrode 16d. In the TFT substrate 100Q, it is possible to form the third region Rgd3 only on the source electrode 16s side of the second region Rgd2, while, in the TFT substrate 100R, it is possible to form the third region Rgd3 on the source electrode 16s side and the drain electrode 16d side of the second region Rgd2.

The TFT substrate 100R having the compensation capacitance unit 30 makes it possible to suppress changes in the parasitic capacitance formed between the gate electrode 12g and the drain electrode 16d due to a misalignment between the protective insulating layer 15 and the gate electrode 12g.

In the TFT substrate 100R, by adopting a design in which W10=W8+W9 is satisfied in the same manner as the TFT substrate 100Q, in the changes in the parasitic capacitance between the gate and drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by the change in the compensation capacitance formed in the compensation capacitance unit 30.

Furthermore, in the TFT substrate 100R, even if a misalignment occurs in the channel length direction between the second conductive layer 16 and the first conductive layer 12, the areas of the second region Rgd2 and the third region Rgd3 do not change. Accordingly, in the changes in the parasitic capacitance between the gate and the drain due to a misalignment in the channel length direction between the second conductive layer 16 and the first conductive layer 12, the parasitic capacitance between the gate and drain formed in the second region Rgd2 and the third region Rgd3 also does not change.

Embodiment 19

Figure 47:
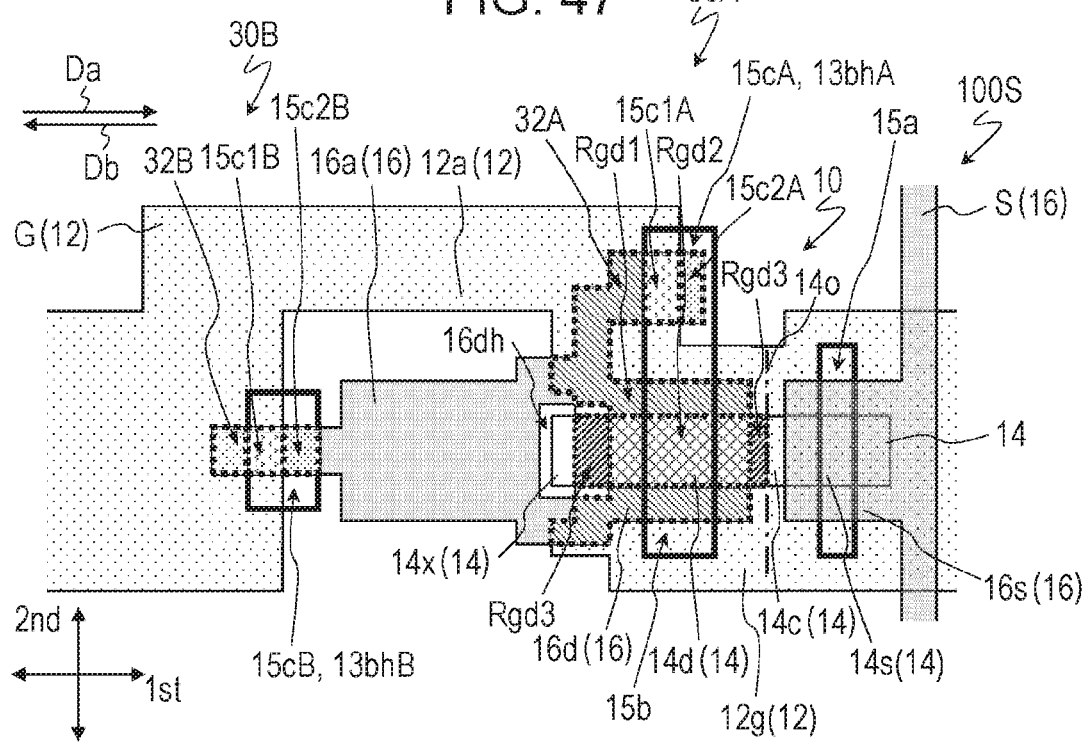
FIG. 47 is a plan view schematically showing a TFT substrate 100S according to an embodiment of the present invention.
Figure 48:
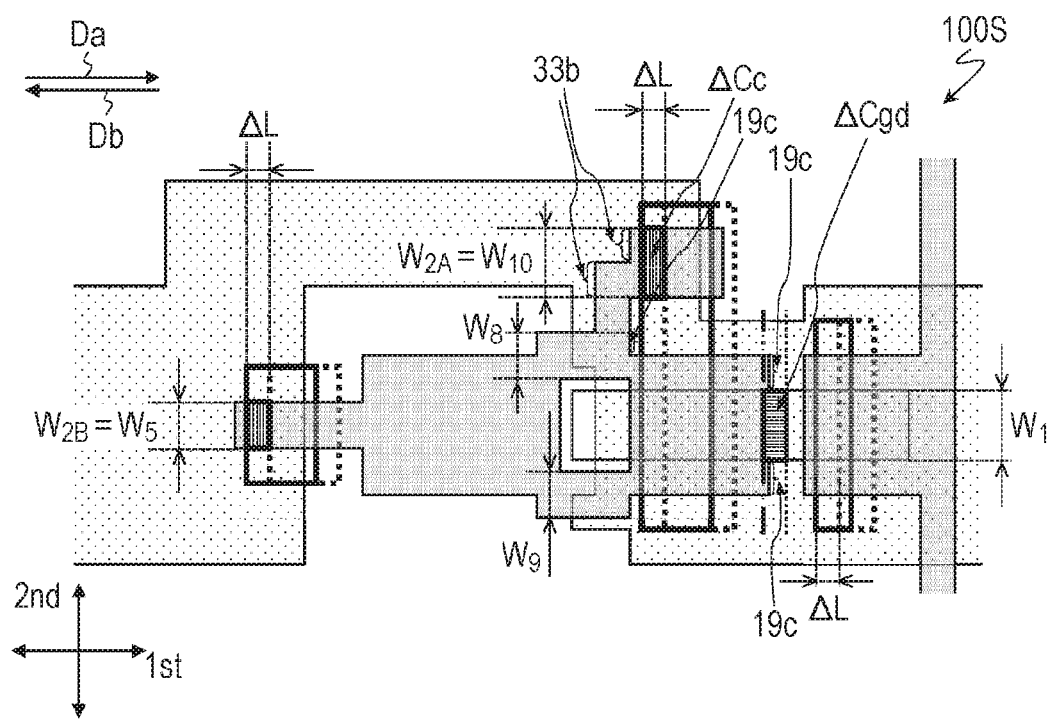
FIG. 48 is a plan view schematically showing the TFT substrate 100S, and shows a misalignment (a shift from the state of FIG. 47) between the protective insulating layer 15 and the first conductive layer 12.

With reference to FIG. 47 and FIG. 48, a description will be given of a TFT substrate 100S of the present embodiment. FIG. 47 and FIG. 48 are plan views schematically showing the TFT substrate 100S. FIG. 48 schematically shows a misalignment (a shift from the state of FIG. 47) between the protective insulating layer 15 and the first conductive layer 12. A description will be given below mainly of the differences between the TFT substrate 100S and the TFT substrate 100A in Embodiment 1 and the TFT substrate 100R in Embodiment 18.

The TFT substrate 100S is different from the TFT substrate 100A and the TFT substrate 100R in the point of having two separated third openings 15cA and 15cB.

The TFT substrate 100S has a compensation capacitance unit 30A having the third opening portion 15cA and a compensation capacitance unit 30B having the third opening portion 15cB. The third opening portion 15cA has the first portion 15c1A and the second portion 15c2A, and the third opening portion 15cB has the first portion 15c1B and the second portion 15c2B. The compensation capacitance unit 30A further has a fifth region 32A, and the compensation capacitance unit 30B further has a fifth region 32B. The second insulating layer 13b has a fourth opening portion 13bhA and a fourth opening portion 13bhB. The side face of the fourth opening portion 13bhA is aligned with the side face of the third opening portion 15cA, and the side face of the fourth opening portion 13bhB is aligned with the side face of the third opening portion 15cB.

In the same manner as the compensation capacitance unit 30 of the TFT substrate 100R, in the compensation capacitance unit 30A, the second opening portion 15b and the third opening portion 15cA are formed continuously. Due to this, the fifth region 32A of the compensation capacitance unit 30A is formed integrally with the first region Rgd1.

The compensation capacitance unit 30B is formed separately from the second opening portion 15b, for example, in the same manner as the compensation capacitance unit 30 of the TFT substrate 100A.

In the TFT substrate 100S, the change ΔCgd in the parasitic capacitance between the gate and the drain due to a misalignment in the channel length direction between the protective insulating layer 15 and the first conductive layer 12 is compensated for by the sum of the capacitance change ΔCcA of the compensation capacitance unit 30A and the capacitance change ΔCcB of the compensation capacitance unit 30B.

With reference to FIG. 48, an example will be considered in which the protective insulating layer 15 shifts by ΔL with respect to the first conductive layer 12 in the direction Db from the first opening portion 15a to the second opening portion 15b. When the length of the first portion 15c1A in the second direction is W2A, it is possible to express the absolute value of the capacitance change ΔCcA in the compensation capacitance unit 30A as $$|\Delta CcA| = [(\varepsilon_{GI1}/d_{GI1}) - (\varepsilon_{ES+GI1+GI2}/d_{ES+GI1+GI2})] \times W2A \times \Delta L$$

and, when the length of the first portion 15c1B in the second direction is W2B, it is possible to express the absolute value of the capacitance change ΔCcB in the compensation capacitance unit 30B as $$|\Delta CcB| = [(\varepsilon_{GI1}/d_{GI1}) - (\varepsilon_{ES+GI1+GI2}/d_{ES+GI1+GI2})] \times W2B \times \Delta L.$$

In a case where it is desired to completely compensate for the change ΔCgd in the parasitic capacitance between the gate and the drain using the compensation capacitance units 30A and 30B when the protective insulating layer 15 shifts in the channel length direction, the compensation capacitance unit 30 may be designed such that the following is satisfied.

$$|\Delta Cgd| = |\Delta CcA| + |\Delta CcB|$$

At this time, the following equation is satisfied.

$$W_{2A} + W_{2B} = \frac{(\varepsilon_{GI1+GI2}/d_{GI1+GI2})}{(\varepsilon_{GI1}/d_{GI1}) - (\varepsilon_{ES+GI1+GI2}/d_{ES+GI1+GI2})} W_1 = K \times W_1 \quad \text{[Math. 3]}$$

Here, in a case where |ΔCgd|=|ΔCcA|+|ΔCcB| is satisfied, the ratio of the sum (W2A+W2B) of the lengths of the first portions 15c1A and 15c1B in the second direction with respect to the length W1 of the semiconductor layer 14 in the second direction is set as K.

The present embodiment is not limited to a case where W2A+W2B=K×W1 is satisfied. For example, from the viewpoint of improving mass productivity by permitting a misalignment in a prescribed range in the step of manufacturing the TFT substrate 100S and from the viewpoint of suppressing the decrease in the aperture ratio of the display device using the TFT substrate 100S, it is preferable to set W2A+W2B to 0.3K×W1 or more and 3K×W1 or less.

The ratio K of W2A+W2B to W1 is determined by the material and the thickness of the gate insulating layer 13 and the protective insulating layer 15. For example, K is 0.7 or more and 4.0 or less. When K is in this range and W2A+W2B is 0.3K×W1 or more and 3K×W1 or less, W2A+W2B is 0.21W1 or more and 12.0W1 or less.

The TFT substrate 100S having the compensation capacitance units 30A and 30B makes it possible to suppress changes in the parasitic capacitance formed between the gate electrode 12g and the drain electrode 16d due to a misalignment occurring in the step of forming the protective insulating layer 15.

In the TFT substrate 100S, by adopting a design in which W5+W10=W8+W9 is satisfied as shown in FIG. 48, in the changes in the parasitic capacitance between the gate and the drain due to a misalignment in the channel length direction between the second conductive layer 16 and the first conductive layer 12, changes in the parasitic capacitance (electrostatic capacitance value: Cgd1) between the gate and the drain formed in the first region Rgd1 are compensated for by changes in the compensation capacitance formed in the compensation capacitance unit 30. In the present embodiment, Wa corresponds to W8+W9 and Wb corresponds to W5+W10.

As shown in FIG. 42, in the TFT substrate 100P, the TFT 10 has the ninth region 19c adjacent to the first region Rgd1 in the direction Da from the second opening portion 15b to the first opening portion 15a, in which the area changes in a region which overlaps the gate electrode 12G and which does not overlap the semiconductor layer 14 and the drain electrode 16d when the second conductive layer 16 shifts in the channel length direction with respect to the first conductive layer 12. W8+W9 is the length of the portion of the first region Rgd1 adjacent to the ninth region 19c in the second direction.

Furthermore, the TFT substrate 100S having the extended portion 14x of the semiconductor layer 14 in the same manner as the TFT substrate 100R makes it possible to suppress changes in parasitic capacitance formed between the gate electrode 12g and the drain electrode 16d due to a misalignment between the semiconductor layer 14 and the first conductive layer 12. In the TFT substrate 100S, even if a misalignment occurs between the semiconductor layer 14 and the first conductive layer 12, the areas of the first region Rgd1, the second region Rgd2, and the third region Rgd3 do not change. Accordingly, the parasitic capacitance between the gate electrode 12g and the drain electrode 16d formed in these regions does not change.

Furthermore, in the TFT substrate 100S, in the same manner as the TFT substrate 100R, the edge of the fifth opening portion 16dh of the drain electrode 16d crosses the semiconductor layer 14 between the second opening portion 15b and the edge of the gate electrode 12g on the drain electrode 16d side. Due to this, even if a misalignment occurs in the channel length direction between the second conductive layer 16 and the first conductive layer 12, the areas of the second region Rgd2 and the third region Rgd3 do not change. Accordingly, in the changes in the parasitic capacitance between the gate and the drain due to a misalignment in the channel length direction between the second conductive layer 16 and the first conductive layer 12, the parasitic capacitance between the gate and drain formed in the second region Rgd2 and the third region Rgd3 also does not change.

Embodiment 20

A description will be given below of the TFT substrate according to the present embodiment with reference to the drawings. The TFT substrate of the present embodiment is a TFT substrate (active matrix substrate) which is provided with an oxide semiconductor TFT and a crystalline silicon TFT formed on the same substrate.

The active matrix substrate is provided with a TFT (pixel TFT) for each pixel. As the pixel TFT, for example, an oxide semiconductor TFT in which an In—Ga—Zn—O-based semiconductor film is an active layer is used.

A part or the whole of the peripheral driving circuit may be integrally formed on the same substrate as the pixel TFT. Such an active matrix substrate is called a driver monolithic active matrix substrate. In the driver monolithic active matrix substrate, the peripheral driving circuit is provided in a region (non-display region or frame region) other than a region (display region) including a plurality of pixels. As the TFT (circuit TFT) forming the peripheral driving circuit, for example, a crystalline silicon TFT in which a polycrystalline silicon film is an active layer is used. In this manner, when an oxide semiconductor TFT is used as a pixel TFT and a crystalline silicon TFT is used as a circuit TFT, it is possible to reduce power consumption in the display region and to reduce the frame region.

As the pixel TFT, it is possible to apply the TFT 10 of the TFT substrate in any of the above embodiments. A description will be given below of this point.

Next, a description will be given of a more specific configuration of the active matrix substrate of the present embodiment with reference to the drawings.

Figure 49:
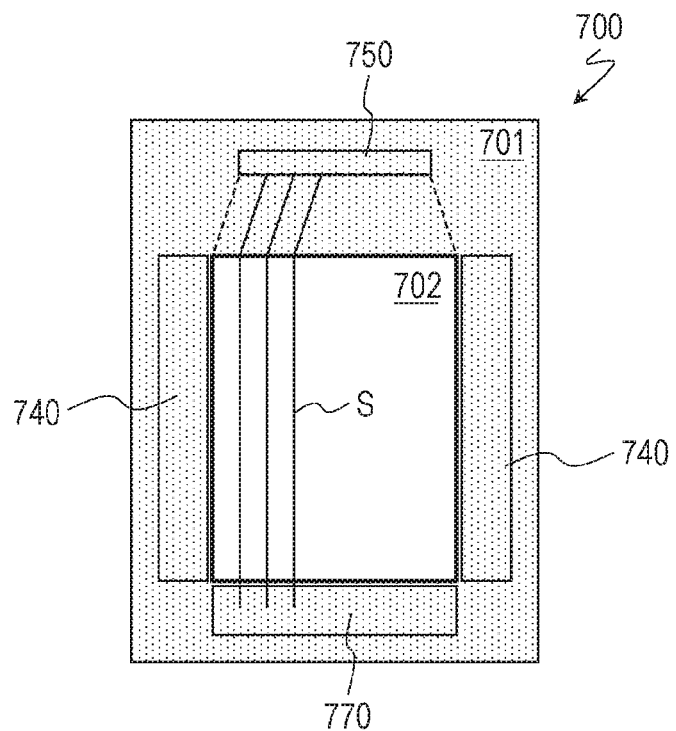
FIG. 49 is a schematic plan view showing an example of a planar structure of a TFT substrate (active matrix substrate) 700 according to an embodiment of the present invention.
Figure 50:
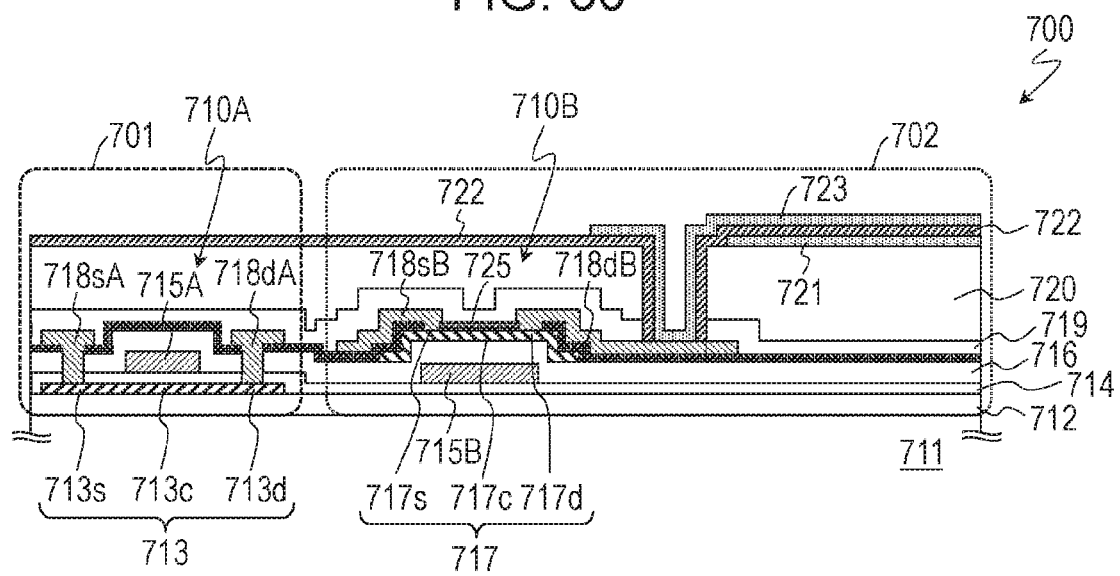
FIG. 50 is a sectional view of a crystalline silicon TFT 710A and an oxide semiconductor TFT 710B in an active matrix substrate 700.

FIG. 49 is a schematic plan view showing an example of the planar structure of an active matrix substrate 700 of the present embodiment and FIG. 50 is a sectional view showing a sectional structure of a crystalline silicon TFT (referred to below as a "first thin film transistor") 710A and an oxide semiconductor TFT (referred to below as a "second thin film transistor") 710B in the active matrix substrate 700.

As shown in FIG. 49, the active matrix substrate 700 has a display region 702 including a plurality of pixels and a region (non-display region) other than the display region 702. The non-display region includes a drive circuit formation region 701 in which a drive circuit is provided. In the drive circuit formation region 701, for example, a gate driver circuit 740, an inspection circuit 770, and the like are provided. In the display region 702, a plurality of gate bus lines (not shown) extending in the row direction and a plurality of source bus lines S extending in the column direction are formed. Although not shown, each pixel is defined by a gate bus line and a source bus line S, for example. Each gate bus line is connected to each terminal of the gate driver circuit. The source bus lines S are connected to the respective terminals of a driver IC 750 mounted on the active matrix substrate 700.

As shown in FIG. 50, in the active matrix substrate 700, a second thin film transistor 710B is formed as a pixel TFT in each pixel of the display region 702, and a first thin film transistor 710A is formed as a circuit TFT in the drive circuit formation region 701.

The active matrix substrate 700 is provided with a substrate 711, a base film 712 formed on the surface of the substrate 711, a first thin film transistor 710A formed on the base film 712, and a second thin film transistor 710B formed on the base film 712. The first thin film transistor 710A is a crystalline silicon TFT having an active region mainly including crystalline silicon. The second thin film transistor 710B is an oxide semiconductor TFT having an active region mainly including an oxide semiconductor. The first thin film transistor 710A and the second thin film transistor 710B are integrally formed on the substrate 711. The "active region" referred to here indicates a region in which a channel is formed among semiconductor layers to be an active layer of a TFT.

The first thin film transistor 710A has a crystalline silicon semiconductor layer (for example, a low temperature polysilicon layer) 713 formed on the base film 712, a first insulating layer 714 covering the crystalline silicon semiconductor layer 713, and a gate electrode 715A provided on the first insulating layer 714. A portion of the first insulating layer 714 positioned between the crystalline silicon semiconductor layer 713 and the gate electrode 715A functions as a gate insulating film of the first thin film transistor 710A. The crystalline silicon semiconductor layer 713 has a region (active region) 713c in which a channel is formed and a source region 713s and a drain region 713d positioned on both sides of the active region, respectively. In this example, a portion of the crystalline silicon semiconductor layer 713 overlapping the gate electrode 715A via the first insulating layer 714 is an active region 713c. The first thin film transistor 710A further has a source electrode 718sA and a drain electrode 718dA connected to the source region 713s and the drain region 713d, respectively. The source and drain electrodes 718sA and 718dA are provided over the interlayer insulating film (here, a second insulating layer 716) covering the gate electrode 715A and the crystalline silicon semiconductor layer 713, and may be connected to the crystalline silicon semiconductor layer 713 in a contact hole formed in the interlayer insulating film.

The second thin film transistor 710B has a gate electrode 715B provided over the base film 712, the second insulating layer 716 covering the gate electrode 715B, and an oxide semiconductor layer 717 arranged over the second insulating layer 716. As shown in the diagram, the first insulating layer 714 which is the gate insulating film of the first thin film transistor 710A may extend to a region where the second thin film transistor 710B is to be formed. In such a case, the oxide semiconductor layer 717 may be formed on the first insulating layer 714. A portion of the second insulating layer 716 positioned between the gate electrode 715B and the oxide semiconductor layer 717 functions as a gate insulating film of the second thin film transistor 710B. The oxide semiconductor layer 717 has a region (active region) 717c in which a channel is formed and a source contact region 717s and a drain contact region 717d positioned on both sides of the active region, respectively. In this example, a portion of the oxide semiconductor layer 717 overlapping the gate electrode 715B via the second insulating layer 716 is an active region 717c. On the oxide semiconductor layer 717, a protective insulating layer (etch stop layer) 725 is formed. The protective insulating layer 725 has openings in contact with the active region 717c of the oxide semiconductor layer 717 and exposing the source contact region 717s and the drain contact region 717d, respectively. The second thin film transistor 710B further has a source electrode 718sB and a drain electrode 718dB connected to the source contact region 717s and the drain contact region 717d, respectively, in each opening portion of the protective insulating layer 725. Here, it is also possible to provide a configuration in which the base film 712 is not provided over the substrate 711.

The thin film transistors 710A and 710B are covered with a passivation film 719 and a planarization film 720. In the second thin film transistor 710B functioning as a pixel TFT, the gate electrode 715B is connected to the gate bus line (not shown), the source electrode 718sB is connected to the source bus line (not shown), and the drain electrode 718dB is connected to a pixel electrode 723. In this example, the drain electrode 718dB is connected to the corresponding pixel electrode 723 in the opening portion formed in the passivation film 719 and the planarization film 720. A video signal is supplied to the source electrode 718sB via the source bus line, and a necessary electric charge is written in the pixel electrode 723 based on the gate signal from the gate bus line.

As shown in the diagram, a transparent conductive layer 721 may be formed as a common electrode on the planarization film 720, a third insulating layer 722 may be formed between the transparent conductive layer (common electrode) 721 and the pixel electrode 723. In such a case, a slit-like opening portion may be provided in the pixel electrode 723. It is possible to apply the active matrix substrate 700 to, for example, a display device with a Fringe Field Switching (FFS) mode. The FFS mode is a lateral electric field system mode in which a pair of electrodes is provided on one substrate and an electric field is applied to the liquid crystal molecules in a direction (lateral direction) parallel to the substrate surface. In this example, an electric field is generated which is represented by lines of electric force which come out from the pixel electrode 723, pass through the liquid crystal layer (not shown), and pass through the slit-like opening portion of the pixel electrode 723 to come out at the common electrode 721. This electric field has a component in a lateral direction to the liquid crystal layer. As a result, it is possible to apply a lateral electric field to the liquid crystal layer. In a lateral electric field system, since liquid crystal molecules do not rise from the substrate, there is an advantage in that it is possible to realize a wider viewing angle than in a vertical electric field system.

As the second thin film transistor 710B of the present embodiment, it is possible to apply the TFT 10 of the TFT substrate in any of the above embodiments. In a case of applying the TFT 10, the gate electrode 12g, the gate insulating layer 13, the semiconductor layer 14, the channel region 14c, the source region 14s, the drain region 14d, the protective insulating layer 15, and the source and drain electrodes 16s and 16d in the TFT 10 may each correspond to the gate electrode 715B, a second insulating layer (gate insulating layer) 716, the oxide semiconductor layer 717, the active region 717c, the source contact region 717s, the drain contact region 717d, the protective insulating layer 725, and source and drain electrodes 718sB and 718dB shown in FIG. 50.

In addition, a thin film transistor 710B which is an oxide semiconductor TFT may be used as the TFT (inspection TFT) forming the inspection circuit 770 shown in FIG. 49. Although not shown, the inspection TFT and the inspection circuit may be formed in a region in which the driver IC 750 shown in FIG. 49 is mounted, for example. In such a case, the inspection TFT is arranged between the driver IC 750 and the substrate 711.

In the illustrated example, the first thin film transistor 710A has a top gate structure in which the crystalline silicon semiconductor layer 713 is arranged between the gate electrode 715A and the substrate 711 (the base film 712). On the other hand, the second thin film transistor 710B has a bottom gate structure in which the gate electrode 715B is arranged between the oxide semiconductor layer 717 and the substrate 711 (the base film 712). Adopting such a structure makes it possible to more effectively suppress an increase in the number of manufacturing steps and manufacturing cost when integrally forming two types of thin film transistors 710A and 710B on the same substrate 711.

The TFT structures of the first thin film transistor 710A and the second thin film transistor 710B are not limited to the above. For example, these thin film transistors 710A and 710B may have the same TFT structure. For example, the first thin film transistor 710A may have a bottom gate structure. In a case where the first thin film transistor 710A has a bottom gate structure, the first thin film transistor 10A may be a channel etch type or an etch stop type, and may be a bottom contact type in which the source electrode and the drain electrode are positioned below the semiconductor layer.

The second insulating layer 716 which is the gate insulating film of the second thin film transistor 710B may function as an interlayer insulating film which is extended to the region where the first thin film transistor 710A is formed and which covers the gate electrode 715A and the crystalline silicon semiconductor layer 713 of the first thin film transistor 710A. In a case where the interlayer insulating film of the first thin film transistor 710A and the gate insulating film of the second thin film transistor 710B are formed in the same layer (second insulating layer) 716 as described above, the second insulating layer 716 may have a laminated structure. For example, the second insulating layer 716 may have a laminated structure including a hydrogen-donating layer (for example, a silicon nitride layer) capable of supplying hydrogen, and an oxygen-donating layer (for example, a silicon oxide layer) arranged on the hydrogen-donating layer and capable of supplying oxygen.

The gate electrode 715A of the first thin film transistor 710A and the gate electrode 715B of the second thin film transistor 710B may be formed in the same layer. In addition, the source and drain electrodes 718sA and 718dA of the first thin film transistor 710A and the source and drain electrodes 718sB and 718dB of the second thin film transistor 710B may be formed in the same layer. "Formed in the same layer" means formed using the same film (conductive film). Due to this, it is possible to suppress an increase in the number of manufacturing steps and the manufacturing cost.

INDUSTRIAL APPLICABILITY

According to an embodiment of the present invention, there is provided a TFT substrate in which changes in parasitic capacitance due to a misalignment between an etch stop layer and a gate electrode are suppressed. The TFT substrate according to the embodiment of the present invention is suitably used, for example, as an active matrix substrate of various display devices.

REFERENCE SIGNS LIST

1: SUBSTRATE
10: TFT
12: FIRST CONDUCTIVE LAYER (GATE LAYER)
12a: FIRST ELECTRODE UNIT
12g: GATE ELECTRODE
13: GATE INSULATING LAYER
13a: FIRST INSULATING LAYER
13b: SECOND INSULATING LAYER
13bh, 13bhA, 13bhB: FOURTH OPENING PORTION
14: SEMICONDUCTOR LAYER
14c: CHANNEL REGION
14d: DRAIN REGION
14s: SOURCE REGION
14x: EXTENDED PORTION
15: PROTECTIVE INSULATING LAYER (ETCH STOP LAYER)
15a: FIRST OPENING PORTION
15b: SECOND OPENING PORTION
15c, 15cA, 15cB: THIRD OPENING PORTION
15c1, 15c1A, 15c1B: FIRST PORTION
15c2, 15c2A, 15c2B: SECOND PORTION
16: SECOND CONDUCTIVE LAYER (SOURCE LAYER)
16a: SECOND ELECTRODE UNIT
16d: DRAIN ELECTRODE
16s: SOURCE ELECTRODE
30, 30A, 30B: COMPENSATION CAPACITANCE UNIT
32, 32A, 32B: FIFTH REGION
33a: SEVENTH REGION
33b: TENTH REGION
100A to 100S, 100x to 100z, 700: TFT SUBSTRATE (ACTIVE MATRIX SUBSTRATE)

The invention claimed is:
1. A Thin Film Transistor (TFT) substrate comprising:
a plurality of pixels arranged in a matrix having a plurality of rows and a plurality of columns;
a substrate; and a plurality of TFTs supported on the substrate and each connected to one of the plurality of pixels, wherein the TFT substrate includes a first conductive layer including gate electrodes of the plurality of TFTs, a gate insulating layer formed on the first conductive layer, a semiconductor layer formed on the gate insulating layer and including a channel region, a source region, and a drain region, a protective insulating layer including a portion which covers the channel region and having a first opening portion reaching the source region and a second opening portion reaching the drain region, and a second conductive layer formed on the protective insulating layer and including a source electrode which is formed on the protective insulating layer and in the first opening portion and which is in contact with the source region in the first opening portion, and a drain electrode which is formed on the protective insulating layer and in the second opening portion and which is in contact with the drain region in the second opening portion, each of the plurality of pixels has a compensation capacitance unit, the first conductive layer further includes a first electrode unit electrically connected to a respective gate electrode of one of the plurality of TFTs and forming the compensation capacitance unit, the second conductive layer further includes a second electrode unit electrically connected to the drain electrode, overlapping the first electrode unit, and forming the compensation capacitance unit, and the protective insulating layer further includes a third opening portion which does not overlap the semiconductor layer, which includes a first portion overlapping the first electrode unit and the second electrode unit and a second portion adjacent to the first portion in a direction from the second opening portion to the first opening portion, and which does not overlap the first electrode unit and/or the second electrode unit.

2. The TFT substrate according to claim 1, wherein
the plurality of pixels include a first pixel and a second pixel for which directions from the second opening portion to the first opening portion are substantially opposite to each other.

3. The TFT substrate according to claim 2, wherein
the first pixel and the second pixel are adjacent to each other in a channel width direction of the TFT.

4. The TFT substrate according to claim 1, further comprising:

a plurality of gate bus lines, each of which being connected to one of the plurality of TFTs and extending in a row direction; and a plurality of source bus lines, each of which being connected to one of the plurality of TFTs and extending in a column direction, wherein the plurality of pixels include two pixels which are adjacent to each other in the column direction and connected to the source bus lines different to each other.

5. The TFT substrate according to claim 4, wherein
the two pixels which are adjacent to each other in the column direction are connected to source bus lines different to each other.

6. The TFT substrate according to claim 1, wherein
the gate insulating layer has a first insulating layer and a second insulating layer formed on the first insulating layer, and the second insulating layer has a fourth opening portion in which a side surface is aligned with a side surface of the third opening portion.

7. The TFT substrate according to claim 6, wherein
the protective insulating layer and the second insulating layer are formed of an identical material.

8. The TFT substrate according to claim 1, wherein
the semiconductor layer further includes an extended portion extending from the drain region across an edge of the gate electrode on a side of the drain electrode.

9. The TFT substrate according to claim 1, wherein
an edge of the drain electrode crosses the semiconductor layer between the second opening portion and an edge of the gate electrode on a side of the drain electrode.

10. The TFT substrate according to claim 1, wherein
when, in each of the plurality of pixels, a region where the gate electrode and the drain electrode overlap and which does not overlap the semiconductor layer is a first region, and a region which overlaps the first electrode unit and the second electrode unit, which does not overlap the third opening portion, and which is adjacent to the first portion in a direction from the first opening portion to the second opening portion is a second region, and when the second conductive layer shifts with respect to the first conductive layer in a channel length direction of the TFT, a change in an area of the first region per unit length of a shift amount is substantially equal to a change in an area of the second region per unit length of a shift amount.

11. The TFT substrate according to claim 1, wherein
the second opening portion and the third opening portion are formed continuously.

12. The TFT substrate according to claim 1, wherein
the third opening portion includes a plurality of separately formed opening portions.

13. The TFT substrate according to claim 1, wherein
the semiconductor layer includes an oxide semiconductor.

14. The TFT substrate according to claim 1, wherein
the semiconductor layer includes an In—Ga—Zn—O-based semiconductor.

15. The TFT substrate according to claim 14, wherein
the In—Ga—Zn—O-based semiconductor includes a crystalline portion.

16. The TFT substrate according to claim 1, wherein
the semiconductor layer has a laminated structure.

17. A Thin Film Transistor (TFT) substrate comprising:
a plurality of pixels arranged in a matrix having a plurality of rows and a plurality of columns;

a substrate; and a plurality of TFTs supported on the substrate and each connected to one of the plurality of pixels, wherein the TFT substrate includes a first conductive layer including gate electrodes of the plurality of TFTs, a gate insulating layer formed on the first conductive layer, a semiconductor layer formed on the gate insulating layer and including a channel region, a source region, and a drain region, a protective insulating layer including a portion which covers the channel region and having a first opening portion reaching the source region and a second opening portion reaching the drain region, and a second conductive layer formed on the protective insulating layer and including a source electrode which is formed on the protective insulating layer and in the first opening portion and which is in contact with the source region in the first opening portion, and a drain electrode which is formed on the protective insulating layer and in the second opening portion and which is in contact with the drain region in the second opening portion, each of the plurality of pixels has a compensation capacitance unit including a part of the first conductive layer and a part of the second conductive layer, and the compensation capacitance unit is formed to compensate for at least a part of change in capacitance formed between a respective gate electrode of one of the plurality of TFTs and the drain electrode when the protective insulating layer shifts in a channel length direction with respect to the first conductive layer.

* * * * *